US007854859B2

(12) United States Patent
Kameshima et al.

(10) Patent No.: US 7,854,859 B2
(45) Date of Patent: Dec. 21, 2010

(54) NITRIDE PHOSPHOR, METHOD FOR PRODUCING THIS NITRIDE PHOSPHOR, AND LIGHT EMITTING DEVICE THAT USES THIS NITRIDE PHOSPHOR

(75) Inventors: Masatoshi Kameshima, Anan (JP); Shoji Hosokawa, Tokushima (JP); Suguru Takashima, Anan (JP); Hiroto Tamaki, Anan (JP); Takayuki Shinohara, Anan (JP); Takahiro Naitou, Komatsushima (JP); Tomohisa Kishimoto, Anan (JP)

(73) Assignee: Nichia Corporation, Anan-shi (JP)

( * ) Notice: Subject to any disclaimer, the term of this patent is extended or adjusted under 35 U.S.C. 154(b) by 687 days.

(21) Appl. No.: 11/813,088

(22) PCT Filed: Dec. 28, 2005

(86) PCT No.: PCT/JP2005/024134

§ 371 (c)(1),
(2), (4) Date: Jun. 28, 2007

(87) PCT Pub. No.: WO2006/077740

PCT Pub. Date: Jul. 27, 2006

(65) Prior Publication Data

US 2008/0149957 A1 Jun. 26, 2008

(30) Foreign Application Priority Data

Dec. 28, 2004 (JP) ............... 2004-382016
Dec. 28, 2004 (JP) ............... 2004-382172
Dec. 28, 2004 (JP) ............... 2004-382173
Feb. 16, 2005 (JP) ............... 2005-038534
Mar. 14, 2005 (JP) ............... 2005-072088

(51) Int. Cl.
*H01L 33/00* (2010.01)
(52) U.S. Cl. ............... 252/301.4 F; 313/503; 257/98

(58) Field of Classification Search ........... 252/301.4 F; 313/503; 257/98
See application file for complete search history.

(56) References Cited

U.S. PATENT DOCUMENTS 7,252,788 B2 * 8/2007 Nagatomi et al. ..... 252/301.4 F
(Continued)

FOREIGN PATENT DOCUMENTS

EP 155047 9/1985
(Continued)

OTHER PUBLICATIONS

International Preliminary Report on Patentability, PCT/JP2005/024134, mailed Jul. 3, 2007.
(Continued)

*Primary Examiner*—C. Melissa Koslow
(74) *Attorney, Agent, or Firm*—Ditthavong Mori & Steiner, P.C.

(57) ABSTRACT

A red phosphor with excellent luminescent characteristics, and a light emitting device that uses this phosphor are provided. The phosphor is a nitride phosphor that is activated by europium, and absorbs light from the near ultraviolet range to the blue range to emit red light. The nitride phosphor has the following general formula, $$M_w Al_x Si_y B_z N_{((2/3)w+x+(4/3)y+z)}:Eu^{2+}$$

where M is at least one element selected from the group consisting of Mg, Ca, Sr and Ba. In the general formula, w, x, y and z fall within the following ranges.

$0.056 \leq w \leq 9$, $x=1$, $0.056 \leq y \leq 18$, and $0.0005 \leq z \leq 0.5$ In addition, the mean particle diameter of the nitride phosphor is preferably not less than 1 μm and not more than 15 μm. Additionally, the light emitting device includes a light source with a first light emission spectrum that emits light from the near ultraviolet range to the blue range, and one or more kinds of phosphors that absorb at least part of the first light emission spectrum and thus emit light with a second light emission spectrum. The aforementioned phosphor can be used as the phosphors.

15 Claims, 30 Drawing Sheets

U.S. PATENT DOCUMENTS 7,273,568 B2 * 9/2007 Nagatomi et al. ..... 252/301.4 F
7,476,338 B2 * 1/2009 Sakane et al. ......... 252/301.4 F

FOREIGN PATENT DOCUMENTS

| EP | 1278250 | 1/2003 |
|---|---|---|
| EP | 1296376 | 3/2003 |
| EP | 1433831 | 6/2004 |
| JP | 60-206889 | 10/1985 |
| JP | 2003-124527 | 4/2003 |
| JP | 2003-147351 | 5/2003 |
| JP | 2003-206481 | 7/2003 |
| JP | 2003-321675 | 11/2003 |
| JP | 2004-182780 | 7/2004 |
| JP | 2004-182781 | 7/2004 |
| JP | 2006-8862 | 1/2006 |
| JP | 2006-008889 | 1/2006 |
| JP | 2006-63214 | 3/2006 |
| WO | WO 01-40403 | 6/2001 |
| WO | PCT/JP2005/024134 | 5/2006 |

PUBLICATIONS

K.Uheda et al., "The crystal structure and Photoluminescence Properties of a New Red Phosphor, Calcium Aluminum Silicon Nitride doped with Divalent Europium", 206th Meeting, The Electrochemical Society (Abstract 2073), XP-002592218.

Extended European Search Report for corresponding EP Application No. 05844881.2 - 2111, Aug. 25, 2010.

* cited by examiner (a)

|  | MOLE RATIO | | | | | | 460 nm EXCITATION | | | |
| --- | --- | --- | --- | --- | --- | --- | --- | --- | --- | --- |
|  | Ca | Al | Si | BN | N | Eu | CHROMA-TICITY x | CHROMA-TICITY y | LIGHT INTENSITY Y(%) | PEAK WAVE-LENGTH λp (nm) |
| Ex.12 | 0.99 | 1 | 1.00 | 0.0100 | 3 | 0.010 | 0.655 | 0.337 | 100 | 653 |
| Ex.13 | 0.20 | 1 | 0.60 | 0.0010 | 2.1 | 0.002 | 0.557 | 0.434 | 84.9 | 625 |
| Ex.14 | 0.20 | 1 | 1.10 | 0.0010 | 2.6 | 0.002 | 0.521 | 0.470 | 139.9 | 593 |
| Ex.15 | 0.47 | 1 | 2.16 | 0.0026 | 4.211 | 0.005 | 0.528 | 0.464 | 189.5 | 593 |
| Ex.16 | 0.25 | 1 | 2.88 | 0.0013 | 5 | 0.003 | 0.509 | 0.480 | 101.7 | 590 |
| Ex.17 | 0.99 | 1 | 1.33 | 0.0011 | 3.444 | 0.010 | 0.610 | 0.382 | 129.7 | 648 |
| Ex.18 | 0.74 | 1 | 0.75 | 0.0025 | 2.5 | 0.008 | 0.647 | 0.346 | 103.9 | 649 |
| Ex.19 | 0.66 | 1 | 1.67 | 0.0033 | 3.667 | 0.007 | 0.573 | 0.419 | 129.3 | 626 |
| Ex.20 | 1.32 | 1 | 1.00 | 0.0033 | 3.667 | 0.013 | 0.659 | 0.334 | 101.7 | 654 |
| Ex.21 | 0.40 | 1 | 0.40 | 0.0020 | 1.8 | 0.004 | 0.639 | 0.353 | 90.0 | 647 |
| Ex.22 | 0.54 | 1 | 0.27 | 0.0009 | 1.727 | 0.005 | 0.648 | 0.344 | 69.0 | 646 |
| Ex.23 | 0.23 | 1 | 2.88 | 0.0013 | 5 | 0.023 | 0.556 | 0.438 | 190.8 | 601 |
| Ex.24 | 0.43 | 1 | 2.16 | 0.0026 | 4.163 | 0.047 | 0.567 | 0.427 | 230.1 | 608 |
| Ex.25 | 0.43 | 1 | 2.16 | 0.0026 | 4.163 | 0.047 | 0.564 | 0.4291 | 210.9 | 608 |
| Ex.26 | 0.36 | 1 | 2.60 | 0.0020 | 4.8 | 0.040 | 0.5708 | 0.4217 | 177.0 | 608 |
| Ex.27 | 0.45 | 1 | 3.50 | 0.0050 | 6 | 0.050 | 0.5859 | 0.406 | 210.0 | 606 |
| Ex.28 | 0.30 | 1 | 5.33 | 0.0033 | 8.333 | 0.033 | 0.621 | 0.37 | 162.6 | 596 |
| Ex.29 | 0.60 | 1 | 5.00 | 0.0033 | 8.1 | 0.067 | 0.647 | 0.3433 | 136.5 | 601 |

NITRIDE PHOSPHOR, METHOD FOR PRODUCING THIS NITRIDE PHOSPHOR, AND LIGHT EMITTING DEVICE THAT USES THIS NITRIDE PHOSPHOR

TECHNICAL FIELD

The present invention relates to a nitride phosphor that is used for a light emitting diode, lighting such as a fluorescence lamp, display, an LCD backlight and so on, a method for producing the nitride phosphor and a light emitting device that uses the nitride phosphor, and particularly to a nitride phosphor that is excited by ultraviolet range to blue range light to emit red light, a method for producing the nitride phosphor and a light emitting device that uses the nitride phosphor.

BACKGROUND ART

Light emitting diodes are small and highly effective in power consumption, and emit vivid color light. Dissimilarly in light bulbs that heat a filament for light emission, there is no concern about bulb burnout and so on in light emitting diodes. In addition, light emitting diodes have features that have very high responsibility, and high resistance against vibration and against repetition of ON/OFF switching. Since light emitting diodes have these advantages, and thus are used as various kinds of light sources.

Light emitting diodes emit light in a particular wavelength range. For this reason, a light source has been developed which converts a part of light that is emitted by a light emitting diode into a different wavelength by a phosphor, and mixes the light that is converted into the different wavelength by the phosphor and the light that is emitted by light emitting diode to emit mixed light. This type of light source can provide light of various colors different from the light emitting diode depending on selection of the colors of phosphor light emission. In particular, a light source that emits white range light is widely used for general lighting, a display, an LCD backlight, and so on. Accordingly, there are needs for a phosphor that can be used for a white group light emitting device in combination with a light emitting diode. In the case of a light source that includes a light emitting diode, white light is provided by mixing colors of light of a blue light emitting diode and a phosphor based on the additive process. In this type of light source, blue light that is emitted by a light emitting chip of a light emitting diode excites a phosphor. The phosphor absorbs the blue light from the light emitting chip, and thus emits yellow light. The yellow light of the phosphor and the blue light of the light emitting chip have a complementary color relation ship. Human eyes recognize the mixture of the yellow light and the blue light as white light. Light emitting diode type white light sources are produced which combine a blue light emitting chip and a phosphor based on this additive process.

An example of the phosphor used in this application is an oxisulfide phosphor composed of $Y_2O_2S:Eu$. In addition, a nitride phosphor composed of $Ca_2Si_5N_8:Eu$ has been developed (see Patent Document 1).

Patent Document 1: International Publication Pamphlet WO01/40403

Patent Document 2: Japanese Patent Laid-Open Publication No. 2003-147351

DISCLOSURE OF THE INVENTION

Problem to be Solved by the Invention

However oxisulfide phosphors composed of $Y_2O_2S:Eu$ do not have sufficient red light emission spectrum. In order that the phosphors can have a longer light emission wavelength and thus can emit deeper red light, the activator amount of europium is likely increased. In this case, there are disadvantages that reduce luminance and thus increase material cost. In addition, there is a disadvantage that the phosphors do not have enough life to be used together with light emitting chips. Additionally, there is a disadvantage that the phosphors have poor light emission characteristics under high light density.

The present invention has been developed for solving these disadvantages. It is a first object of the present invention to provide a nitride phosphor that can reduce the activator amount of europium that is a rare earth element but can increase light emission peak wavelength to emits deeper red light, and additionally can be located in proximity to a light emitting chip but can have very long life, a method for producing the nitride phosphor, and a light emitting device using the nitride phosphor.

The inventors have been developed a nitride phosphor composed of $CaAlSiN_3:Eu$ for solving the disadvantages. As compared with $Y_2O_2S:Eu$, this nitride phosphor has features that can reduce the activator amount of europium that is a rare earth element but can increase light emission peak wavelength to emits deeper red light, and additionally can be located in proximity to a light emitting chip but can have very long life.

However, nitride phosphors have a disadvantage that burning cost is very high. Since Si nitride and Al nitride that are used as phosphor materials have less reactivity, high temperature burning is required to obtain a high efficient phosphor. For this reason, in order that Si nitride and Al nitride do not decompose in high temperature burning, the Si nitride and Al nitride are burned in a high-pressured state. Accordingly, the durability of a furnace material and a burning furnace becomes low.

The present invention has been developed to additionally solve the disadvantage. It is another object of the present invention is to provide a nitride phosphor production method that can mass-produce, at low cost, a nitride phosphor that is excited by light from the near ultraviolet range to the blue range and thus emits deep red light, and additionally has excellent thermal characteristics.

In conventional light emitting devices, it is difficult to provide a light emitting device that can emit multi-color light in practical use.

In addition, as disclosed in Patent Document 2, in a light emitting device that includes an ultraviolet range light emitting chip as an excitation light source, since the light emitting chip excites a phosphor that emits blue range light, thus, the excited light excites a YAG group phosphor, in other words, because of two-step excitation, light emission efficiency loss arises. Accordingly, it is difficult to obtain white light at high efficiency. For this reason, such conventional light emitting devices have low light emission luminance, and thus are insufficient in practical use as a light emitting device.

In addition, in white range light emitting devices that include a light emitting chip that emits blue range light in combination with a YAG group phosphor, there is a disadvantage that the device only emits low color rendering illumination light. In particular, a red component is insufficient. The special color rendering index R9 that shows a reddish component is low. Accordingly, it is difficult to provide a light emitting device that can emit multi-color light in practical use. Additionally, a light emitting device as disclosed in Patent Document 1 that includes an ultraviolet range light emitting chip as an excitation light source also only emits low color rendering illumination light. Furthermore, light emission luminance in proximity to 500 nm is also insufficient. This causes low color rendering.

The present invention has been developed to additionally solve the disadvantage. It is another object of the present invention is to provide a light emitting device that has high light emission luminance, and desired color tone that extends in a wide color range. Moreover, it is still another object to provide a high color rendering light emitting device.

Means for Solving Problems

To solve the aforementioned disadvantages, a nitride phosphor according to a first aspect of the present invention is activated by europium. The nitride phosphor absorbs light from the near ultraviolet range to the blue range to emit red light. The nitride phosphor has the following general formula.

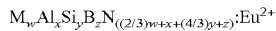

where M is at least one element selected from the group consisting of Mg, Ca, Sr and Ba. In the formula, w, x, y and z fall within the following ranges.

$0.056 \leq w \leq 9$, $x=1$, $0.056 \leq y \leq 18$, and $0.0005 \leq z \leq 0.5$ Furthermore, a nitride phosphor according to a second aspect of the present invention is activated by europium, and absorbs light from the near ultraviolet range to the blue range to emit red light. The nitride phosphor has the following general formula.

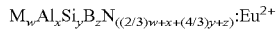

where M is at least one element selected from the group consisting of Mg, Ca, Sr and Ba. In the formula, w, x, y and z fall within the following ranges.

$0.04 \leq w \leq 3$, $x=1$, $0.143 \leq y \leq 8.7$, and $0.0005 \leq z \leq 0.5$ Furthermore, a nitride phosphor according to a third aspect of the present invention is activated by europium, and absorbs light from the near ultraviolet range to the blue range to emit red light. The nitride phosphor has the following general formula.

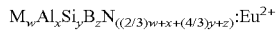

where M is at least one element selected from the group consisting of Mg, Ca, Sr and Ba. In the formula, w, x, y and z fall within the following ranges.

$0.05 \leq w \leq 3$, $x=1$, $0.167 \leq y \leq 8.7$, and $0.0005 \leq z \leq 0.5$ Furthermore, a nitride phosphor according to a fourth aspect of the present invention is activated by europium, and absorbs light from the near ultraviolet range to the blue range to emit red light. The nitride phosphor has the following general formula.

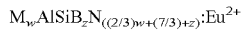

where M is at least one element selected from the group consisting of Mg, Ca, Sr and Ba. In the formula, w and z fall within the following ranges.

$0.056 \leq w \leq 9$, and $0.0005 \leq z \leq 0.5$

In addition, the nitride phosphor can include O in its composition.

In addition, the mean particle diameter of the nitride phosphor is preferably not less than 2 μm and not more than 15 μm.

In the nitride phosphor, the mole concentration ratios of Fe, Ni, Cr, Ti, Nb, Sm and Yb are preferably not more than 0.01 relative to the mole concentration of M.

A light emitting device according to another aspect of the present invention includes a light source with a first light emission spectrum that emits light from the near ultraviolet range to the blue range, and one or more kinds of phosphors that absorb at least part of the first light emission spectrum and thus emit light with a second light emission spectrum. In this construction, the one or more kinds of phosphors can include the aforementioned nitride phosphor.

In addition, z that indicates the boron mole concentration of the nitride phosphor can be not more than 0.5 mole, and preferably can be not more than 0.3 mole. In addition, z that indicates the boron mole concentration can be not less than 0.001. Additionally, z that indicates the boron mole concentration preferably can be not less than 0.001 and not more than 0.2.

In addition, the nitride phosphor can include O in its composition. In addition, the mean particle diameter of the phosphor preferably can be not less than 2 μm and not more than 15 μm.

On the other hand, a light emitting device according to another aspect of the present invention includes a light source with a first light emission spectrum that emits light from the near ultraviolet range to the blue range, and one or more kinds of phosphors that absorb at least part of the first light emission spectrum and thus emit light with a second light emission spectrum. In this light emitting device, the one or more kinds of phosphors can include the aforementioned nitride phosphor.

Furthermore, a nitride phosphor according to a fifth aspect of the present invention is activated by europium. The nitride phosphor absorbs light from the near ultraviolet range to the blue range to emit red light.

This nitride phosphor has the general formula

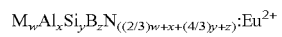

In this general formula, w, x, y and z fall within the following ranges.

M is at least one element selected from the group consisting of Mg, Ca, Sr and Ba. $0.5 \leq w \leq 3$, $x=1$, $0.5 \leq y \leq 3$, and $0.001 \leq z \leq 0.5$ In addition, z that indicates the boron mole concentration of the nitride phosphor can be not more than 0.5 mole, and preferably can be not more than 0.3 mole. In addition, z that indicates the boron mole concentration preferably can be not less than 0.001 mole. Additionally, z that indicates the boron mole concentration preferably can be not less than 0.001 and not more than 0.2.

Furthermore, a nitride phosphor according to a sixth aspect of the present invention can include O in its composition.

In addition, the mean particle diameter of the nitride phosphor preferably can be not less than 2 μm and not more than 15 μm.

Furthermore, a light emitting device according to another aspect of the present invention includes a light source with a first light emission spectrum that emits light from the near ultraviolet range to the blue range, and one or more kinds of phosphors that absorb at least part of the first light emission spectrum and thus emit light with a second light emission spectrum. In this light emitting device, the one or more kinds of phosphors include the aforementioned nitride phosphor.

A nitride phosphor according to another aspect of the present invention is activated by europium. The nitride phosphor absorbs light from the near ultraviolet range to the blue range to emit red light.

This nitride phosphor has the general formula $$M_wAl_xSi_yB_zN_{(2/3)w+x+(4/3)y+z}:Eu^{2+}.$$

where M is at least one element selected from the group consisting of Mg, Ca, Sr and Ba. In this general formula, w, x, y and z fall within the following ranges.

$0.5 \leq w \leq 3$, $x=1$, $0.5 \leq y \leq 3$, and $0.001 \leq z \leq 0.5$

Furthermore, a phosphor according to another aspect of the present invention is represented by the general formula $$M_wAlSiB_zN_{(3+z)}:Eu^{2+}.$$

Where M is at least one element selected from the group consisting of Mg, Ca, Sr and Ba. In this general formula, w and z fall within the following ranges.

$0.5 \leq w \leq 3$, and $0.001 \leq z \leq 0.5$

In a nitride phosphor according to another aspect of the present invention, z that indicates the boron mole concentration of the nitride phosphor can be not more than 0.5 mole, and preferably can be not more than 0.3 mole. In addition, z that indicates the boron mole concentration can be not less than 0.001 mole. Additionally, z that indicates the boron mole concentration preferably can be not less than 0.001 and not more than 0.2.

A nitride phosphor according to another aspect of the present invention can include O in its composition. In addition, the mean particle diameter of the phosphor preferably can be not less than 2 μm and not more than 15 μm.

A light emitting device according to another aspect of the present invention includes a light source with a first light emission spectrum that emits light from the near ultraviolet range to the blue range, and one or more kinds of phosphors that absorb at least part of the first light emission spectrum and thus emit light with a second light emission spectrum. In this light emitting device, the one or more phosphors includes the aforementioned nitride phosphor.

Furthermore, a phosphor according to another aspect of the present invention absorbs light from the ultraviolet range to the blue range to emit red light, and is represented by the general formula $MAlSiN_3:Eu^{2+}$ (M is at least one element selected from the group consisting of Mg, Ca, Sr and Ba). In the nitride phosphor, at least one of M, Al and Si is partially substituted by B. The nitride phosphor is activated by europium, and absorbs light from the near ultraviolet range to the blue range to emit red light.

M is partially substituted by B. The nitride phosphor can be represented by the composition formula $(M_{1-x-y}Eu_xB_y)AlSiN_{(y/3+3)}$ (M is at least one element selected from the group consisting of Mg, Ca, Sr and Ba).

The mole concentration y of B preferably falls within the range $0.001 \leq y \leq 0.5$.

Al is partially substituted by B. The nitride phosphor is represented by the composition formula $(M_{1-x}Eu_x)Al(Si_{1-y}B_y)SiN_3$ (M is at least one element selected from the group consisting of Mg, Ca, Sr and Ba).

The mole concentration y of B preferably falls within the range $0.001 \leq y \leq 0.5$.

Si is partially substituted by B. The nitride phosphor is represented by the composition formula $(M_{1-x}Eu_x)Al(Si_{1-y}B_y)N_{(-y/3+3)}$ (M is at least one element selected from the group consisting of Mg, Ca, Sr and Ba).

The mole concentration y of B preferably falls within the range $0.001 \leq y \leq 0.5$.

The nitride phosphor can include O in its composition.

In addition, the mean particle diameter of the nitride phosphor can be not less than 2 μm and not more than 15 μm.

A light emitting device according to another aspect of the present invention includes a light source with a first light emission spectrum that emits light from the near ultraviolet range to the blue range, and one or more kinds of phosphors that absorb at least part of the first light emission spectrum and thus emit light with a second light emission spectrum. This light emitting device includes the aforementioned nitride phosphor. This light emitting device utilizes the excitation light source and the nitride phosphor in combination, and thus has high light emission luminance and an excellent color rendering.

Furthermore, a nitride phosphor production method according to another aspect of the present invention produces a nitride phosphor that is represented by the general formula $MAlSiN_3:Eu^{2+}$, or the general formula $M_wAl_xSi_yB_zN_{(2/3)w+x+(4/3)y+z}:Eu^{2+}$. In the method according to the present invention, the phosphor material is burned at atmospheric pressure in a reducing atmosphere containing ammonia.

In a nitride phosphor production method according to another aspect of the present invention, the phosphor material can be burned in a reducing atmosphere containing at least one of nitrogen, hydrogen, argon, carbon dioxide and carbon monoxide, in addition to ammonia. In addition, in the production method according to the present invention, the phosphor material can include Si and Al nitride, and can be burned at temperature lower than the decomposition temperature of Si and Al nitride. In addition, in the production method according to the present invention, the phosphor material can include Si and Al nitride, and can be burned at temperature 1400° to 1800° C. In addition, in the production method according to the present invention, the phosphor material can be burned in a multi-step manner. In addition, in the production method according to the present invention, the phosphor material is placed and burned preferably in a crucible of boron nitride (BN). In the production method according to the present invention, the mean particle diameter of the phosphor can be not less than 2 μm and not more than 15 μm.

Furthermore, a light emitting device according to another aspect of the present invention excites at least two kinds of phosphor substances that are excited practically directly by light from a light source with a main light emission peak in a range from 250 to 420 nm to provide various types of light emission colors by mixing light of the at least two kinds of phosphor substances. In the light emitting device, at least one kind of the phosphor substances is represented by the general formula $M_wAl_xSi_yB_zN_{(2/3)w+x+(4/3)y+z}:R$ (M is at least one element selected from the group consisting of Mg, Ca, Sr and Ba, $0.04 \leq w \leq 9$, $x=1$, $0.5 \leq y < 1$ or $1 < y \leq 8$ and $0 \leq z \leq 0.5$, and R is a rare earth element).

Moreover, a light emitting device excites at least two kinds of phosphor substances that are excited practically directly by light from a light source with a main light emission peak in a range from 420 to 500 nm to provide various types of light emission colors by mixing light of the at least two kinds of phosphor substances. In the light emitting device, at least one kind of the phosphor substances is represented by the general formula $M_wAl_xSi_yB_zN_{(2/3)w+x+(4/3)y+z}:R$ (M is at least one element selected from the group consisting of Mg, Ca, Sr and Ba, $0.04 \leq w \leq 9$, $x=1$, $0.5 \leq y<1$ or $1<y \leq 8$ and $0 \leq z \leq 0.5$, and R is a rare earth element).

EFFECT OF THE INVENTION

Since the nitride phosphor according to the present invention includes Al and B, its peak wavelength can be longer. Therefore, the activator amount of europium, which is an expensive rare earth chip, can be reduced, but the nitride phosphor can emit deeper red light. In addition, Al and B are introduced into the composition of a $CaSiN_3$:Eu nitride phosphor, thus, the deterioration of the nitride phosphor at high temperature can be remarkably reduced. For this reason, in the nitride phosphor and the light emitting device that uses the nitride phosphor, even in the case where the nitride phosphor is located in proximity to a light emitting chip, they have a feature that extends their lives. In addition, as compared with $Y_2O_2S$:Eu, the nitride phosphor and the light emitting device have sufficient light emission characteristics in practical use. Additionally, the excitation light source and the nitride phosphor are used in combination, therefore, it is possible to a light emitting device that has high light emission luminance and an excellent color rendering.

Furthermore, since the nitride phosphor includes Al and B, its peak wavelength can be longer. Therefore, the activator amount of europium, which is an expensive rare earth element, can be reduced, but the nitride phosphor can emit deeper red light. In addition, Al and B are introduced into the composition of a CaSiN:Eu nitride phosphor, thus, the nitride phosphor has a feature that its deterioration at high temperature can be remarkably reduced. For this reason, even in the case where the nitride phosphor is located in proximity to a light emitting chip, the nitride phosphor has a feature that extends its life. In addition, as compared with $Y_2O_2S$:Eu, the nitride phosphor has sufficient light emission characteristics in practical use. Additionally, in the case where the excitation light source and the nitride phosphor are used in combination, it is possible to a light emitting device that has high light emission luminance and an excellent color rendering.

Furthermore, partial substitution of B for M, Al or Si can extend the peak wavelength of the nitride phosphor. Therefore, the activator amount of europium, which is an expensive rare earth element, can be reduced, but the nitride phosphor has a feature that can emit deeper red light. In addition, the nitride phosphor in which M, Al or Si is partially substituted by B has a feature a feature that its deterioration at high temperature can be remarkably reduced. For this reason, even in the case where the nitride phosphor is located in proximity to a light emitting chip, the nitride phosphor has a feature that extends its life. In addition, as compared with $Y_2O_2S$:Eu, the nitride phosphor has sufficient light emission characteristics in practical use. Additionally, in the case where the excitation light source and the nitride phosphor are used in combination, it is possible to a light emitting device that has high light emission luminance.

According to the nitride phosphor production method, it is possible to mass-produce, at low cost by using a conventional burning furnace, a nitride phosphor that is excited by light from the near ultraviolet range to the blue range and thus emits deep red light, and additionally has excellent thermal characteristics. The reason is that, although Si nitride and Al nitride have less decomposition reactivity, they are burned in a reducing atmosphere containing ammonia to improve the reactivity, thus, they can be burned at atmospheric pressure without being pressurized. In addition, as compared with $Y_2O_2S$:Eu, the nitride phosphor that is produced by the method has sufficient light emission characteristics in practical use. Additionally, in the case where the excitation light source and the nitride phosphor that is produced by the aforementioned method are used in combination, it is possible to a light emitting device that has high light emission luminance and an excellent color rendering.

Furthermore, the present invention relates to a light emitting device excites at least two kinds of phosphor substances that are excited practically directly by light from an excitation light source with a main light emission peak in a range from 250 to 420 nm to provide various types of light emission colors by mixing light of the at least two kinds of phosphor substances. In the light emitting device, at least one kind of the phosphor substances is represented by the general formula $M_wAl_xSi_yB_zN_{(2/3)w+x+(4/3)y+z}$:R (M is at least one element selected from the group consisting of Mg, Ca, Sr and Ba, $0.04 \leq w \leq 9$, $x=1$, $0.5 \leq y<1$ or $1<y \leq 8$ and $0 \leq z \leq 0.5$, and R is a rare earth element). This construction can provide a light emitting device that includes a phosphor substance with high light emission efficiency. In addition, combination of two or more kinds of phosphor substances can provide a light emitting device with a wide color tone range. Additionally, since an excitation light source that is hardly visible is used, human eyes do not feel color deviation of the excitation light source. Therefore, it is possible to provide a light emitting device without color deviation. Since this nitride phosphor is used, it is possible to provide a light emitting device that has a wider color tone range and high light emission luminance. Particularly, in the case where an ultraviolet range excitation light source is used to excite the nitride phosphor, the nitride phosphor has a light emission peak wavelength in the red range, and high luminance. Therefore, it is possible to provide a light emitting device with high light emission luminance. Additionally, it is possible to provide a light emitting device with a high color rendering. In particular, since this nitride phosphor is excited by absorption of light from the ultraviolet range to the visible short wavelength range, and thus emits red range light, the nitride phosphor adds a red component. Therefore, it is possible to provide a light emitting device that contains a high red component and has a high color rendering.

The present invention relates to a light emitting device excites at least two kinds of phosphor substances that are excited practically directly by light from an excitation light source with a main light emission peak in a range from 420 to 500 nm to provide various types of light emission colors by mixing light of the at least two kinds of phosphor substances. In the light emitting device, at least one kind of the phosphor substances is represented by the general formula $M_wAl_xSi_yB_zN_{(2/3)w+x+(4/3)y+z}$:R (M is at least one element selected from the group consisting of Mg, Ca, Sr and Ba, $0.04 \leq w \leq 9$, $x=1$, $0.5 \leq y<1$ or $1<y \leq 8$ and $0 \leq z \leq 0.5$, and R is a rare earth element). This construction can provide a light emitting device that has a less deleterious effect on humans, and high light emission efficiency. In addition, combination of two or more kinds of phosphor substances can provide a light emitting device with a wide color tone range.

BEST MODE FOR CARRYING OUT THE INVENTION

The following description will describe embodiments according to the present invention with reference to the drawings. It should be appreciated, however, that the embodiments described below are illustrations of a nitride phosphor, a method for producing the nitride phosphor and a light emitting device that uses the nitride phosphor to give a concrete form to technical ideas of the invention, and a nitride phosphor, a method for producing the nitride phosphor and a light emitting device that uses the nitride phosphor of the invention are not specifically limited to description below. Furthermore, it should be appreciated that the members shown in claims attached hereto are not specifically limited to members in the embodiments. Unless otherwise specified, any dimensions, materials, shapes and relative arrangements of the parts described in the embodiments are given as an example and not as a limitation. Additionally, the sizes and the arrangement relationships of the members in each of drawings are occasionally shown larger exaggeratingly for ease of explanation. Members same as or similar to those of this invention are attached with the same designation and the same reference numerals and their description is omitted. In addition, a plurality of structural elements of the present invention may be constructed as a single part that serves the purpose of a plurality of elements, on the other hand, a single structural element may be constructed as a plurality of parts that serve the purpose of a single element.

A light emitting device according to an embodiment excites at least two kinds of phosphor substances that are excited practically directly by light from an excitation light source with a main light emission peak in a range from 250 to 420 nm to provide various types of light emission colors by mixing light of the at least two kinds of phosphor substances. In the light emitting device, at least one kind of the phosphor substances is represented by the general formula $M_w Al_x Si_y B_z N_{((2/3)w+x+(4/3)y+z)}$:R (M is at least one element selected from the group consisting of Mg, Ca, Sr and Ba, $0.5 \leq w \leq 3$, $x=1$, $0.5 \leq y \leq 3$ and $0.001 \leq z \leq 0.5$, and R is a rare earth element), or by the general formula $MAlSiN_3$:R (M is at least one element selected from the group consisting of Mg, Ca, Sr and Ba, and R is a rare earth element). This construction can provide a light emitting device that includes a phosphor substance with high light emission efficiency. In addition, combination of two or more kinds of phosphor substances can provide a light emitting device with a wide color tone range. Additionally, since an excitation light source that is hardly visible is used, human eyes do not feel color deviation of the excitation light source. Therefore, it is possible to provide a light emitting device without color deviation. Since this nitride phosphor is used, it is possible to provide a light emitting device that has a wider color tone range and high light emission luminance. Particularly, in the case where an ultraviolet range excitation light source is used to excite the nitride phosphor, the light emitting device has a light emission peak wavelength in the red range, and high luminance. Therefore, it is possible to provide a light emitting device with high light emission luminance. Additionally, it is possible to provide a light emitting device with a high color rendering. In particular, since this nitride phosphor is excited by absorption of light from the ultraviolet range to the visible short wavelength range, and thus emits red range light, the nitride phosphor adds a red component. Therefore, it is possible to provide a light emitting device that contains a high red component and has a high color rendering.

This embodiment relates to a light emitting device that excites at least two kinds of phosphor substances that are excited practically directly by light from an excitation light source with a main light emission peak in a range from 420 to 500 nm to provide various types of light emission colors by mixing light of the at least two kinds of phosphor substances. In the light emitting device, at least one kind of the phosphor substances is represented by the general formula $M_w Al_x Si_y B_z N_{((2/3)w+x+(4/3)y+z)}$:R (M is at least one element selected from the group consisting of Mg, Ca, Sr and Ba, $0.5 \leq w \leq 3$, $x=1$, $0.5 \leq y \leq 3$ and $0.001 \leq z \leq 0.5$, and R is a rare earth element). This construction can provide a light emitting device that has a less deleterious effect on humans, and high light emission efficiency. In addition, combination of two or more kinds of phosphor substances can provide a light emitting device with a wide color tone range.

A light emitting device according to an embodiment excites three or more kinds of phosphor substances that are excited practically directly by light from a light source with a main light emission peak in a range from 420 to 500 nm to provide various types of light emission colors by mixing light of the three or more kinds of phosphor substances. In the light emitting device, at least one kind of the phosphor substances is represented by the general formula $MAlSiN_3$—R (M is at least one element selected from the group consisting of Mg, Ca, Sr and Ba, and R is a rare earth element). In this case, it is possible to provide fine adjustment in available color tone range. In addition, combination of three or more kinds of phosphor substances can provide a light emitting device with a wide color tone range.

The aforementioned Si can be partially substituted by at least one element selected from the group consisting of C, Ge, Sn, Ti, Zr and Hf. In the case where Si is partially substituted, high light emission efficiency can be maintained. In addition, persistence can be adjusted.

The aforementioned Al or B can be partially substituted by at least one element selected from the group consisting of Ga, In, V, Cr and Co. In the case where Al or B is partially substituted, high light emission efficiency can be maintained. In addition, persistence can be adjusted.

In the aforementioned phosphor substance, the light emission efficiency by light from the aforementioned excitation light source is preferably not less than 60% of the maximum light emission efficiency in the whole wavelength range. In this case, it is possible to provide a light emitting device that includes a phosphor substance with high excitation efficiency.

The aforementioned phosphor substance preferably has the maximum light emission efficiency in a range from 250 to 550 nm in the case where light is used as an excitation source. In this case, it is possible to provide a light emitting device that has a less deleterious effect on humans, and high light emission efficiency. In the case where two or more kinds of phosphor substances that have the maximum light emission efficiency in the range of an excitation light source to be used, it is possible to provide a light emitting device that utilizes the characteristics of the phosphor substances in the most effective manner possible, and has a wide color tone range and high light emission luminance.

In addition, the aforementioned phosphor substance preferably includes an oxynitride phosphor that contains at least one II group element selected from the group consisting of Be, Mg, Ca, Sr, Ba and Zn, at least one IV group element selected from the group consisting of C, Si, Ge, Sn, Ti, Zr and Hf, and a rare earth element that is an activator R, and has crystallinity. Since this oxynitride phosphor is used, it is possible to provide a light emitting device that has a wide color tone range and high light emission luminance. Particularly, in the case where an ultraviolet range excitation light source is used to excite the phosphor substance, an oxynitride phosphor that has a light emission peak wavelength in a range from bluish green to yellow and high luminance, thus, it is possible to provide a light emitting device with high light emission luminance.

The aforementioned excitation light source is preferably a light emitting chip. In this case, it is possible to provide a light emitting device that is small and highly effective in power consumption, and emits vivid color light.

The aforementioned light emitting device uses a second phosphor that is excited by a part of light from the aforementioned two or more kinds of phosphor substances, and thus provides various types of light emission colors by mixing light of the aforementioned two kinds of phosphor substances and light of the aforementioned second phosphor. In this case, it is possible to provide a light emitting device that includes a first phosphor with high light emission efficiency and the second phosphor with high light emission efficiency. In addition, combination of two or more kinds of phosphor substances and the second phosphor can provide a light emitting device with a wider color tone range. For example, an ultraviolet excitation light source is used in combination of a phosphor that emits blue light, the aforementioned nitride phosphor (first phosphor) that emits red light, and an aluminate phosphor (second phosphor) that is excited by the blue light.

The aforementioned light emitting device is applicable to a light emitting device that emits white range light. The reason is that the aforementioned light emitting device can be used in various kinds of applications including a lighting device.

The aforementioned light emitting device preferably has a general color rendering index of 80 or more. In particular, its special color rendering index (R9) is preferably 30 or more. In this case, it is possible to provide a light emitting device that has a wide color tone range and additionally has an excellent color rendering.

In this embodiment, the excitation light source preferably has a main light emission peak in the ultraviolet range that is low luminosity. A luminosity relationship exists between the visual sensitivity of the human eye and the wavelength of light. Luminosity is the highest at light of 555 nm, and decreases toward the shorter or longer wavelength side. For example, ultraviolet range light of the excitation light source corresponds to a low luminosity range, thus, the light emission color of the used phosphor substances substantially determine light emission color of the light emitting device. Even in the case where color deviation of a light emitting chip arises due to application current variation or the like, the color deviation of the phosphor substance that emits visible range light is remarkably suppressed. As a result, it is possible to provide a light emitting device with small color tone variation. Generally, the ultraviolet range refers to a range shorter than 380 nm or 400 nm. However, in terms of luminosity, light not more than 420 nm is almost invisible. Accordingly, the reason of the preference of this excitation light source is that light not more than 420 nm does not have a large effect on color tone. In addition, the reason of the preference of this excitation light source is that shorter wavelength light has energy higher than longer wavelength light.

In addition, in an embodiment, an excitation light source can be used which has a main light emission peak in a visible shorter wavelength side range can be used. In a light emitting device that coats an excitation light source with a coating member containing a phosphor substance, light that is emitted from the excitation light source passes without being absorbed, thus, the passing light outgoes from the coating member. In the case where light in a visible shorter wavelength side range is used, it is possible to effectively utilize this outgoing light. Accordingly, the loss of light that outgoes from the light emitting device can be reduced, therefore, it is possible to provide a highly effective light emitting device. For this reason, an excitation light source that has a main light emission peak in a range from 420 to 500 nm can be also used. In this case, since a phosphor that emits blue light is not required, therefore, it is possible to provide a light emitting device with high light emission efficiency. In addition, since light with relatively short wavelength is not used, it is possible to provide a light emitting device with a less deleterious effect on humans.

In this specification, a range from the ultraviolet range to the visible shorter wavelength side range refers to a range 250 to 500 nm, but is not specifically limited. In particular, the range is preferably a range 290 to 470 nm. The range is more preferably a range 290 to 470 nm that is low luminosity.

FIGS. 1 and 2 show a light emitting device that uses a phosphor according to the present invention. The light emitting device in FIG. 1 includes a light emitting chip that has a first light emission spectrum, and a phosphor that absorbs at least a part of light with the first light emission spectrum for wavelength conversion and thus emits light with a second light emission spectrum.

In addition, the light emitting device can be a light emitting device that includes an excitation light source, and excites at least two kinds of phosphor substances that are excited practically directly by light from the excitation light source to provide various types of light emission colors by mixing light of the at least two kinds of phosphor substances. The above relationship between the color name and the chromaticity coordinates is based on JIS Z8110.

(Light Emitting Device 1)

The light emitting device 1 in FIG. 1 includes a semiconductor layer 2, lead frames 13, a phosphor 11, a coating member 12, and a molding member 15. The semiconductor layer 2 is laminated on the upper part of a sapphire substrate 1. The lead frames 13 are electrically connected by wire lines 14 that extend from positive and negative electrodes 3 that are formed on the this semiconductor layer 2. The phosphor 11 and the coating member 12 are located inside a cup of a lead frame 13a to cover the outer periphery of a light emitting chip 10 that is composed of the sapphire substrate 1 and the semiconductor layer 2. The molding member 15 covers the phosphor 11 and the peripheral surfaces of the lead frames 13.

The semiconductor layer 2 is formed on the sapphire substrate 1. The positive and negative electrodes 3 are formed on the same surface side of the semiconductor layer 2. The semiconductor layer 2 is provided with a light emitting layer (not shown). The peak wavelength that is provided by this light emitting layer has a light emission spectrum not more than about 500 nm from the ultraviolet range to the blue range.

This light emitting device 1 is produced as follows, for example. The light emitting chip 10 is set on a die bonder, and die-bonded (adhered) onto the lead frame 13a with the cup in a face-up manner. For reference sake, the face-up manner refers to a mounting manner that mounts a light emitting chip in the state where its semiconductor-layer side is located on the view side so that emitted light outgoes from the semiconductor-layer side. The mounting manner is not limited to this. The light emitting chip can be mounted in a face-down or flip-chip manner in which the substrate side of the light emitting chip is located on the view side so that emitted light outgoes from the substrate side. After die-bonding, the lead frames 13 are transferred to a wire bonder. The negative electrode 3 of the light emitting chip is wire-bonded to the lead frame 13a with the cup by a gold line. The positive electrode 3 is wire-bonded to another lead frame 13b. Note that although two wire lines are used to provide electrical connection of the positive and negative electrodes in the exemplary construction of FIG. 1, electrical connection is not limited to this. For example, only one wire line may be bonded to provide electrical contact of one electrode, and a contact surface between a light emitting chip and a board may provide electric contact of the other side.

Subsequently, the lead frames are transports to a molding apparatus. A dispenser of the molding apparatus fills the cup of the lead frame 13 with the phosphor 11 and the coating member 12. The phosphor 11 and the coating member 12 are previously and uniformly mixed at a desired ratio. The phosphor 11 can includes at least two kinds of phosphor substances that are excited directly by the light emitting chip 10.

After the phosphor 11 is filled, the lead frames 13 are dipped in a molding cavity that is previously filled with a molding member 15. After that, the cavity is detached, and resin is cured. Thus, the light emitting device is provided which has a bullet shape shown in FIG. 1.

For example, the phosphor includes a YAG group phosphor and a nitride phosphor. The phosphor absorbs a part of light in a range from the near ultraviolet range to the blue range that is emitted from the light emitting chip, and thus emits light in a range from the yellow range to the red range. This phosphor 11 is used in the thus-constructed light emitting device with the aforementioned construction to provide a light emitting device that emits warm, white light by mixing blue light that is emitted by the light emitting chip 10 and light in a range from the yellow range to the red range of the phosphor. This light emitting device can be a light emitting device that emits bulb color light in accordance with JIS Standard.

The bulb color refers to a color that corresponds to a white range color in a range that is centered about a point of 2700 to 2800 K on the blackbody locus in accordance with JIS Standard, and is yellowish to reddish color. Specifically, the bulb color refers to a light emission color that falls within the range of (light) yellowish red, (orange) pink, pink, (light pink), and (yellowish) white in the chromaticity coordinates.

(Light Emitting Device 2)

The following description will describe a surface mount type light emitting device 2 of a type different from the aforementioned light emitting device 1 with reference to FIG. 2. FIG. 2(a) is a schematic plan view showing the surface mount type light emitting device according to this embodiment. FIG. 2(b) is a schematic cross-sectional view showing the surface mount type light emitting device in FIG. 2(a). In this case, various types of light emitting chips can be used as a light emitting chip 101. For example, an ultraviolet or blue nitride semiconductor light emitting chip can be used. In this description, the light emitting chip 101 as an exemplary light emitting chip emits ultraviolet rays.

In the light emitting device 2, a package includes a Kovar base 105 and a Kovar lid 106. The Kovar base 105 has a recessed portion that accommodates the light emitting chip 101 in a middle part. Kovar lead terminals 102 are air-tightly inserted on both sides of the recessed portion in the base 105. A glass window 107 is arranged in a middle part of the Kovar lid 106. In addition, the surfaces of the base 105 and the lead terminals 102 are provided with a Ni/Ag layer. The light emitting chip 101 is mounted inside the recessed portion of the base 105. The electrodes that are disposed on the light emitting chip 101, and the lead terminal 102 are connected by wire lines 104.

The light emitting chip 101 can be a nitride semiconductor light emitting chip that has an InGaN semiconductor as a light emitting layer with a main light emission peak of about 370 nm. In the chip structure of the light emitting chip 101, an undoped n-type GaN layer of a nitride semiconductor, an Si-doped GaN layer as an n-type contact layer, an undoped n-type GaN layer of a nitride semiconductor, an n-type AlGaN layer of a nitride semiconductor, a multi-quantum-well structure light emitting layer, an Mg-doped AlGaN layer as a p-type cladding layer, and an Mg-doped GaN layer as a p-type contact layer are successively laminated on a sapphire substrate. An n-type electrode is formed on the n-type contact layer. The light emitting layer includes InGaN layers. In addition, a GaN layer as a buffer layer is formed at low temperature on the sapphire substrate. Additionally, the p-type semiconductor is annealed at 400° C. or more after grown. Furthermore, the surfaces of the p-type and n-type contact layers are exposed by etching on the same surface side of the nitride semiconductor on the sapphire substrate. The n-electrode is formed in a band shape on the exposed n-type contact layer. A transparent p-electrode composed of a metal thin film is formed on substantially the whole of the p-type contact layer. Moreover, a pad electrode is formed on the transparent p-electrode in parallel to the n-electrode by sputtering.

The light emitting device is produced with the thus-constructed package as follows.

The light emitting chip 101 is first die-bonded in the recessed portion of the thus-constructed base 105 with an Ag—Sn alloy. In this construction, all components of the light emitting device can be formed of inorganic materials. Therefore, even in the case where light that is emitted from the light emitting chip 101 is In the ultraviolet range or in a visible short wavelength range, it is possible to provide a light emitting device with high reliability.

Subsequently, the electrodes of the die-bonded light emitting chip 101 are electrically connected to the lead terminals 102 that are exposed in a recessed bottom of the base 105 by the Au wire lines 104.

Subsequently, the moisture in the recessed portion of the base 105 is sufficiently eliminated. After that, the base 105 is covered with the Kovar lid 106 that has the glass window 107 in the middle part. Sealing is then conducted by seam welding. In this case, a color conversion member (coating portion containing a phosphor substance 108) 109 is previously disposed on the back surface of the glass window 107. This color conversion member 109 is formed by heating slurry that contains the phosphor substance 108. The slurry is composed of 90 wt % of nitrocellulose and 10 wt % of γ-alumina. The slurry contains the phosphor substance 108 such as $Ca_{10}(PO_4)_6Cl_2$:Eu; $Sr_4Al_{14}O_{25}$:Eu; $Y_3(Al, Ga)_5O_{12}$:Ce; and $CaAlSiN_3$:Eu. The slurry is applied on the back surface of the transparent window 107. The slurry is then heated at about 220° C. for 30 minutes for curing. The thus-constructed light emitting device can emit white light at high luminance. In addition, it is possible to provide a light emitting device that is very easy to adjust its chromaticity by varying types of the phosphor substance 108, and has excellent mass-producibility and reliability.

The following description will describe a phosphor according to the present invention, and a light emitting device that uses this phosphor.

(Excitation Light Source)

Examples of the excitation light source are provided by a semiconductor light emitting chip, a laser diode, ultraviolet radiation that is generated in a positive column of arc discharge, ultraviolet radiation that is generated in a positive column of glow discharge, and so on. In particular, the excitation light source is preferably a semiconductor light emitting chip or laser diode that emits light in the near ultraviolet range, or a semiconductor light emitting chip or laser diode that emits blue or bluish green light.

Light in a range from the near ultraviolet range to the visible shorter wavelength range refers to a range from about 270 to 500 nm.

(Light Emitting Chip)

The light emitting chips 10 and 101 are preferably a semiconductor light emitting chip that has a light emission spectrum capable of efficiently exciting the phosphor substances 11 and 108 (that is, a semiconductor light emitting chip that has a light emitting layer that emits light with a light emission spectrum capable of efficiently exciting phosphor substances). Examples of the materials of this type of semiconductor light emitting chip are provided by various semiconductors, such as BN, SiC, ZnSe, GaN, InGaN, InAlGaN, AlGaN, BAlGaN, BInAlGaN, and ZnO. In addition, Si, Zn, and so on, can be included in these elements as impurity chips to serve as the center of light emission. Particularly, a nitride semiconductor (e.g., a nitride semiconductor containing Al and Ga, or a nitride semiconductor containing In and Ga, i.e., $In_xAl_yGa_{1-x-y}N$, wherein $0 \leq x$, $0 \leq y$, $x+y \leq 1$) can be given as a more suitable example of the material of a light emitting layer that can efficiently emit light with a short wavelength from the ultraviolet range to the visible short wavelength range capable of efficiently exciting the phosphor substances 11 and 108.

In addition, examples of the structure of the semiconductor layers are provided by MIS junction, PIN junction, homo structure with pn junction etc., hetero structure, and double-hetero structure as suitable examples. The light emission wavelength can be selected by the variation of materials and mixed crystal ratios in the semiconductor layer. Additionally, the semiconductor layer can have a single-quantum-well structure or a multi-quantum-well structure that is provided with thin layer(s) for quantum effect. In this case, it is possible to further improve output power.

In the case where a nitride semiconductor is used, a material such as sapphire, spinel, SiC, Si, ZnO, GaAs, and GaN is suitably used as a substrate for the semiconductor. In order to form a nitride semiconductor with excellent crystallinity for mass-producibility, it is preferable to use a sapphire substrate. A nitride semiconductor can be formed on the sapphire substrate by using HVPE, MOCVD, or the like. A buffer layer of GaN, AlN, GaAlN, or the like, that is formed at low temperature and becomes a non-single crystal is formed on the sapphire substrate, and then a nitride semiconductor with pn junction is formed on the buffer layer.

The following example can be given as a light emitting chip that uses this nitride semiconductor with pn junction, and efficiently emits ultraviolet range light.

$SiO_2$ is first formed on the sapphire substrate in stripe shapes that extend in substantially perpendicular to the orientation flat surface of the sapphire substrate. GaN is grown over the stripes by an ELOG (Epitaxial Lateral Over Grows GaN) method by using HVPE. Subsequently, a first contact layer, a first cladding layer, an active layer, a second cladding layer, and a second contact layer are successively laminated by MOCVD. The first contact layer is formed of n-type gallium nitride. The first cladding layer is formed by n-type aluminum-gallium nitride. The active layer has a plurality of indium-aluminum-gallium well layers and aluminum-gallium nitride barrier layers that are laminated on each other. The second cladding layer is formed of p-type aluminum-gallium nitride. The second contact layer is formed of p-type gallium nitride.

On the other hand, a light emitting chip can be formed without an ELOG growth as follows.

For example, a GaN buffer layer is laminataed on the sapphire substrate 1, then an Si-undoped n-type GaN layer, an n-type contact layer, an undoped GaN layer, a light emitting layer, a p-cladding layer, and a p-type contact layer are successively laminated on the GaN buffer layer. The n-type contact layer is formed of Si-doped n-type GaN. The light emitting layer has a multi-quantum-well structure (quantum well structure of GaN barrier layers and InGaN well layers). The p-cladding layer is formed of Mg-doped p-type GaN. The p-type contact layer is formed of Mg-doped p-type GaN. Subsequently, electrodes are formed as follows.

A p-ohmic electrode is formed on the substantially whole surface of the p-type contact layer. A p-pad electrode is formed on a part of the p-ohmic electrode.

A part of n-type contact layer is exposed by removing the undoped GaN layer from the p-type contact layer side by etching. An n-electrode is formed on the exposed part.

Although the light emitting layer with a multi-quantum-well structure is used in this embodiment, the present invention is not limited to this construction. For example, a single-quantum-well structure with InGaN may be used. In addition, GaN doped with n-type or p-type impurities such as Si, or Zn may be used.

Varying an In content can vary the main light emission peak of the light emitting layer of the light emitting chip 10 and 101 within a range from 420 to 490 nm. The light emission wavelength is not limited to the above range. A light emitting layer can be used which has a main light emission peak from 360 to 500 nm.

Thus, the double-heterostructure semiconductor light emitting chip is formed on the substrate. The active layer may be formed in a ridge stripe shape and be interposed between guiding layers to provide a semiconductor laser chip. In this case, the active and guiding layers are provided with resonator end surfaces.

Nitride semiconductors have n-type conductivity in the state where impurities are not doped. In order to provide a desired n-type nitride semiconductor that improve light emission efficiency or the like, it is preferable that Si, Ge, Se, Te, C, or the like, is suitably doped. In addition, in order to provide a p-type nitride semiconductor, it is preferable that Zn, Mg, Be, Ca, Sr, Ba, or the like is doped as p-type dopants. Even if nitride semiconductors are doped with p-type dopants, the nitride semiconductors hardly become a p-type semiconductor. For this reason, after doped with a p-type dopant, a nitride semiconductor is preferably subjected to heating with a furnace, plasma irradiation, or the like to have low resistance. In the case where the sapphire substrate is not removed, the nitride semiconductor is etched from the p-type side to reach the surface of the first contact layer. Thus, contact layers are exposed. After the electrodes are formed on the contact layers, respectively, a semiconductor wafer is cut into chips. Consequently, nitride semiconductor light emitting chips can be formed.

In order to form a light emitting device for mass-producibility, it is preferable to use a transparent sealing member. In particular, in the case where the phosphor substance 11 is mixed into the sealing member, transparent resin is preferable. In this case, in consideration of the light emission wavelength of the phosphor substance, the deterioration of the transparent resin, and so on, a light emitting chip can be used which has a light emission spectrum with a main light emission peak not less than 360 nm and not more than 420 nm, or not less than 420 nm and not more than 500 nm.

In the semiconductor light emitting chip, it is preferable to adjust that the sheet resistance of the n-type contact layer with impurity concentration of $10^{17}$ to $10^{20}$/cm$^3$ and the sheet resistance of the transparent p-electrode have relationship Rp≧Rn. The n-type contact layer is preferably formed to have a thickness of 3 to 10 μm, and more preferably 4 to 6 μm, for example. The sheet resistance in this case is estimated 10 to 15 Ω/square. Accordingly, in this case, the transparent p-electrode is preferably formed so that the sheet resistance Rp is not less than the above sheet resistance. In addition, the transparent p-electrode may be formed to have a thickness not more than 150 μm. In addition, ITO, and ZnO can be used as a material of the p-electrode other than metal. An electrode with a plurality of light-outgoing openings such as a mesh-shaped electrode may be used instead of the transparent p-electrode.

In the case where the transparent p-electrode is formed of a multi-layer film or an alloy that is composed of one element selected from the group consisting of gold and platinum group metal elements, and at least one element other than these elements, the sheet resistance of the transparent p-electrode is adjusted by the content of included gold or platinum metal element. This adjustment improves stability and reproducibility. Since gold and platinum metal elements have a high absorption coefficient in the wavelength range of the semiconductor light emitting chip, the transparency of the transparent p-electrode becomes higher as the content of gold or platinum metal element that is included in the transparent p-electrode decreases. In a conventional semiconductor light emitting chip, the sheet resistances have relationship Rp≦Rn. However, the semiconductor light emitting chip has relationship Rp≧Rn. Accordingly, the transparent p-electrode is likely formed in a thinner film as compared with a conventional transparent p-electrode. In this case, the content of gold or platinum metal element is reduced, thus, the transparent p-electrode can be easily thinner.

As discussed above, the semiconductor light emitting chip preferably has relationship between the n-type contact layer and transparent p-electrode sheet resistances Rn and Rp Ω/square of Rp≧Rn. After the semiconductor light emitting chip is formed, it is difficult to measure Rn. Accordingly, the relationship between Rp and Rn cannot be practically determined. However, the relationship between Rp and Rn can be estimated based on a light intensity distribution state in light emission.

In the case where the light emitting chip has relationship between the n-type contact layer and the transparent p-electrode of Rp≧Rn, the light emitting chip is provided with a p-side pad electrode that has an extension conductive portion in contact with the aforementioned transparent p-electrode. In this case, it is possible to further improve external quantum efficiency. The shape and orientation of the extensive conductive portion are not limited. The extensive conductive portion preferably extends along the peripheral line. The reason is that an area that cuts off light is reduced. However, the extensive conductive portion may have a mesh shape. In addition to a straight line, the extensive conductive portion may have a curve, a grid shape, a branched shape, and a hook shape. In this case, a light cut-off effect increases in proportion to the total area of the p-side pad electrode. For this reason, the line width and length of the extension conductive portion are designed so that the light cut-off effect dose not exceed a light increase effect.

Other than the aforementioned ultraviolet light emitting chip, a light emitting chip that emits blue range light can be used as the light emitting chips 10 and 101. The light emitting chips 10 and 101 that emit blue range light preferably are a group III nitride semiconductor light emitting chip. For example, the light emitting chips 10 and 101 have lamination structure. In the lamination structure, a GaN buffer layer is laminated on the sapphire substrate 1, then an Si-undoped n-type GaN layer, an n-type contact layer, an undoped GaN layer, a light emitting layer, a p-cladding layer, and a p-type contact layer are successively laminated on the GaN buffer layer. The n-type contact layer is formed of Si-doped n-type GaN. The light emitting layer has a multi-quantum-well structure (quantum well structure of GaN barrier layers and InGaN well layers). The p-cladding layer is formed of Mg-doped p-type GaN. The p-type contact layer is formed of Mg-doped p-type GaN. Electrodes are formed as follows. However, a light emitting chip different from this structure can be used.

A p-ohmic electrode is formed on the substantially whole surface of the p-type contact layer. A p-pad electrode is formed on a part of the p-ohmic electrode.

A part of n-type contact layer is exposed by removing the undoped GaN layer from the p-type contact layer side by etching. An n-electrode is formed on the exposed part.

Although the light emitting layer with a multi-quantum-well structure is used in this embodiment, the present invention is not limited to this construction. For example, a single-quantum-well structure with InGaN may be used. In addition, GaN doped with n-type or p-type impurities such as Si, or Zn may be used.

Varying an In content can vary the main light emission peak wavelength of the light emitting layer of the light emitting chip 10 and 101 within a range from 420 to 490 nm. The light emission peak wavelength is not limited to the above range. A light emitting layer can be used which a light emission peak wavelength from 360 to 550 nm.

as light emitting chips that are used in the following examples, semiconductor light emitting chips are used which have main light emission peaks of about 450 nm and about 450 nm. These two semiconductor light emitting chips have light emission spectrums shown in FIG. 3. FIG. 3 is a diagram showing the light emission spectrums of the light emitting chips. The light emission spectrums show the intensities at the main light emission peaks as a value of 100 in both the cases of the two semiconductor light emitting chips.

(Phosphor)

The phosphor according to the present invention is a nitride phosphor that is activated by Eu, and includes a group II element M, and Si, Al, B and N. The phosphor absorbs light from the ultraviolet range to the blue range, and thus emits red light. This nitride phosphor is represented by the general formula $M_wAl_xSi_yB_zN_{((2/3)w+x+(4/3)y+z)}:Eu^{2+}$. M is at least one element selected from the group consisting of Mg, Ca, Sr and Ba.

In the above general formula, w, x, y and z preferably fall within the ranges of $0.056 \leq w \leq 9$, $x=1$, $0.056 \leq y \leq 18$, and $0.0005 \leq z \leq 0.5$. In addition, w, x, y and z may fall within the ranges of $0.04 \leq w \leq 3$, $x=1$, $0.143 \leq y \leq 8.7$ and $0.0005 \leq z \leq 0.5$, and more preferably within the ranges of $0.05 \leq w \leq 3$, $x=1$, $0.167 \leq y \leq 8.7$ and $0.0005 \leq z \leq 0.5$. In addition, z that indicates the boron mole concentration in the general formula is set not more than 0.5 and preferably not more than 0.3, and additionally is set not less than 0.0005. Additionally, the boron mole concentration is more preferably set not less than 0.001 and not more than 0.2.

Although this nitride phosphor is activated by Eu, Eu can be partially substituted by at least one rare earth element that is selected from the group consisting of Sr, Tm, Yb, Y, La, Ce, Pr, Nd, Sm, Eu, Gd, Tb, Dy, Ho, Er and Lu.

The nitride phosphor is preferably represented by the general formula $M_{1-x}AlSiB_zN_{((2/3)(1-x)+(7/3)+z)}:xEu^{2+}$, where M is at least one element selected from the group consisting of Mg, Ca, Sr and Ba. In the phosphor represented by this general formula, x and z fall within the ranges of $0.001 \leq x \leq 0.3$ and $0.0005 \leq z \leq 0.5$, respectively.

In addition, the phosphor may be represented by the general formula $M_wAlSiB_zN_{((2/3)w+(7/3)+z)}:Eu^{2+}$, where M is at least one element selected from the group consisting of Mg, Ca, Sr and Ba. In the general formula, w and z fall within the following ranges.

$0.04 \leq w \leq 3$, and $0.0005 \leq z \leq 0.5$

The nitride phosphor according to this embodiment of the present invention is produced by mixing various kinds of phosphor materials in a wet or dry manner. Material compositions such as $Ca_3N_2$, $Si_3N_4$, AlN, BN, and $H_3BO_3$ are used as the phosphor materials.

Boron, boride, boron nitride, borate, and so on, can be used as a boron material of the phosphor. Specifically, B, BN, $H_3BO_3$, $B_2O_3$, $BCl_3$, $SiB_6$, $CaB_6$, and so on can be given as boron to be added to the phosphor material. As for these boron compounds, a predetermined amount of the compound is measured, and the measured amount of the compound is added to the material.

Ca in the phosphor composition is preferably used alone. However, Ca can be partially substituted by Sr, Mg, Ba, Sr, and Ba. In the case where Ca is partially substituted by Sr, it is possible to adjust the light emission wavelength peak of the nitride phosphor.

Although Si is also preferably used alone, Si can be also partially substituted by a group IV element C or Ge. However, in the case where Si is used alone, the nitride phosphor can be inexpensive and can have good crystallinity.

Although the activator Eu is preferably used alone, Eu can be partially substituted by Sr, Tm, Yb, Y, La, Ce, Pr, Nd, Sm, Eu, Gd, Tb, Dy, Ho, Er or Lu. In the case of partial substitution of other element for Eu, other element provides coactivation. Coactivation can vary color tone, and thus can adjust light emission characteristics. In the case where mixture essentially containing Eu is used, its composition ratio can be suitably varied. Europium mainly has a divalent or trivalent energy level. In the nitride phosphor according to this embodiment of the present invention, $Eu^{2+}$ is used as an activation agent for Ca as a base material. $Eu^{2+}$ is easily oxidized. Accordingly, a trivalent composition $Eu_2O_3$ is commercially available. However, in the commercially available $Eu_2O_3$, O has large influence. Accordingly, it is difficult to provide an excellent phosphor. For this reason, it is preferable to use a material in which O is removed from $Eu_2O_3$ outwardly of the system. For example, it is preferable to use europium as a single substance or europium nitride.

The nitride phosphor can contain not less than 1 and not more than 500 ppm of at least one element selected the group consisting of group I elements of Cu, Ag and Au; group III elements of Al, Ga and In; group IV elements of Ti, Zr, Hf, Sn and Pb; group V elements of P, Sb and Bi; and a group VI element of S. Similarly to group I element, these elements fly away in burning of production process. Accordingly, the added amounts of these elements after burning become smaller than the amounts of these elements that are originally added to the material. For this reason, the amounts of these elements that are originally added to the material are preferably adjusted not more than 1000 ppm. In the case where these elements are added, it is possible to adjust light emission efficiency.

In the nitride phosphor, the mole concentration ratios of Fe, Ni, Cr, Ti, Nb, Sm and Yb are preferably not more than 0.01 relative to the mole concentration of M. The reason is that, if the nitride phosphor contains large amounts of Fe, Ni, Cr, Ti, Nb, Sm and Yb, the light emission luminance of the nitride phosphor decreases.

Generally, an element that is additionally added to the aforementioned nitride phosphor is added as oxide or hydroxide oxide, but is not limited to them. The element may be added as a form of metal, nitride, imide, amide or other inorganic salt, or may be previously contained in other material.

The composition of the nitride phosphor contains oxygen. It is conceivable that the oxygen is introduced from various kinds of oxide materials, or mixed in burning. It is expected that this oxygen enhances effects of Eu diffusion, particle growth, and crystallinity improvement. Although replacement of one compound that is used as a material with metal, nitride and oxide provides a similar effect, oxide can provide a larger effect in some cases.

(Phosphor Substance)

Other phosphor substance that is used as the phosphor 11 or 108 in the light emitting device includes at least two kinds of phosphor substances that are excited practically directly by light from an excitation light source. "To be excited practically directly" refers to "to be excited mainly by light from an excitation light source". For example, in the case where an excitation light source is used which has a main light emission peak in the ultraviolet range, a practically directly excited phosphor substances refers to a phosphor substance that has light emission efficiency of not less than 60% of the maximum value in the visible light range. Conversely, the case of "not to be excited practically directly" refers to the case where a phosphor substance is hardly excited by light from an excitation light source (primary light), and is excited by light from another phosphor substance (secondary light) that serves an excitation light source, that is, the case where a phosphor substance is excited by the secondary light.

The phosphor substance that is used in the light emitting device according to the present invention includes at least a nitride phosphor that is represented by the general formula $MwAlxSiyBzN((2/3)w+x+(4/3)y+z):R$ (M is at least one element selected from the group consisting of Mg, Ca, Sr and Ba, $0.04 \leq w \leq 9$, $x=1$, $0.5 \leq y < 1$ or $1 < y \leq 8$ and $0 \leq z \leq 0.5$, and R is a rare earth element).

<Nitride Phosphor>

The nitride phosphor is activated by Eu, and includes a group II element M, and Si, Al, B and N. The phosphor absorbs light from the ultraviolet range to the blue range, and thus emits red light.

This nitride phosphor is represented by the general formula

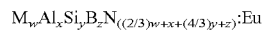
$M_wAl_xSi_yB_zN_{((2/3)w+x+(4/3)y+z)}:Eu$

M is at least one element selected from the group consisting of Ng, Ca, Sr and Ba. In the general formula, w, x, y and z fall within the following ranges.

$0.04 \leq w \leq 9$, $x=1$, $0.5 \leq y < 1$ or $1 < y \leq 8$, and $0 \leq z \leq 0.5$ z that indicates the boron mole concentration in the general formula is set not more than 0.5 and preferably not more than 0.3, and additionally is set not less than 0.001. Additionally, the boron mole concentration is more preferably set not less than 0.001 and not more than 0.2.

Although this nitride phosphor is activated by Eu, Eu can be partially substituted by at least one rare earth element that is selected from the group consisting of Sc, Y, La, Ce, Pr, Nd, Sm, Gd, Tb, Dy, Ho, Er, Tm, Yb, and Lu.

The nitride phosphor is preferably a phosphor that is represented by the general formula $M_{1-x}AlSiB_zN_{(3+z)}:xEu2+$. M is at least one element selected from the group consisting of Ng, Ca, Sr and Ba. In the phosphor that is represented by this general formula, x falls within the range of $0.001 \leq x \leq 0.3$, and z falls within the range of $0.001 \leq z \leq 0.5$.

The nitride phosphor is produced by mixing various kinds of phosphor materials in a wet or dry manner. Material compositions such as $Ca_3N_2$, $Si_3N_4$, AlN, BN, and $H_3BO_3$ are used as the phosphor materials.

Boron, boride, boron nitride, borate, and so on, can be used as a boron material of the phosphor. Specifically, B, BN, $H_3BO_3$, $B_2O_3$, $BCl_3$, $SiB_6$, $CaB_6$, and so on can be given as boron to be added to the phosphor material. As for these boron compounds, a predetermined amount of the compound is measured, and the measured amount of the compound is added to the material.

Ca in the phosphor composition is preferably used alone. However, Ca can be partially substituted by Sr, Mg, Ba, Sr, and Ba. In the case where Ca is partially substituted by Sr, it is possible to adjust the light emission wavelength peak of the nitride phosphor.

Although Si is also preferably used alone, Si can be also partially substituted by C or Ge as a group IV element, Sn, Ti, Zr, or Hf. However, in the case where Si is used alone, the nitride phosphor can be inexpensive and can have good crystallinity.

Although Al or B is also preferably used alone, Al or B can be also partially substituted by Ga or In as a group III element, V, Cr, or Co. However, in the case where Al or B is used alone, the nitride phosphor can be inexpensive and can have good crystallinity.

Although the activator Eu is preferably used alone, Eu can be partially substituted by Sc, Y, La, Ce, Pr, Nd, Sm, Gd, Tb, Dy, Ho, Er, Tm, Yb, or Lu. In the case of partial substitution of other element for Eu, other element provides coactivation. Coactivation can vary color tone, and thus can adjust light emission characteristics. In the case where mixture essentially containing Eu is used, its composition ratio can be suitably varied. Europium mainly has a divalent or trivalent energy level. In the nitride phosphor, Eu2+ is used as an activation agent for Ca as a base material. Eu2+ is easily oxidized. Accordingly, a trivalent composition Eu2O3 is commercially available. However, in the commercially available Eu2O3, O has large influence. Accordingly, it is difficult to provide an excellent phosphor. For this reason, it is preferable to use a material in which O is removed from Eu2O3 outwardly of the system. For example, it is preferable to use europium as a single substance or europium nitride.

The aforementioned nitride phosphor can contain not less than 1 and not more than 500 ppm of at least one element selected the group consisting of group I elements of Cu, Ag and Au; group III elements of Al, Ga and In; group IV elements of Ti, Zr, Hf, Sn and Pb; group V elements of P, Sb and Bi; and a group VI element of S. These chips fly away in burning of production process. Accordingly, the added amounts of these elements after burning become smaller than the amounts of these elements that are originally added to the material. For this reason, the amounts of these elements that are originally added to the material are preferably adjusted not more than 1000 ppm. In the case where these elements are added, it is possible to adjust light emission efficiency.

Generally, an element that is additionally added to the aforementioned nitride phosphor is added as oxide or hydroxide oxide, but is not limited to them. The element may be added as a form of metal, nitride, imide, amide or other inorganic salt, or may be previously contained in other material.

The composition of the aforementioned nitride phosphor contains oxygen. It is conceivable that the oxygen is introduced from various kinds of oxide materials, or mixed in burning. It is expected that this oxygen enhances effects of Eu diffusion, particle growth, and crystallinity improvement. Although replacement of one compound that is used as a material with metal, nitride and oxide provides a similar effect, oxide can provide a larger effect in some cases.

(Phosphor Production Method)

The following description will describe a production method of a phosphor $Ca_wAl_xSi_yB_zN_{((2/3)w+x+(4/3)y+z)}:Eu^{2+}$ containing B according to the present invention with reference to FIG. 4. However, the present invention is not limited to this production method. A material of Ca is first pulverized (P1). Although it is preferable to use a material of Ca as a single material, compounds such as an imide compound and an amide compound can be used. In addition, the material of Ca may contain Li, Na, K, B, Al, and so on. The purified material is preferable. The reason is that, in this case, a purifying step is not necessary. Therefore, it is possible to simplify phosphor production process, and thus to provide an inexpensive nitride phosphor. The material of Ca is pulverized in an argon atmosphere in a glove box. Ca is preferably pulverized to the extent that its mean particle diameter falls within the range of not less than about 0.1 μm and not more than 15 μm in terms of reactivity with other materials, particle diameter control in and after burning, and so on. However, the mean particle diameter of Ca is not limited to this range. It is preferable that the purity of Ca is 2N or more, however it is not specifically limited to this.

Subsequently, the material of Ca is nitrided in a nitrogen atmosphere (P2). This reaction formula is shown in Reaction Formula 1.

Reaction Formula 1

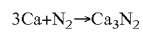

In addition, Ca is nitrided in a nitrogen atmosphere at temperature of 600° to 900° C. for about 5 hours. Thus, Ca nitride can be obtained. The Ca nitride preferably has a high purity.

In addition, the Ca nitride is pulverized (P3). The Ca nitride is pulverized in an argon atmosphere or a nitrogen atmosphere, in a glove box.

In addition, a material of Si is pulverized (P4). Although it is preferable to use the material of Si as a single material, compounds such as a nitride compound, an imide compound and an amide compound can be used. Examples of the material of Si is provided by $Si_3N_4$, $Si(NH_2)_2$, $Mg_2Si$, and so on. The purity of the material of Si is preferably 3N or more. However, the material of Si may contain other elements such as Li, Na, K, B, Al, and Cu. Si is pulverized in an argon atmosphere or a nitrogen atmosphere, in a glove box, similarly to the material of Ca. A Si compound preferably has a mean particle diameter that falls within the range of not less than about 0.1 μm and not more than 15 μm in terms of reactivity with other materials, particle diameter control in and after burning, and so on.

The material of Si is nitrided in a nitrogen atmosphere (P5). This reaction formula is shown in Reaction Formula 2

Reaction Formula 2

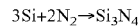

Silicon Si is also nitrided in a nitrogen atmosphere at temperature 800° to 1200° C. for about 5 hours. Thus, silicon nitride can be obtained. The silicon nitride that is used in the present invention preferably has a high purity.

Similarly, the Si nitride is pulverized (P6).

AlN is synthesized by direct nitridation of Al, or the like. However, commercially available AlN powder can be also used.

BN is synthesized by direct nitridation of B, or the like. However, commercially available BN powder can be also used.

Subsequently, the Al nitride AlN, the B nitride BN, and a Eu compound $Eu_2O_3$ are pulverized (P7). After pulverized, they preferably have a mean particle diameter from about 0.1 μm to 15 μm.

After the aforementioned pulverization is conducted, the Ca nitride, the Si nitride, the Al nitride, the B nitride, and the Eu oxide are measured and mixed to obtain compositions according to examples 1 to 11 shown in Tables 3 to 5 shown later (P8).

The Ca nitride, the Si nitride, the Al nitride, the B nitride, and the Eu compound $Eu_2O_3$ can be mixed in a dry manner.

The Ca nitride, the Si nitride, the Al nitride, the B nitride, and the Eu oxide are burned in an ammonia atmosphere (P9). After burning, a phosphor that is represented by $Ca_{0.990}Al_{1.000}Si_{1.000}B_{0.005}N_{3.005}$:0.010Eu can be obtained (P10). This reaction formula of the nitride phosphor according to the example 1 in this burning step is shown in Reaction Formula 3.

Reaction Formula 3

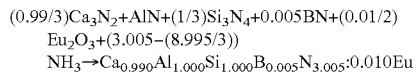

$NH_3 \rightarrow Ca_{0.990}Al_{1.000}Si_{1.000}B_{0.005}N_{3.005}$:0.010Eu

Nitride phosphors according to the examples 1 to 4 are provided by varying the composition ratio of materials.

A tubular furnace, a small furnace, a high-frequency furnace, a metal furnace, and so on, can be used for burning. The burning is conducted at burning temperature in a range from 1200° to 2000° C., however the burning temperature preferably falls within a range from 1400° to 1800° C. It is preferable to use single-stage burning. In the single-stage burning, the temperature is gradually increased, thus burning is conducted at temperature in a range from 1200° to 1500° C. for several hours. However, two-stage burning (multi-stage burning) may be used. In the two-stage burning, burning in a first stage is conducted at temperature in a range from 800° to 1000° C., and then the temperature is gradually increased. Burning in a second stage is conducted at temperature in a range from 1200° to 1500° C.

A reducing atmosphere contains at least one of nitrogen, hydrogen, argon, carbon dioxide, carbon monoxide, and ammonia. However, burning can be conducted in a reducing atmosphere other than this reducing atmosphere.

The target nitride phosphor can be obtained by the aforementioned production method.

A nitride phosphor $(Ca_{0.1000}Al_{1.000}Si_{1.000}B_xN_{3.000+x}$:Eu) is also produced by steps substantially similar to the aforementioned steps. Ca nitride, Si nitride, Al nitride, B nitride, and Eu oxide are burned in an ammonia atmosphere by the steps P1-P9. After burning, a phosphor that is represented by $CaAlSiB_xN_{3+x}$:Eu can be provided (P10). This reaction formula of the nitride phosphor according to an example 30 in this burning step is shown in Reaction Formula 4.

Reaction Formula 4

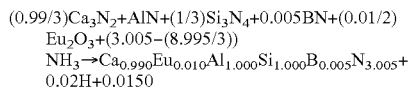

$NH_3 \rightarrow Ca_{0.990}Eu_{0.010}Al_{1.000}Si_{1.000}B_{0.005}N_{3.005} + 0.02H + 0.0150$ Nitride phosphors according to examples 30 to 33 are provided by varying the composition ratio of materials. A nitride phosphor with the composition $(Ca_{0.990}Eu_{0.010}Al_{1.000}Si_{1.000}B_{0.005}N_{3.005})$ is produced as one example. FIG. 5 is a view showing the normalized light emission spectrum of the nitride phosphor $(Ca_{0.990}Eu_{0.010}Al_{1.000}Si_{1.000}B_{0.005}N_{3.005})$. FIG. 6 is a view showing the normalized excitation spectrum of the nitride phosphor $(Ca_{0.990}Eu_{0.010}Al_{1.000}Si_{1.000}B_{0.005}N_{3.005})$. FIG. 7 is a view showing the normalized reflection spectrum of the nitride phosphor $(Ca_{0.990}Eu_{0.010}Al_{1.000}Si_{1.000}B_{0.005}N_{3.005})$ relative to $CaHPO_4$.

The Eu concentration of this nitride phosphor is set to 0.01. The Eu concentration is a mole ratio relative to the Ca mole concentration. The B mole concentration is 0.005.

This nitride phosphor is produced as follows. First, material of Ca is pulverized to 1 to 15 μm, and is nitrided in a nitrogen atmosphere. After that, the Ca nitride is pulverized to 0.1 to 10 μm. 20 g of the material of Ca is measured, and then nitrided.

A material of Si is similarly pulverized to 1 to 15 μm, and is nitrided in a nitrogen atmosphere. After that, the Si nitride is pulverized to 0.1 to 10 μm. 20 g of the material of Si is measured, and then nitrided.

Subsequently, B nitride BN, Al nitride AlN, and a Eu compound $Eu_2O_3$ are pulverized to 0.1 to 10 μm.

The Ca nitride, the Si nitride, the Al nitride, the B nitride, and the Eu oxide are mixed in a nitrogen atmosphere. In the example 30, the mixture ratio (mole ratio) of element in calcium nitride $Ca_3N_2$, aluminum nitride AlN, silicon nitride $Si_3N_4$, boron nitride BN, and europium oxide $Eu_2O_3$ as materials is adjusted to Ca:Al:Si:B:Eu=0.99:1.00:1.00:0.005:0.01.

The amounts of $Ca_3N_2$ (molecular weight: 148.3), AlN (molecular weight: 40.99), $Si_3N_4$ (molecular weight: 140.3), BN (molecular weight: 24.82), and $Eu_2O_3$ (molecular weight: 352.0) are measured and mixed to achieve this mixture ratio.

The aforementioned compounds are mixed and burned. The burning condition is as follows. The aforementioned compounds are placed in a crucible in an ammonia atmosphere. The temperature is gradually increased from ambient temperature. The burning is conducted at about 1600° C. for about 5 hours. The temperature is gradually reduced to ambient temperature. Thus, the nitride phosphor of the aforementioned composition can be produced.

The nitride phosphor of the aforementioned composition has chromaticity values x=0.659 and y=0.334, a light emission peak wavelength (λp)=656 nm, and a mean particle diameter 5.0 to 10.0 μm. The nitride phosphor contains oxygen. This nitride phosphor has highly excellent oxidation resistance. As for its temperature characteristics, in the case where the nitride phosphor is baked at 300° C. for 65 hours, light emission luminance reduction is only 2%.

(Phosphor)

The nitride phosphor according to this embodiment of the present invention is used together with other phosphor, and coverts light emission of the blue light emitting chip to provide a high color rendering white light source. A phosphor that is mixed with the nitride phosphor according to this embodiment of the present invention is a phosphor that emits blue, green, yellow, or the like.

The phosphor that emits blue, green or yellow can be various kinds of phosphors, and, in particular, preferably is at least one of an yttrium aluminum oxide phosphor activated by at least cerium, an yttrium gadolinium aluminum oxide phosphor activated by at least cerium, and an yttrium gallium aluminum oxide phosphor activated by at least cerium. In this case, it is possible to provide a light emitting device with desired light emission color. In the case where the nitride phosphor according to the present invention, and an yttrium aluminum oxide phosphor activated by cerium, and so on are used together, light can efficiently outgo. Specifically, $Ln_3M_5O_{12}$:R (Ln is at least one selected from Y, Gd, Lu and La, M contains at least one of Al and Ga, and R is lanthanoids series), and $(Y_{1-x}Gd_x)_3(Al_{1-y}Ga_y)_5O_{12}$:Rz (R is at least one selected from Ce, Tb, Pr, Sm, Eu, Dy and Ho, and $0 \leq z \leq 0.5$) can be used. This phosphor is excited by light in a range from the near ultraviolet range to a visible short wavelength side range, i.e., in a wavelength range of 270 to 500 nm, and has the peak wavelength in a range 500 to 600 nm. However, a phosphor with a third spectrum is not limited to the aforementioned phosphors, various kinds of phosphors can be used.

The reason is that, in the case where the yttrium aluminum oxide phosphor is included, it is possible to adjust desired chromaticity. The yttrium aluminum oxide phosphor activated by cerium absorbs a part of blue light emitted from the light-emitting chip 10 and thus emits yellow range light. The blue light emitted from the light-emitting chip 10 and the light of the yttrium aluminum oxide phosphor are mixed, thus, white light emission is obtained. The phosphor 11 includes yttrium aluminum oxide phosphor and nitride phosphor that are mixed in a transparent coating member. Accordingly, in the case where the phosphor 11 is used in combination with the light emitting chip 10 to mix light of the phosphor 11 with blue light, it is possible to provide a warm, white light emitting device. In addition, it is possible to provide a white light emitting device with an excellent color rendering.

The phosphor that is used in combination with the nitride phosphor according to this embodiment of the present invention is not limited to an yttrium aluminum oxide phosphor. A phosphor that has a purpose similar to the aforementioned phosphor, and emits light that has at least one second light emission spectrum in a range from the blue range to green, yellow and red range can be used in combination with the nitride phosphor. Accordingly, it is possible to provide a light emitting device that emits white light based on the additive color mixture principle. The phosphor that is used in combination with the nitride phosphor according to this embodiment of the present invention can include green range phosphors $SrAl_2O_4$:Eu, $Y_2SiO_5$:Ce,Tb, $MgAl_{11}O_{19}$:Ce, Tb, $Sr_4Al_{14}O_{25}$:Eu and (at least one of Mg, Ca, Sr, and Ba) $Ga_2S_4$:Eu; blue range phosphor $Sr_5(PO_4)_3Cl$:Eu, $(SrCaBa)_5$ $(PO_4)_3Cl$:Eu, $(BaCa)_5(PO_4)_3Cl$:Eu, (at least one of Mg, Ca, Sr, and Ba)$_2B_5O_9Cl$:Eu, Mn, (at least one of Mg, Ca, Sr, and Ba)$_5(PO_4)_3Cl$:Eu and Mn; and red range phosphors $Y_2O_2S$: Eu, $La_2O_2S$:Eu, $Y_2O_3$:Eu and $Gd_2O_2S$:Eu. In this case, a desired light emission spectrum can be obtained. However, green, blue and red range phosphors are not limited to the aforementioned phosphors, various kinds of phosphors can be used.

<Nitride Phosphor>

The following description will describe $MAlSiN_3$:R (M is at least one element selected from the group consisting of Ng, Ca, Sr and Ba, and R is a rare earth element) that is activated by Eu as a phosphor other than the aforementioned composition. The description of structure substantially similar to the aforementioned structure is omitted.

Although R in this nitride phosphor is activated by Eu, Eu as an activator R can be partially substituted by at least one rare earth element that is selected from the group consisting of Sc, Y, La, Ce, Pr, Nd, Sm, Gd, Tb, Dy, Ho, Er, Tm, Yb, and Lu. In the case of partial substitution of other element for Eu, other element provides coactivation. Coactivation can vary color tone, and thus can adjust light emission characteristics, and so on.

The nitride phosphor is produced by mixing various kinds of phosphor materials in a wet or dry manner. Material compositions such as $Ca_3N_2$, $Si_3N_4$, and AlN are used as the phosphor materials.

Ca in the phosphor composition is preferably used alone. However, Ca can be partially substituted by Sr, Mg, Ba, Sr, and Ba. In the case where Ca is partially substituted by Sr or the like, it is possible to adjust the light emission wavelength peak of the nitride phosphor.

Although Si is also preferably used alone, Si can be also partially substituted by C or Ge as a group IV element, Sn, Ti, Zr, or Hf. However, in the case where Si is used alone, the nitride phosphor can be inexpensive and can have good crystallinity.

Although Al is also preferably used alone, Al can be also partially substituted by Ga or In as a group III element, V, Cr, or Co. However, in the case where Al is used alone, the nitride phosphor can be inexpensive and can have good crystallinity.

<Nitride Phosphor Production Method>

A production method of a nitride phosphor $CaAlSiN_3$:Eu is now described, however, it is not limited to this production method. The description of process substantially similar to the aforementioned process in the production method of the aforementioned nitride phosphor $(Ca_wAl_xSi_yB_z N_{(2/3)w+x+(4/3)y+z})$:Eu) is omitted.

A material of Ca is pulverized (P1).

The material of Ca is nitrided in a nitrogen atmosphere (P2).

The Ca nitride is pulverized (P3).

A material of Si is pulverized (P4).

The material of Si is nitrided in a nitrogen atmosphere (P5).

Similarly, the Si nitride is pulverized (P6).

The Al nitride, and a Eu compound $Eu_2O_3$ are pulverized (P7).

The Ca nitride, the Si nitride, the Al nitride, and the Eu oxide $Eu_2O_3$ are mixed in a dry manner (P8).

The Ca nitride, the Si nitride, the Al nitride, and $Eu_2O_3$ are burned in an ammonia atmosphere (P9). After burning, a phosphor that is represented by $CaAlSiN_3$:Eu can be provided (P10).

In addition, a target nitride phosphor can be changed by varying the composition ratio of materials.

The target nitride phosphor can be obtained by the aforementioned production method.

<Other Phosphor>

The phosphor material 11 or 108 includes other phosphor together with the nitride oxide phosphor or the nitride phosphor. As for other phosphor, it is preferable to use at least one material selected from an alkaline-earth halogen apatite phosphor, an alkaline-earth-metal boric-acid halogen phosphor, an alkaline-earth-metal aluminate phosphor, alkaline-earth silicate, alkaline-earth sulfide, rare-earth oxide sulfide, alkaline-earth thiogallate, alkaline-earth silicon nitride and germanate that are mainly activated by lanthanoids series such as Eu, or Mn; rare earth aluminate and rare earth silicate that are mainly activated by lanthanoids series such as Ce; and an organic material and organic complex that are mainly activated by lanthanoids series such as Eu. Specifically, the following phosphors can be used, however, the phosphor that is used together with the nitride oxide phosphor or the nitride phosphor is not limited to these phosphors.

As for an alkaline-earth halogen apatite phosphor that is mainly activated by lanthanoids series such as Eu, $M_5(PO_4)_3X$:R (M is at least one element selected from Sr, Ca, Ba, Mg and Zn, X is at least one element selected from F, Cl, Br and I, and R is at least one element selected from Eu, Mn, Eu and Mn) can be given as an example.

As for an alkaline-earth halogen apatite phosphor that is mainly activated by lanthanoids series such as Eu, $M_{10}(PO_4)_6X_2$:R (M is at least one element selected from Sr, Ca, Ba, Mg and Zn, wherein X is at least one element selected from F, Cl, Br and I, wherein R is Eu or rare earth elements essentially containing Eu) can be given as an example.

As for an alkaline-earth-metal boric-acid halogen phosphor, $M_2B_5O_9X$:R (M is at least one element selected from Sr, Ca, Ba, Mg and Zn, X is at least one element selected from F, Cl, Br and I, and R is at least one element selected from Eu, Mn, Eu and Mn) can be given as an example.

As for an alkaline-earth-metal aluminate phosphor, $SrAl_2O_4$:R, $Sr_4Al_{14}O_{25}$:R, $CaAl_2O_4$:R, $BaMg_2Al_{16}O_{27}$:R, and $BaMgAl_{10}O_{17}$:R (R is at least one element of Eu, Mn, Eu and Mn) can be given as examples.

As for an rare-earth sulfide phosphor, $La_2O_2S$:Eu, $Y_2O_2S$:Eu, and $Gd_2O_2S$:Eu can be given as examples.

As for a rare earth aluminate phosphor that is mainly activated by lanthanoids series such as Ce, a YAG group phosphor that has garnet structure represented by the compositions $Y_3Al_5O_{12}$:Ce; $(Y, Gd)_3Al_5O_{12}$:Ce; $Y_3(Al, Ga)_5O_{12}$:Ce; $(Y, Gd)_3(Al, Ga)_5O_{12}$:Ce; $Tb_3Al_5O_{12}$:Ce; $Y_3Al_5O_{12}$:Ce, Pr can be given as examples.

ZnS:Ag, ZnS:Cu, ZnS:Mn, $Zn_2GeO_4$:Mn, and $MGa_2S_4$:Eu (M is at least one chip of Sr, Ca, Ba, Mg, and Zn) can be given as other phosphors. In addition, $MSi_7N_{10}$:Eu, $(M, O)_2Si_5N_8$:Eu, $(M, O)Si_7N_{10}$:Eu (M is at least one element selected from Sr, Ca, Ba, Mg, and Zn) can be also given as other phoshors.

As for the aforementioned phosphors, at least one element selected from the group consisting of Tb, Cu, Ag, Au, Cr, Nd, Dy, Co, Ni, Ti, and so on can be contained instead of Eu, or in addition to Eu, if desired.

Additionally, a phosphor other than the aforementioned phosphors with similar performance and effect can be used.

The light emission spectrums of the phosphors that are used in the examples among the aforementioned phosphors are shown. FIG. 8 is a view showing the normalized light emission spectrums of various types of phosphors in the case where these phosphors are excited by an excitation light source with 400 nm. The phosphors $Sr_4Al_{14}O_{25}$:Eu, $BaSi_2O_2N_2$:Eu, and $Ca_{10}(PO_4)_6Cl_2$:Eu are used. FIG. 9 is a view showing the normalized light emission spectrums of various types of phosphors in the case where these phosphors are excited by an excitation light source with 460 nm. The phosphors $(Y Gd)_3Al_5O_{12}$:Ce, $Lu_3Al_5O_{12}$:Ce, $Y_3(Al, Ga)_5O_{12}$:Ce, $CaAlSiN_3$:Eu, and $CaAlB_{0.005}SiN_{3.005}$:Eu are used. The light emission intensities in the emission spectrums are represented so that each light emission intensity in the light emission peak wavelength in each phosphor is set to a value of 100.

Among these phosphors, a phosphor that has the light emission spectrum in a yellow, red, green, or blue range by excitation of light from the light emitting chip 10 or 101 can be used. In addition, a phosphor that has the light emission spectrum in the intermediate color range of them, such as yellow, bluish green and orange, can be also used. In the case where these phosphors are used in combination with the nitride oxide phosphor or the nitride phosphor, it is possible to provide light emitting devices with various light emission colors.

In the case where the phosphor substance 11 or 108 includes the combination of two or more kinds of phosphors that are excited directly by light from the excitation light source, it is possible to provide various types of light emission colors.

The aforementioned phosphor material 11 or 108 preferably has a particle diameter in a range 1 to 20 μm, and more preferably 2 to 8 μm. In particular, the range is preferably 5 to 8 μm. A phosphor with a particle diameter less than 2 μm tends to form aggregate. Conversely, a phosphor with a particle diameter range of 5 to 10 μm has high light absorption and conversion efficiency. In the case where a phosphor that has the particle diameter with excellent optical features is contained, the mass-producibility of light emitting devices is improved.

In this case, the particle diameter refers to a mean particle diameter that is obtained by an air permeation method. Specifically, the particle diameter is converted as mean particle diameter from a relative surface area value that is obtained based on pressure difference, under environmental condition at temperature of 25° C. and humidity of 70%, in the state where air flows through a special tubular vessel at a constant pressure, wherein the vessel is provided with a sample of measured volume of 1 cm$^3$ that is packed therein. The oxynitride phosphor and nitride phosphor preferably have a mean particle diameter in the range of 2 to 8 μm. In addition, it is preferable that the content of the phosphor with the above mean particle diameter is high. Additionally, the phosphors preferably have distribution in which its particles lie in a narrow range. In particular, the phosphors preferably have distribution that has few very small particles with a particle diameter not more than 2 μm. In the case where a phosphor is used which has a small particle diameter and less unevenness of particle diameter distribution, color unevenness can be reduced. Therefore, it is possible to provide a light emitting device with excellent color tone.

The nitride phosphors $MAlB_xSiN_{3+x}$:Eu, and $MAlSiN_3$:Eu can provide efficient wavelength conversion by an excitation light source with a relatively long wavelength as compared with oxide phosphors. Through the use of thus property, in the case where the nitride phosphors $MAlB_xSiN_{3+x}$:Eu, and $MAlSiN_3$:Eu are also excited to emit light by blue light that is emitted by a phosphor that emits blue range light by using ultraviolet rays as an excitation light source (e.g., alkaline-earth halogen apatite phosphor, alkaline-earth metal aluminate phosphor, and so on), it is possible to provide a light emitting device that has a wide color tone range. The nitride phosphors $MAlB_xSiN_{3+x}$:Eu, and $MAlSiN_3$:Eu have light emission efficiency by an excitation light source that has a main light emission peak from 250 to 500 nm of not less than 60% of the maximum value in the visible light range. Accordingly, they are a practically directly excited phosphor.

Since the nitride phosphors $MAlB_xSiN_{3+x}$:Eu, and $MAlSiN_3$:Eu can also efficiently emit light in the case where a light source in the visible shorter wavelength range is used, a light emitting chip that emits light in the visible shorter wavelength range can be used as an excitation light source without using a phosphor that emits blue light.

The nitride phosphor $MAlB_xSiN_{3+x}$:Eu, or $MAlSiN_3$:Eu is essentially included, additionally, in the case use of an alkaline-earth halogen apatite phosphor, an alkaline-earth-metal boric-acid halogen phosphor, an alkaline-earth-metal aluminate phosphor, alkaline-earth-metal silicate, alkaline-earth sulfide, rare-earth oxide sulfide, alkaline-earth-metal sulfide, alkaline-earth thiogallate, alkaline-earth silicon nitride and germanate that are mainly activated by lanthanoids series such as Eu and Mn; rare earth aluminate and rare earth silicate that are mainly activated by lanthanoids series such as Ce; or an organic material and organic complex that are mainly activated by lanthanoids series such as Eu, it is possible to provide a light emitting device that has a very wide color tone range. FIG. 10 is a CIE1931 chromaticity diagram showing a color tone range that can be provided by mixture of various kinds of phosphors in the case where an excitation light source is used which emits ultraviolet rays. FIG. 11 is a CIE1931 chromaticity diagram showing a color tone range that can be provided by mixture of various kinds of phosphors in the case where an excitation light source is used which emits blue range light.

As shown in FIG. 10, in the case where an excitation light source is used which emits light with a main light emission peak of about 400 nm in the ultraviolet range, the color reproducibility range can be increased by using two or more kinds of phosphors that essentially include the nitride phosphor $MAlB_xSiN_{3+x}$:Eu, or $MAlSiN_3$:Eu, and have a light emission peak wavelength in the visible light range. The phosphor substance 11 or 108 includes at least two kinds of phosphors that are excited directly by light from the excitation light source. In particular, in the case where an excitation light source is used which emits ultraviolet rays, since the excitation light source is hardly visible or is invisible, only the color of the phosphor substance 11 or 108 determines light emission color. Accordingly, in order to provide desired color tone, it is preferable that composition ratio of phosphors is suitably varied. Table 1 shows chromaticity values of representative phosphors in the case where an excitation light source is used which emits light with a main light emission peak of about 400 nm.

TABLE 1

| Phosphor Substance | Chromaticity x | Chromaticity y |
|---|---|---|
| Ca$_{10}$(PO4)6Cl2 | 0.138 | 0.059 |
| BaSi2O2N2:Eu | 0.081 | 0.453 |
| BaGa2S4:Eu | 0.143 | 0.517 |
| BaMgAl10O17:Eu, Mn | 0.145 | 0.666 |
| SrGa2S4:Eu | 0.283 | 0.680 |
| SrSi2O2N2:Eu | 0.333 | 0.614 |
| CaSi2O2N2:Eu | 0.422 | 0.549 |
| (Y, Gd)3Al5O12:Ce | 0.472 | 0.486 |
| Ca2Si5N8:Eu | 0.646 | 0.346 |
| Sr2Si5N8:Eu | 0.638 | 0.361 |
| (Sr, Ca)2Si5N8:Eu | 0.663 | 0.321 |
| CaAlSiN3:Eu | 0.637 | 0.359 |
| CaAlBxSiN3 + x:Eu | 0.653 | 0.343 |

As shown in FIG. 11, in the case where an excitation light source is used which emits light with a main light emission peak of about 460 nm in the blue range, a phosphor can be omitted which emits light in the blue range. Therefore, it is possible to eliminate complex phosphor composition ratio adjustment. Table 2 shows chromaticity values of phosphors in the case where an excitation light source is used which emits light with a main light emission peak of about 460 nm.

TABLE 2

| Phosphor Substance | Chromaticity x | Chromaticity y |
|---|---|---|
| BaSi2O2N2:Eu | 0.081 | 0.453 |
| BaMgAl10O17:Eu, Mn | 0.169 | 0.731 |
| SrGa2S4:Eu | 0.279 | 0.690 |
| SrSi2O2N2:Eu | 0.334 | 0.623 |
| CaSiON | 0.427 | 0.551 |
| (Y, Gd)3Al5O12:Ce | 0.456 | 0.527 |
| Ca2Si5N8:Eu | 0.595 | 0.399 |
| Sr2Si5N8:Eu | 0.632 | 0.361 |
| (Sr, Ca)2Si5N8:Eu | 0.646 | 0.346 |
| CaAlSiN3:Eu | 0.647 | 0.345 |
| CaAlBxSiN3 + x:Eu | 0.659 | 0.334 |

YAG group phosphors that are used in conventional light emitting devices have the following light emission characteristics. FIG. 12 is a diagram showing the normalized excitation spectrum of a YAG group phosphor.

The YAG group phosphor has the maximum light emission efficiency value in proximity to 460 nm, and can highly efficiently convert blue light from the excitation light source into a range from yellowish green to yellow. Conversely, in the ultraviolet range of 370 to 400 nm, the YAG group phosphor has light emission efficiency of less than 10% of the light emission efficiency value in proximity to 460 nm. Accordingly, incident ultraviolet rays are mostly reflected. As a result, in combination with the excitation light source that emits ultraviolet rays, the YAG phosphor that is used alone hardly emits light.

FIG. 13 is a CIE1931 chromaticity diagram showing the chromaticity range that can be provided by a conventional light emitting device.

The conventional light emitting device is a light emitting device that emits white light. The conventional light emitting device provides white light by using blue light from an excitation light source and yellow light of a YAG phosphor that is excited by the blue light. Accordingly, the conventional light emitting device can provide only color tone that lies on a line that connects blue light emission and yellow light emission on the chromaticity diagram. For this reason, conventional light emitting devices cannot be applied to a light emitting device that can emit multi-color light.

(Coating Member 12, 109)

The phosphor substance 11 or 108 can be attached by using various kinds of coating members (binders) such as resin as an organic material, and glass as an inorganic material. A coating member 12 or 109 also serves as a binder that binds the phosphor substance 11 or 108 to the light emitting chip 10 or 101, the window 107, and so on. Specifically, in the case where an organic material is used as the coating member (binder), highly weather resistance transparent resin such as epoxy resin, urea resin, and silicone can be used. In particular, silicone is preferably used. The reason is that silicone provides reliability, and improves the dispersion of the phosphor substance 11 or 108.

The coating member 12 (transparent material) is placed in the cup of the lead frame 13, and is mixed with the phosphor substance 11 that converts light emission of the light emitting chip 10. Specifically, transparent resin with excellent temperature characteristics and weather resistance such as epoxy resin, urea resin and silicone resin, silica sol, glass, inorganic binder, and so on can be used as a material of the coating member 12. The coating member 12 may include a diffusion agent, barium titanate, titanium oxide, aluminum oxide, and so on together with the phosphor substance. In addition, the coating member 12 may include a light stabilizing agent, and a coloring agent.

In addition, an inorganic material that has thermal expansion coefficient close to the window 107 is preferably used as the coating member (binder) 12 or 109. The reason is that the phosphor substance 108 can be in good intimate contact with the window 107. Specifically, a sedimentation method, a sol-gel method, a spray method, and so on can be used. For example, the phosphor substance 11 or 108 is mixed with silanol (Si(OEt)3OH) and ethanol to form slurry. After the slurry is discharged from a nozzle, silanol is heated at 300° C. for 3 hours to form SiO2. Thus, the phosphor substance can be attached on a desired location.

In addition, a binding agent of inorganic substance can be used as the coating member (binder) 12 or 109. The binding agent refers to called low-melting glass. It is preferable that the binding agent is small particles with less absorption of light from the ultraviolet range to the visible range, and is very stable in the case where the binding agent is used as the coating member (binder) 12 or 109.

In the case where the phosphor substance with large particle diameter is attached to the coating member (binder) 12 or 109, even if having a high melting point, a binding agent of fine powder such as silica and alumina, alkaline earth metal pyrophosphate and orthophosphate with fine particle size that are obtained by a sedimentation method, and so on are preferably used. These binding agents can be used alone or mixed with each other.

An application method of the aforementioned binding agent is now described. In order to improve a binding effect, it is preferable that the binding agent is dispersed in a vehicle in a wet manner to form slurry, and thus is used as binding agent slurry. The aforementioned vehicle refers to a high viscosity solution that is obtained by dissolving a small amount of a caking agent in an organic solvent or deionized water. For example, an organic group vehicle can be obtained by providing nitrocellulose as 1 wt % of caking agent into butyl acetate as an the organic solvent.

The thus-obtained binding agent slurry is provided with the phosphor substance 11 or 108 to provide an application liquid. As for the binding agent slurry amount in the application liquid, the total amount of the binding agent in the slurry can be set to about 1 to 3 wt % relative to the phosphor substance amount in the application liquid.

The aforementioned application liquid is applied on the back surface of the aforementioned window 107. After that, warm or hot air is blown for drying. Finally, baking is conducted at temperature of 400° to 700° C., thus, the aforementioned vehicle flies away. As a result, a phosphor substance layer is attached to a desired location.

(Lead Frame 13)

The lead frames 13 are composed of the first and second frames 13a and 13b. The light emitting chip 10 is disposed on the mount lead 13a as the first lead frame. The upper par of the first lead frame 13a is formed in a cup shape. The light emitting chip 10 is die-bonded in the cup. The phosphor substance 11 and the coating member 12 cover the peripheral surface of the light emitting chip 10 in the cup. A plurality of light emitting chips 10 can be arranged in the cup of the first lead frame 13a. The first lead frame 13a can serve as a common terminal. In this case, the first lead frame 13a is required to have sufficient electric conductivity and connectivity with the conductive wire lines. The light emitting chip 10 is die-bonded (adhered) in the cup of the first lead frame 13a by thermosetting resin. Examples of thermosetting resin are provided by epoxy resin, acrylic resin and imide resin. In addition, in the case where the light emitting chip 10 to be mounted in a facedown manner (flip-chip mounting manner) is die-bonded on and electrically connected to the first lead frame 13a, Ag paste, carbon paste, metal bumps, and so on can be used. Inorganic binder also can be used.

The inner lead 13b as the second lead frame is electrically connected to the conductive wire line 14 that extends from the electrode 3 of the light emitting chip 10 that is disposed on the first lead frame 13a. In order to prevent a short circuit due to electric contact with the mount lead 13a, the inner lead 13b is preferably spaced away from the mount lead 13a. In the case where the mount lead 13a is provided with a plurality of light chips 10, conductive wire lines are required to be arranged not to become in contact with each other. The inner lead 13b is preferably formed of a material similar to the mount lead 13a. Iron, copper, copper containing iron, gold, platinum, silver and son on can be used.

(Conductive Wire Line)

The conductive wire lines 14 electrically connect the electrodes 3 of light emitting chip 10 to the lead frame 13. The conductive wire lines 14 preferably have good ohmic contact and mechanical connectivity with the electrodes 3, and high electrical conductivity and heat conductivity. Specifically, the material of the conductive wore lines 14 are preferably metal such as gold, copper, platinum and aluminum, or an alloy of them.

(Molding Member)

The molding member 15 is provided to protect the light emitting chip 10, the phosphor substance 11, the coating member 12, the lead frames 13, the conductive wire lines 14, and so on from the environmental influence. In addition to protection from the environmental influence, the molding member 15 also serves to increase the viewing angle, to reduce the directivity of the light emitting chip 10, and to focus/diffuse emitted light. The molding member can be formed in a desired shape to function as discussed above. The molding member 15 can have a convex or concave lens shape, and may have a multi-layer structure. Specifically, transparent resin with excellent transparency, weather resistance and temperature characteristics such as epoxy resin, urea resin and silicone resin, silica sol, glass, and so on can be used as a material of the molding member 15. The molding member 15 can include a diffusion agent, a coloring agent, an ultraviolet absorbing agent, and a phosphor substance. The diffusion agent is preferably barium titanate, titanium oxide, aluminum oxide, silicon oxide, or the like. In order to reduce repellence between the molding member 15 and the coating member 12, or in terms of refractive indices between them, the same material is preferably used.

EXAMPLES

The following description will describe phosphors according to examples of the present invention, and light emitting devices that uses the phosphors. Particle diameters in the examples are values that are measured by air permeability method called as F.S.S.S, No. (Fisher Sub Sieve Sizer's No.).

Examples 1 to 4

Table 3 shows the characteristics of nitride phosphors according to examples 1 to 4 that are produced by the aforementioned method. FIG. 14 is a diagram showing the light emission spectrum of the nitride phosphor according to the example 1 that is excited in Ex=460 nm. FIG. 15 is a diagram showing the excitation spectrum of the nitride phosphor according to the example 1. FIG. 16 is a diagram showing the reflection spectrum of the nitride phosphor according to the example 1. FIG. 17 is a view showing the photographs of the nitride phosphor according to the example 1 that is taken by a SEM (scanning electron microscope). FIG. 17(a) is a view showing the photograph that is taken at magnification of 1000 times. FIG. 17(b) is a view showing the photograph that is taken at magnification of 5000 times.

silicon nitride $Si_3N_4$, boron nitride BN, and europium oxide $Eu_2O_3$ as materials is adjusted to Ca:Al:Si:Eu=0.99:1.00:1.00:0.01.

The amounts of $Ca_3N_2$ (molecular weight: 148.26), AlN (molecular weight: 40.99), $Si_3N_4$ (molecular weight: 140.31), BN (molecular weight: 24.82), and $Eu_2O_3$ are measured and mixed to achieve this mixture ratio. The BN addition amounts in the examples 1 to 4 are 0.005 mole, 0.010 mole, 0.050 mole, and 0.100 mole, respectively. The aforementioned compounds are mixed and burned. The burning condition is as follows. The aforementioned compounds are placed in a crucible in an ammonia atmosphere. The temperature is gradually increased from ambient temperature. The burning is conducted at about 1600° C. for about 5 hours. The temperature is gradually reduced to ambient temperature.

TABLE 3

| | Composition Ratio | | | | | | 460 nm Excitation | | | | | |
|---|---|---|---|---|---|---|---|---|---|---|---|---|
| | | | | | | | Chromaticity | | Light Intensity | Energy Eff. | Quantum Eff. | Peak Wavelength λp | Peak Intensity |
| | Ca | Al | Si | N | BN | Eu | X | y | Y (%) | ENG (%) | QNT (%) | (nm) | Ip (%) |
| Ex. 1 | 0.990 | 1.000 | 1.000 | 3.000 | 0.005 | 0.010 | 0.659 | 0.334 | 100 | 100 | 100 | 656 | 100 |
| Ex. 2 | 0.990 | 1.000 | 1.000 | 3.000 | 0.010 | 0.010 | 0.658 | 0.335 | 94.0 | 93.1 | 93.1 | 653 | 92.9 |
| Ex. 3 | 0.990 | 1.000 | 1.000 | 3.000 | 0.050 | 0.010 | 0.656 | 0.336 | 94.4 | 92.1 | 91.9 | 654 | 91.5 |
| Ex. 4 | 0.990 | 1.000 | 1.000 | 3.000 | 0.100 | 0.010 | 0.657 | 0.335 | 93.5 | 92.3 | 92.3 | 654 | 92.2 |

The nitride phosphors according to the examples 1 to 4 are represented by

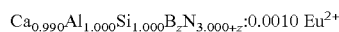

$$Ca_{0.990}Al_{1.000}Si_{1.000}B_zN_{3.000+z}:0.0010\ Eu^{2+}$$

In the nitride phosphors according to the examples 1 to 4, the boron mole concentration values are set as follows.

Example 1: 0.005
Example 2: 0.010
Example 3: 0.050
Example 4: 0.100

In the examples 1 to 4, the Eu concentration vale is 0.01. The Eu concentration is a mole ratio relative to the Ca mole concentration. The B mole concentration is in the range of 0.005 to 0.1.

The aforementioned phosphors are produced as follows. First, material of Ca is pulverized to 1 to 15 μm, and is nitrided in a nitrogen atmosphere. After that, the Ca nitride is pulverized to 0.1 to 10 μm. 20 g of the material of Ca is measured, and then nitrided. A material of Si is similarly pulverized to 1 to 15 μm, and is nitrided in a nitrogen atmosphere. After that, the Si nitride is pulverized to 0.1 to 10 μm. 20 g of the material of Si is measured, and then nitrided. Subsequently, B nitride BN, Al nitride AlN, and a Eu compound $Eu_2O_3$ are pulverized to 0.1 to 10 μm. The Ca nitride, the Si nitride, the Al nitride, the B nitride, and the Eu oxide are mixed in a nitrogen atmosphere. In the example 1, the mixture ratio (mole ratio) of element in calcium nitride $Ca_3N_2$, aluminum nitride AlN, The light emission luminance and quantum efficiency values of the nitride phosphors according to the example 1 to 4 are represented by relative values, wherein the example 1 is defined as 100%. Table 3 shows that the nitride phosphors with B mole concentration of 0.005 to 0.100 have high energy efficiency and light emission luminance, and additionally that B addition increases their peak wavelengths.

The nitride phosphors according to the examples 1 to 4 have a mean particle diameter of 5.0 to 10.0 μm. In addition, the nitride phosphors according to the examples 1 to 4 contain oxygen.

As for the nitride phosphors according to the examples 1 to 4, burning is conducted in an ammonia atmosphere by using a crucible boron nitride.

The nitride phosphors according to the examples 1 to 4 have highly excellent oxidation resistance. As for their temperature characteristics, after nitride phosphors according to the examples 1 to 4 are baked at 300° C. for 65 hours, light emission luminance reduction is only 2%.

Examples 5 to 8

Table 4 shows the characteristics of nitride phosphors according to examples 5 to 8 that are produced by the aforementioned method. FIG. 18 is a graph showing the light emission spectrum of the phosphor according to the example 5. FIG. 19 is a graph showing the excitation spectrum of the phosphor according to the example 5. FIG. 20 is a graph showing the reflection spectrum of the phosphor according to the example 5.

TABLE 4

| | Composition Ratio | | | | | | Chromaticity | | 460 nm Excitation | | | | |
|---|---|---|---|---|---|---|---|---|---|---|---|---|---|
| | | | | | | | | | Light Intensity | Energy Eff. | Quantum Eff. | Peak Wavelength $\lambda p$ | Peak Intensity |
| | Ca | Al | Si | N | BN | Eu | X | y | Y (%) | ENG (%) | QNT (%) | (nm) | Ip (%) |
| Ex. 1 | 0.990 | 1.000 | 1.000 | 3.000 | 0.005 | 0.010 | 0.659 | 0.334 | 100.0 | 100.0 | 100.0 | 656 | 100.0 |
| Ex. 5 | 1.090 | 1.000 | 1.000 | 3.067 | 0.100 | 0.010 | 0.660 | 0.332 | 84.2 | 94.4 | 94.9 | 656 | 96.7 |
| Ex. 6 | 1.040 | 1.000 | 1.000 | 3.033 | 0.050 | 0.010 | 0.656 | 0.336 | 91.3 | 96.5 | 96.7 | 655 | 97.3 |
| Ex. 7 | 1.000 | 1.000 | 1.000 | 3.007 | 0.010 | 0.010 | 0.649 | 0.343 | 98.0 | 94.0 | 93.8 | 651 | 93.4 |
| Ex. 8 | 0.955 | 1.000 | 1.000 | 3.003 | 0.005 | 0.010 | 0.646 | 0.346 | 99.5 | 92.5 | 92.1 | 650 | 90.9 |

The nitride phosphors according to examples 5 to 8 are represented by the general formula $Ca_wAl_xSi_yB_zN_{(2/3)w+x+(4/3)y+z}:Eu^{2+}$. In the nitride phosphors according to the examples 5 to 8, the calcium and boron mole concentration values are set as follows.

Example 5: Ca=1.090, B=0.100
Example 6: Ca=1.040, B=0.050
Example 7: Ca=1.000, B=0.010
Example 8: Ca=0.995, B=0.005

In the examples 5 to 8, the Eu concentration vales are mole ratios relative to 1 mole of phosphor. The B mole concentration is in the range of 0.005 to 0.1. The nitride phosphors according to examples 5 to 8 are produced by a method similar to the examples 1 to 4.

The light emission luminance and energy efficiency values of the phosphors according to the example 5 to 8 are represented by relative values, wherein the example 1 is defined as 100%. This result shows that both the light emission luminance and energy efficiency values are still high even when the Ca and B mole concentration values are increased/decreased. The nitride phosphors according to the example 5 to 8 have a mean particle diameter of 5.0 to 10.0 μm.

Examples 9 to 11

In examples 9 and 10, M is set to mixed Ca and Sr the ratio of which is 1:1 in the general formula. In examples 9 and 10, Ca and Ba are mixed at the ratio of 1:1. Table 5 shows the characteristics of nitride phosphors according to the examples 9 to 11. The examples 9 to 11 are compared with the nitride phosphor according to the example 1 as a reference phosphor. FIG. 21 is a graph showing the light emission spectrum of the phosphor according to the example 9. FIG. 22 is a graph showing the excitation spectrum of the phosphor according to the example 9. FIG. 23 is a graph showing the reflection spectrum of the phosphor according to the example 9.

The nitride phosphors according to the examples 1 to 11 have color tone different from the nitride phosphor according to the example 1. Accordingly, it is possible to produce a light emitting device that has high luminance and desired color tone.

Examples 12 to 24

FIG. 24 is a list showing the characteristics of nitride phosphors according to examples 12 to 24 that are produced by a method similar to the examples 1 to 4. The following examples use $Ca_wAl_xSi_yB_zN_{(2/3w+4/3x+y+z)}$ that corresponds a nitride phosphor composition in which M is set to Ca in $M_wAl_xSi_yB_zN_{(2/3w+4/3x+y+z)}$. The nitride phosphor according to the example 12 is represented by $Ca_{0.99}Al_1Si_1B_{0.01}N_{3.01}$: 0.01 Eu$^{2+}$. The light emission luminance and energy efficiency values of the nitride phosphors according to the examples 13 to 24 are represented by relative values, wherein nitride phosphors according to the examples 12 as a reference phosphor is defined as 100%. The nitride phosphors according to the example 12 to 24 have a mean particle diameter of 2.0 to 10.0 μm. In the nitride phosphors according to the examples, the calcium aluminum, silicon, boron and nitrogen mole concentration values are set as follows.

Example 12: Ca=0.99, Al=1, Si=1.00, BN=0.0100, N=3, Eu0.010
Example 13: Ca=0.20, Al=1, Si=0.60, BN=0.0010, N=2.1, Eu0.002
Example 14: Ca=0.20, Al=1, Si=1.10, BN=0.0010, N=2.6, Eu0.002
Example 15: Ca=0.47, Al=1, Si=2.16, BN=0.0026, N=4.211, Eu0.005
Example 16: Ca=0.25, Al=1, Si=2.88, BN=0.0013, N=5, Eu0.003

TABLE 5

| | Composition Ratio | | | | | | | | Chromaticity | | 460 nm Excitation | | | | |
|---|---|---|---|---|---|---|---|---|---|---|---|---|---|---|---|
| | | | | | | | | | | | Light Intensity | Energy Eff. | Quantum Eff. | Peak Wavelength $\lambda p$ | Peak Intensity |
| | Ca | Sr | Ba | Al | Si | N | BN | Eu | X | y | Y (%) | ENG (%) | QNT (%) | (nm) | Ip (%) |
| Ex. 1 | 0.990 | 0.000 | 0 | 1.000 | 1.000 | 3.000 | 0.005 | 0.010 | 0.659 | 0.334 | 100.0 | 100.0 | 100.0 | 656 | 100.0 |
| Ex. 9 | 0.485 | 0.485 | 0 | 0.990 | 1.000 | 2.990 | 0.010 | 0.030 | 0.670 | 0.322 | 60.4 | 81.8 | 83.8 | 659 | 78.0 |
| Ex. 10 | 0.485 | 0.485 | 0 | 0.950 | 1.000 | 2.950 | 0.050 | 0.030 | 0.673 | 0.320 | 64.8 | 90.7 | 93.1 | 664 | 87.3 |
| Ex. 11 | 0.485 | 0 | 0.485 | 0.990 | 1.000 | 2.990 | 0.010 | 0.030 | 0.636 | 0.357 | 66.5 | 64.1 | 64.5 | 657 | 57.1 |

Example 17: Ca=0.99, Al=1, Si=1.33, BN=0.0011, N=3.444, Eu0.010
Example 18: Ca=0.74, Al=1, Si=0.75, BN=0.0025, N=2.5, Eu0.008
Example 19: Ca=0.66, Al=1, Si=1.67, BN=0.0033, N=3.667, Eu0.007
Example 20: Ca=1.32, Al=1, Si=1.00, BN=0.0033, N=3.667, Eu0.013
Example 21: Ca=0.40, Al=1, Si=0.40, BN=0.0020, N=1.8, Eu0.004
Example 22: Ca=0.54, Al=1, Si=0.27, BN=0.0009, N=1.727, Eu0.005
Example 23: Ca=0.23, Al=1, Si=2.88, BN=0.0013, N=5, Eu0.023
Example 24: Ca=0.43, Al=1, Si=2.16, BN=0.0026, N=4.163, Eu0.047
Example 25: Ca=0.43, Al=1, Si=2.16, BN=0.0026, N=4.163, Eu0.047
Example 26: Ca=0.36, Al=1, Si=2.60, BN=0.0020, N=4.8, Eu0.040
Example 27: Ca=0.45, Al=1, Si=3.50, BN=0.0050, N=6, Eu0.050
Example 28: Ca=0.30, Al=1, Si=5.33, BN=0.0033, N=8.333, Eu0.033
Example 29: Ca=0.60, Al=1, Si=5.00, BN=0.0033, N=8.1, Eu0.067

As shown in FIG. 24, element composition ratio adjustment can provide light emission with various color tone types. Therefore, the phosphors are applicable to various applications. In the foregoing examples, the phosphors according to the examples 12, 17 to 18, and 20 to 22 emit red light. The phosphors according to the examples 13 and 19 emit orange light. The phosphors according to the examples 14 to 16, and 23 to 29 emit amber light. The above result shows that increasing Al and Si mole concentration can provide high light emission luminance. In particular, as shown in the examples 23 to 24, increasing Eu concentration remarkably improves light emission luminance. FIG. 25 shows the light emission spectrums of the phosphor according to the examples 20 and 24. FIG. 26 shows the excitation spectrums of the phosphor according to the examples 20 and 24. FIG. 27 shows the reflection spectrums of the phosphor according to the examples 20 and 24. In FIGS. 25 to 27, heavy lines show the spectrums of the example 20. Thin lines show the spectrums of the example 24.

<Light Emitting Device 1>

The following description will describe a reddish white light emitting device as a light emitting device that uses a phosphor according to the present invention with reference to FIG. 1. FIG. 28 shows the light emission spectrums of the phosphor according to the example of the present invention, and a YAG group phosphor. FIG. 29 shows the light emission spectrum of a white light source that uses the phosphor according to the example of the present invention.

The light emitting chip 1 of the light emitting device has the semiconductor layer 2 that is formed on the sapphire substrate 1. The semiconductor layer 2 includes n-type and p-type GaN layers. The electrodes 3 are disposed on the n-type and p-type semiconductor layers 2. The electrodes 3 are electrically connected to the lead frames 13 by the conductive wire lines 14. The phosphor 11 and the coating member 12 cover the upper part of the light emitting chip 10. The molding member 15 covers the peripheries of the lead frames 13, the phosphor 11, the coating member 12, and so on. The semiconductor layer 2 includes $n^+$GaN:Si, $n^-$AlGaN:Si, $n^-$GaN, GaInN QWs, $p^-$GaN$^-$Mg, $p^-$AlGaNMg, and $p^-$GaN:Mg that are successively laminated on the sapphire substrate 1. A part of the $n^+$GaN:Si layer is etched. An n-type electrode is formed on the etched part. A p-type electrode is formed on the $p^-$GaN:Mg layer. Copper containing iron is used as the lead frames 13. A cup is disposed in the upper part of the mount lead 13a to mount the light emitting chip 10. The light emitting chip 10 is die-bonded on a substantially middle part of the bottom of the cup. Gold is used as the conductive wire lines 14. Ni is preferably plated on the bumps 4 to electrically connect the electrodes 3 to the conductive wire lines 14. In the phosphor 11, the phosphor according to the example and YAG group phosphor are mixed. In the coating member 12, an epoxy resin, a diffusion agent, barium titanate, titanium oxide, and the phosphor 11 are mixed at a predetermined ratio. An epoxy resin is used as the molding resin 15. The light emitting device 1 has a bullet shape. The molding member 15 has a diameter of 2 to 4 mm, and a height of about 7 to 10 mm. The molding member 15 has a cylindrical shape. The upper part of molding member 15 has a hemisphere shape.

When current is applied to the light emitting device 1, the blue light emitting chip 10 that has a first light emission spectrum with a light emission peak of about 450 nm emits light. The nitride phosphor in the phosphor 11 that covers the semiconductor layer 2 absorbs this first light emission spectrum, and converts color tone to emit light with a second light emission spectrum different from the first light emission spectrum. The YAG group phosphor that is included in the phosphor 11 absorbs the first light emission spectrum, and is excited by this first light emission spectrum to emit light with a third light emission spectrum. The first, second, and third light emission spectrums are mixed with each other to emit white light.

The phosphor 11 of the light emitting device 1 includes the phosphor according to the example of the present invention, and the YAG group phosphor that is a yttrium gadolinium aluminum oxide phosphor activated by cerium. A solid line in FIG. 28 shows the light emission spectrum of the phosphor according to the example of the present invention, and a dashed line in this figure shows the light emission spectrum of the YAG group phosphor. This figure shows that the phosphor according to the example of the present invention has a high reddish light emission spectrum. Accordingly, in the case where the phosphor according to the example of the present invention is used in combination with the YAG group phosphor, it is possible to provide a white light source that is not lacking in red range light, that is, has an excellent color rendering.

Table 6 shows the light emission characteristics of the white light emitting device according to the present invention. FIG. 29 shows the light emission spectrum.

TABLE 6

| | Applied Cur. cur [mA] | Voltage vol [V] | Luminous Flux $\Phi v$ [mlm] | Light Emission Eff. lm/W | Chromaticity | | Peak Wave- Length $\lambda p$ (nm) | Color Temp. Tcp [K] | General Color Rendering Index Ra |
|---|---|---|---|---|---|---|---|---|---|
| | | | | | x | y | | | |
| Ex. 1 | 150 | 3.532 | 12237 | 23.1 | 0.460 | 0.415 | 631.6 | 2735 | 91.9 |

As discussed above, the white light emitting device 1 according to the example uses a light emitting chip with a light emission peak of 450 nm, the YAG group phosphor, and the nitride phosphor. $(Y,Gd)_3Al_5O_{12}$:Ce is used as the YAG group phosphor. $Ca_{0.990}AlSiB_{0.005}N_{3.005}$:0.01Eu in the example 1 is used as the nitride phosphor. When a rated current of 150 mA is applied to this white light emitting device 1, the white light emitting device 1 emits light in a white range of chromaticity values of x=0.460 and y=0.415, at color temperature of 2735 K. In this case, its general color rendering index Ra is 91.9. This value is very excellent. Therefore, it is possible to provide a light emitting device that has an excellent color rendering, and high light emission luminance. In addition, it is possible to provide a light emitting device that has long life.

<Light Emitting Device 2>

The phosphors according to the present invention can be used in the light emitting device 2 shown in FIG. 2. The light emitting device shown in this Figure is a surface mount type light emitting device. A blue light excitation light emitting chip is used as the light emitting chip 101 that is used in this light emitting device 2, however, the light emitting device 2 is not limited to this. An ultraviolet light excitation light emitting chip with wavelength of 380 to 400 nm can be also used.

The light emitting chip 101 includes an InGaN group semiconductor layer with peak wavelength of 460 nm in the blue range as a light emitting layer. The light emitting chip 101 is provided with p-type and n-type semiconductor layers (not shown) formed therein. The conductive wire lines 104 are formed on the p-type and n-type semiconductor layers for connection to the lead terminals 102. The insulating sealing members 103 are formed to surround the peripheral surfaces of the lead terminals 103 for prevention of a short circuit. The transparent window 107 is disposed above the light emitting chip 101 to extend from the lid 106 that is located in the upper part of the package 105. A uniform mixture of the phosphor 108 according to the present invention and the coating member 109 is applied on substantially the whole interior surface of the transparent window 107. The phosphor according to the example 1 is used in the light emitting device 1. The package 105 has a square shape of 8 to 12 mm with rounded corners.

The phosphor 108 according to this example of the present invention is subjected to indirect light that is reflected on the reflector plate, and direct light that directly travels from the light emitting chip 101, as blue light emission of the light emitting chip 101. The phosphor is excited by the blue light emission, and thus emits yellow and red light. The yellow and red light from the phosphor, and blue light from the light emitting chip are emitted outwardly. The mixed yellow, red and blue light can provide a white light source.

<Light Emitting Device 3>

FIG. 30 shows a cap-type light emitting device 3 that is provided with the phosphor according to this example of the present invention.

Components same as those of the light emitting device 1 are attached with the same reference numerals and their description is omitted.

The light emitting device 3 is constructed to cover the surface of the molding member 15 of the light emitting device 1 with a cap 16 that is composed of transparent resin with a phosphor (not shown) dispersed therein. In the cap 16, the phosphor is uniformly dispersed in the transparent resin. The transparent resin that includes the phosphor is formed in a shape that fits over the shape of the molding member 15 of the light emitting device 1. Alternatively, the light emitting device 3 can be produced by placing the light emitting device 1 into a predetermined mold after the transparent resin that includes the phosphor is placed in this mold. Specifically, transparent resin with excellent temperature characteristics and weather resistance such as epoxy resin, urea resin and silicone resin, silica sol, glass, inorganic binder, and so on can be used as a material of the transparent resin of the cap 16. In addition to the above materials, thermosetting resin such as melamine resin and phenol resin also can be used. Additionally, thermoplastic resin, such as polyethylene, polypropylene, polyvinyl chloride and polystyrene, and thermoplastic rubber such as styrene-butadiene block copolymer and segmented polyurethane also can be used. Furthermore, the transparent resin may include a diffusion agent, barium titanate, titanium oxide, aluminum oxide, and so on together with the phosphor. In addition, the transparent resin may include a light stabilizing agent, and a coloring agent.

The phosphor according to the example of the present invention, or the phosphor according to the example and the YAG group phosphor are used as the phosphor that is mixed in the cap 16, and the phosphor 11 that is mixed in the cup of the mount lead 13a. The phosphor according to the example of the present invention, and the YAG group phosphor can be mixed in the cap, and the cup, respectively. Also, the YAG group phosphor, and the phosphor according to the example of the present invention and can be mixed in the cap, and the cup, respectively. The phosphor according to the example of the present invention, and the YAG group phosphor can be mixed in the cap, and no phosphor can be mixed the cup. Also, no phosphor can be mixed in the cap, and the phosphor according to the present invention, and the YAG group phosphor can be mixed in the cup.

In the thus-constructed light emitting device, the phosphors in the cup and cap 16 are excited by a part of light emitted from the light emitting chip 10, and thus emits red light. In addition, the YAG phosphor is excited, and thus emits light. Additionally, the other part of blue light of the light emitting device outgoes without being absorbed by the phosphors. White light is provided by mixture of red light of the phosphor according to the example, light of the YAG phosphor, and blue light of the light emitting chip that outgo.

Examples 30 to 34, and Comparative Example 1

Light emitting devices according to examples 30 to 34 are now described. The construction of the aforementioned light emitting device 11 and the light emitting device shown in FIG. 2 is applied to the light emitting devices according to examples 30 to 34.

Table 7 shows phosphors that are used in light emitting devices according to the examples 30 to 34, and their composition ratios (mass ratios).

TABLE 7

| | Phosphor Mixture Ratio (Mass Ratio) | | | | | |
|---|---|---|---|---|---|---|
| | Comp. Ex. 1 | Ex. 30 | Ex. 31 | Ex. 32 | Ex. 33 | Ex. 34 |
| Resin | 3 | 3 | 3 | 3 | 3 | 3 |
| (Y, Gd)3Al5O12:Ce | 0.240 | 0 | 0 | 0 | 0 | 0 |

TABLE 7-continued

| | Phosphor Mixture Ratio (Mass Ratio) | | | | | |
|---|---|---|---|---|---|---|
| | Comp. Ex. 1 | Ex. 30 | Ex. 31 | Ex. 32 | Ex. 33 | Ex. 34 |
| Sr4Al4O25:Eu | 0 | 0.528 | 0.594 | 0 | 0 | 0.202 |
| BaSi2O2N2:Eu | 0 | 0 | 0 | 0.211 | 0.259 | |
| Y3(Al, Ga)5O12:Ce | 0 | 0.311 | 0 | 0.333 | 0 | 0.420 |
| Lu3Al5O12:Ce | 0 | 0 | 0.360 | 0 | 0.421 | 0 |
| CaAlSiN3:Eu | 0 | 0.121 | 0.126 | 0.116 | 0.130 | 0.163 |
| Ca10(PO4)6Cl2 | 0 | 0 | 0 | 0 | 0 | 1.615 |
| LED Peak Wavelength (nm) | 450 | 450 | 450 | 450 | 450 | 410 |

In the light emitting device according to the example 30, the light emitting chip 101 is used which emits light with a main light emission peak of about 450 nm. $Sr_4Al_{14}O_{25}$:Eu, $Y_3$(Al, Ga)$_5O_{12}$:Ce, and CaAlSiN$_3$:Eu are used as the phosphor 108. A silicone resin is used as the coating member. The phosphor substance 108 is mixed with a predetermined amount of coating member, and then is dropped onto a recessed portion of the middle of the base. Subsequently, the coating member is cured, thus, a surface mount type light emitting device is provided. In the example 30, the base 105 is made of ceramic. Since, in the case where a silicone resin is used as the coating member, excellent reliability is obtained, lid sealing is not used. In this case, it is possible to provide an inexpensive light emitting device.

In the light emitting device according to the example 31, the light emitting chip 101 is used which emits light with a main light emission peak of about 450 nm. $Sr_4Al_{14}O_{25}$:Eu, Lu$_3$Al, Ga)$_5O_{12}$:Ce, and CaAlSiN$_3$:Eu are used as the phosphor 108. Coating member, and other members are similar to the example 30.

In the light emitting device according to the example 32, the light emitting chip 101 is used which emits light with a main light emission peak of about 450 nm. BaSi$_2$O$_2$N$_2$:Eu, Y$_3$(Al, Ga)$_5$O$_{12}$:Ce, and CaAlSiN$_3$:Eu are used as the phosphor 108. Coating member, and other members are similar to the example 30.

In the light emitting device according to the example 33, the light emitting chip 101 is used which emits light with a main light emission peak of about 450 nm. BaSi$_2$O$_2$N$_2$:Eu, Lu$_3$Al$_5$O$_{12}$:Ce, and CaAlSiN$_3$:Eu are used as the phosphor 108. Coating member, and other members are similar to the example 30.

In the light emitting device according to the example 34, the light emitting chip 101 is used which emits light with a main light emission peak of about 410 nm. $Sr_4Al_{14}O_{25}$:Eu, Y$_3$(Al, Ga)$_5$O$_{12}$:Ce, CaAlSiN$_3$:Eu, and Ca$_{10}$(PO$_4$)$_6$Cl$_2$:Eu are used as the phosphor 108. Coating member, and other members are similar to the example 30. The phosphor of Y$_3$(Al, Ga)$_5$O$_{12}$:Ce is hardly excited by light with a main light emission peak 410 nm. For this reason, light with a main light emission peak 410 nm excites the phosphor of Ca$_{10}$(PO$_4$)$_6$Cl$_2$:Eu to emit blue light. This blue light excites the phosphor of Y$_3$(Al, Ga)$_5$O$_{12}$:Ce.

In the light emitting device according to a comparative example 1, the light emitting chip 101 is used which emits light with a main light emission peak of about 450 nm. Only (Y,Gd)$_3$Al$_5$O$_{12}$:Ce is used as the phosphor substance 108. Coating member, and other members are similar to the example 30.

Table 8 shows color tones, color temperature values and color rendering indices of the light emitting devices according to the foregoing examples 30 to 34, and the comparative example 1 when a predetermined amount of current is applied.

TABLE 8

| | Comp. Ex. 1 | Ex. 30 | Ex. 31 | Ex. 32 | Ex. 33 | Ex. 34 |
|---|---|---|---|---|---|---|
| Chromaticity x | 0.343 | 0.342 | 0.338 | 0.343 | 0.343 | 0.343 |
| Chromaticity y | 0.343 | 0.337 | 0.336 | 0.335 | 0.337 | 0.348 |
| Correlated Color temperature | 5069 | 5083 | 5238 | 5045 | 5047 | 5079 |
| chromaticity deviation (Duv) | −0.004 | −0.006 | −0.005 | −0.008 | −0.006 | −0.001 |
| Ra | 72.8 | 92.6 | 90.7 | 89.4 | 86.5 | 80.7 |
| R1 | 72.7 | 89.2 | 86.7 | 86.1 | 83.0 | 78.2 |
| R2 | 77.1 | 92.7 | 92.0 | 89.0 | 86.5 | 81.6 |
| R3 | 75.9 | 98.4 | 97.9 | 94.9 | 92.6 | 86.1 |
| R4 | 73.8 | 93.2 | 89.9 | 89.7 | 86.9 | 81.4 |
| R5 | 71.8 | 90.5 | 88.5 | 86.5 | 83.5 | 79.1 |
| R6 | 65.3 | 90.3 | 90.2 | 85.6 | 82.9 | 76.3 |
| R7 | 81.4 | 96.3 | 95.8 | 95.3 | 93.3 | 86.3 |
| R8 | 64.6 | 89.9 | 84.3 | 88.3 | 83.1 | 76.9 |
| R9 | −6.2 | 71.0 | 56.3 | 64.4 | 50.7 | 36.7 |
| R10 | 41.3 | 87.4 | 84.8 | 76.8 | 70.1 | 58.2 |
| R11 | 68.2 | 90.5 | 86.3 | 85.4 | 82.6 | 79.3 |
| R12 | 38.5 | 75.4 | 78.6 | 77.9 | 75.7 | 68.2 |

TABLE 8-continued

|  | Comp. Ex. 1 | Ex. 30 | Ex. 31 | Ex. 32 | Ex. 33 | Ex. 34 |
| --- | --- | --- | --- | --- | --- | --- |
| R13 | 72.6 | 89.4 | 87.4 | 85.9 | 82.9 | 77.6 |
| R14 | 85.7 | 98.1 | 97.5 | 97.2 | 95.8 | 92.4 |
| R15 | 71.3 | 85.9 | 82.3 | 83.2 | 79.4 | 75.4 |
| Reference Light | D5069 | D5083 | D5238 | D5045 | D5047 | D5079 |

The color tone in the comparative example 1 can be adjusted in the chromaticity coordinates only along a line that connects the chromaticity of light from the light emitting chip 101 and the chromaticity of light from the YAG phosphor. Conversely, the color tones in the examples 30 to 33 can be adjusted in the chromaticity coordinates in a range that defined by light from the light emitting chip 101 and three kinds of phosphors essentially including $CaAlSiN_3$:Eu. The color temperature value in the comparative example 1 is about 5000 K. The color temperature value in the comparative example 1 corresponds to an intersection point between the line that connects the chromaticity of light from the light emitting chip 101 and the chromaticity of light from the YAG phosphor and the blackbody locus. For this reason, the color tones of light in the examples 30 to 34 are also adjusted at a correlated color temperature of about 5000 K. Chromaticity deviation from the black body locus is evaluated by a chromaticity deviation (Duv) value. The absolute chromaticity deviation value of light in the examples 30 to 34, and the comparative example 1 is not more than 0.008, and therefore substantially corresponds to chromaticity on the blackbody locus.

FIGS. 31 to 35 are diagrams showing the light emission spectrums of the light emitting devices according to the examples 30 to 34. FIG. 36 is a diagram showing the light emission spectrum of the light emitting device according to the comparative example 1.

Particularly, since $CaAlSiN_3$:Eu is essentially included, it is possible to provide a light emitting device that has high red range light emission luminance, and long life. In addition, in the example 34, since the light emitting chip 101 is used which emits very low luminosity light with a main light emission peak of about 410 nm, light of only four kinds of phosphors can adjust a color tone. For this reason, mixture ratio of these phosphors can substantially adjust a color tone. Therefore, the color tone of light from the light emitting device can be adjusted very easily.

CIE (international Commission on Illumination) recommends that lighting the color rendering index of which falls within the range of 80≦Ra≦90 is used in the space where industrial work that requires a high color rendering is conducted, such as in a print factory. In addition, CIE recommends lighting with a color rendering index of 90≦Ra in the space where work required for more precise coloration work is conducted, such as in color testing. As compared with the general color rendering index (Ra) 72.8 in the comparative example 1, the general color rendering indices (Ra) in the examples 30 to 34 are Ra≦80. The examples 30 to 34 can be used without problems in the space where industrial work that requires a high color rendering is conducted. In particular, the examples 30 and 31 have a very high color rendering indices Ra≦90. These light emitting devices have performance that can be used in working environment that requires the highest level light quality such as color adjustment. A special color rendering index (R9) shows a reddish component. In addition, as compared with the special color rendering index (R9) −6.2 in the comparative example 1, the special color rendering indices in the examples 30 to 34 are not less than 30, particularly, the special color rendering indices in the examples 30 to 33 are not less than 50. These examples provide a very high color rendering. Since the special color rendering indices (R9) of these light emitting devices are improved, human eyes recognize that the color of a red object when illuminated by these light emitting devices becomes closer to the color of the red object under natural light.

As for the light emission spectrum, in the comparative example, the light emission intensity in a range from 470 to 520 nm is lower than the light emission intensity in proximity to 450 or 570 nm. For this reason, conventional light emitting devices cannot be used as a light emitting device with an excellent color rendering. Conversely, the light emitting devices according to the examples 30 to 34 have high light emission intensities in a range from 470 to 520 nm, and broad light emission spectrum shapes that widely extend in a visible light range. Accordingly, these light emitting devices can be used as a light emitting device with an excellent color rendering.

<Light Emitting Device>

FIG. 30 is a schematic cross-sectional view showing a cap-type light emitting device.

A light emitting that has a main light emission peak wavelength of 365 nm in the ultraviolet light range is used as the light emitting chip 10.

The light emitting device is constructed to cover the surface of the molding member 15 with the cap 16 that is composed of transparent resin with a phosphor substance (not shown) dispersed therein.

A cup is disposed in the upper part of the first lead frame 13a to mount the light emitting chip 10. The light emitting chip 10 is die-bonded on a substantially middle part of the bottom of the cup. In the light emitting device 1, the phosphor substance 11 is disposed on the upper part of the cup to cover the light emitting chip 10. However, the phosphor substance 11 may not be disposed on the upper part of the cup. In the case where the phosphor substance 11 is not be disposed on the upper part of the light emitting chip 10, the phosphor substance 11 does not have a direct influence of heat that is generated from the light emitting chip 10.

In the cap 16, the phosphor substance is uniformly dispersed in the transparent resin. The transparent resin that includes the phosphor substance is formed in a shape that fits over the shape of the molding member 15 of the light emitting device 1. Alternatively, this light emitting device can be produced by placing the light emitting device 1 into a predetermined mold after the transparent resin that includes the phosphor substance is placed in this mold. Specifically, transparent resin with excellent temperature characteristics and weather resistance such as epoxy resin, urea resin and silicone resin, silica sol, glass, inorganic binder, and so on can be used as a material of the transparent resin of the cap 16. In addition to the above materials, thermosetting resin such as melamine resin and phenol resin also can be used. Additionally, thermoplastic resin, such as polyethylene, polypropylene, polyvinyl chloride and polystyrene, and thermoplastic rubber such as styrene-butadiene block copolymer and segmented polyurethane also can be used. The transparent resin may include a diffusion agent, barium titanate, titanium oxide, aluminum oxide, and so on together with the phosphor substance. In addition, the transparent resin may include a light stabilizing agent, and a coloring agent. Phosphors of $Ca_{10}(PO_4)_6Cl_2$:Eu, $Sr_4Al_{14}O_{25}$:Eu, $BaSi_2O_2N_2$:Eu, $(Y,Gd)_3Al_5O_{12}$:Ce, $Y_3(Al, Ga)_5O_{12}$:Ce, $(Sr, Ca)_2Si_5N_8$:Eu, and $CaAlSiN_3$:Eu, $CaAlSiB_xN_{3+x}$:Eu, and so on can be used as the phosphor substance that is used in the cap 16. The phosphor substance that is used in the cup of the first lead frame 13*a* can be $Ca_{10}(PO_4)_6Cl_2$:Eu, and so on. However, since the phosphor substance is used in the cap 16, In the case where $Ca_{10}(PO_4)_6Cl_2$:Eu, and so on is included in the cap, only the coating member 12 may be disposed in the cup of the first lead frame 13*a*.

In the thus-constructed light emitting device, light that is emitted from the light emitting chip 10 excites the phosphor substances 11 of $Ca_{10}(PO_4)_6Cl_2$:Eu, $BaSi_2O_2N_2$:Eu, $(Y_{0.8}Gd_{0.2})_3Al_5O_{12}$:Ce, $(Sr, Ca)_2Si_5N_8$:Eu, $CaAlSiN_3$:Eu, and $CaAlSiB_{0.005}N_{3.005}$:Eu. $(Y_{0.8}Gd_{0.2})_3Al_5O_{12}$:Ce is excited by blue light that is emitted by $Ca_{10}(PO_4)_6Cl_2$:Eu. Thus, mixture light of the phosphor substances 11 can provide white range light that outgoes through the surface of the cap 16.

INDUSTRIAL APPLICABILITY

In a nitride phosphor, a method for producing the nitride phosphor and a light emitting device that uses the nitride phosphor according to the present invention, the nitride phosphor is used together with other phosphor, and thus can provide a high color rendering white light source. In addition, the light emitting device can be applied to light emitting devices such as general lighting of phosphor lamp, etc., lighting for signals or automobiles, a LCD backlight, and display, particularly to white range light and multi-color light emitting devices that use semiconductor light emitting chips.

BRIEF DESCRIPTION OF THE DRAWINGS

FIG. 24 is a list table showing the characteristics of phosphors according to examples 12 to 24 of the present invention;

EXPLANATION OF REFERENCE LETTERS OR NUMERALS

Figure 1:
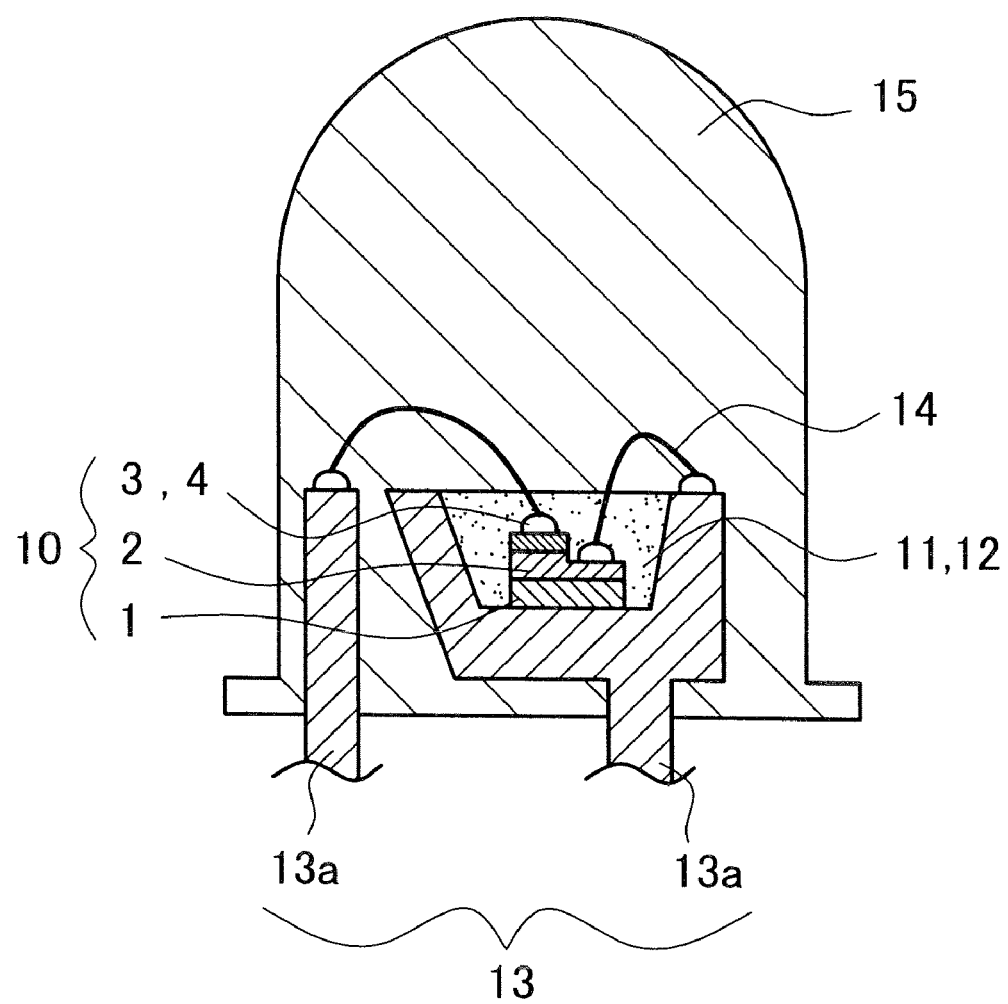
FIG. 1 is a cross-sectional view showing a white light source that uses a phosphor according to an embodiment of the present invention.
Figure 2:
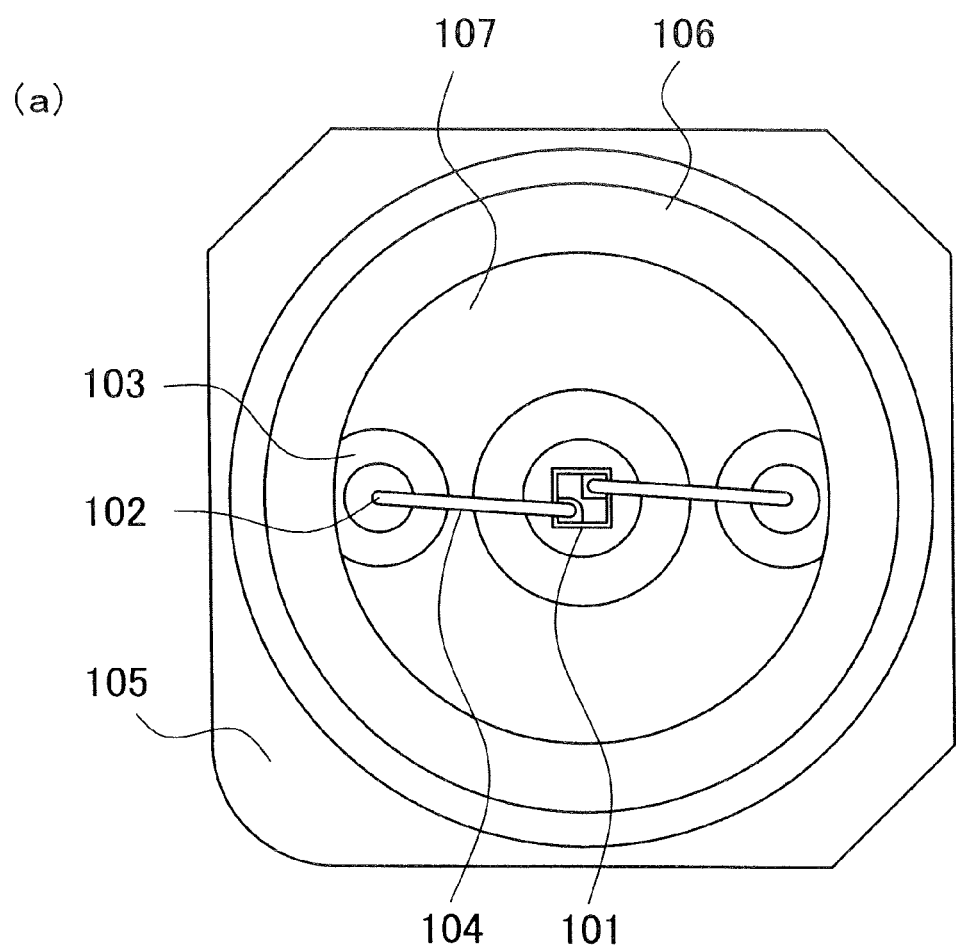
FIG. 2 shows a schematic plan view (a) and a schematic cross-sectional view (b) showing a white light source (surface mount type light emitting device) of another structure that uses a phosphor according to an embodiment of the present invention.
Figure 2:
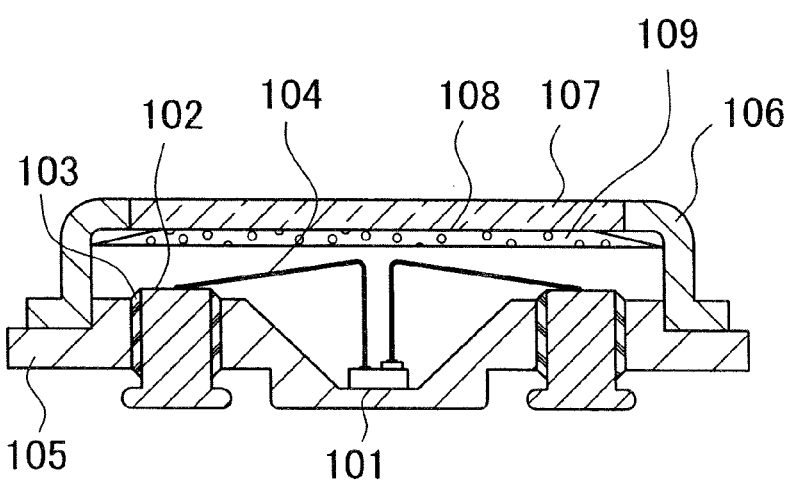
Figure 3:
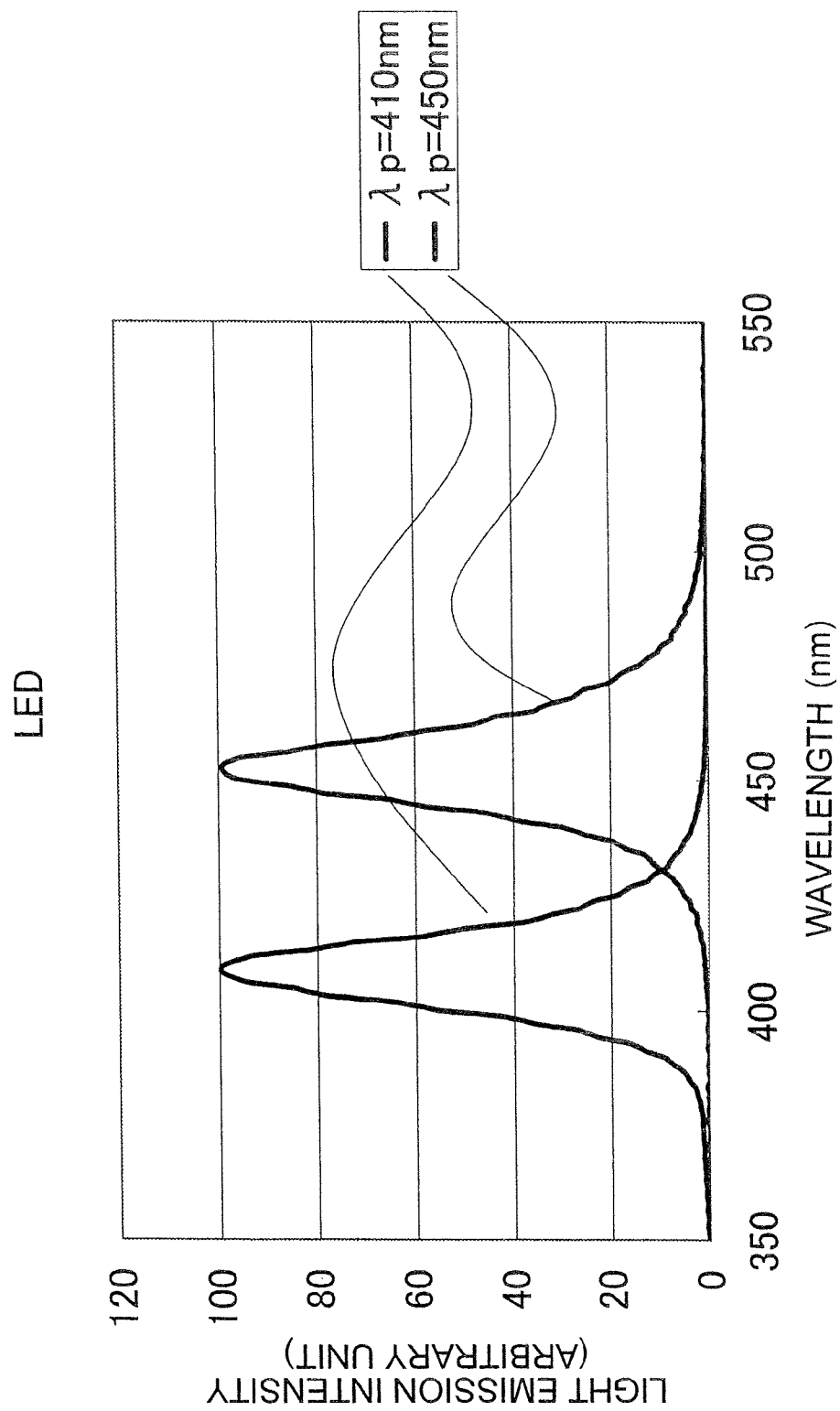
FIG. 3 is a graph showing the light emission spectrums of light emitting chips.
Figure 4:
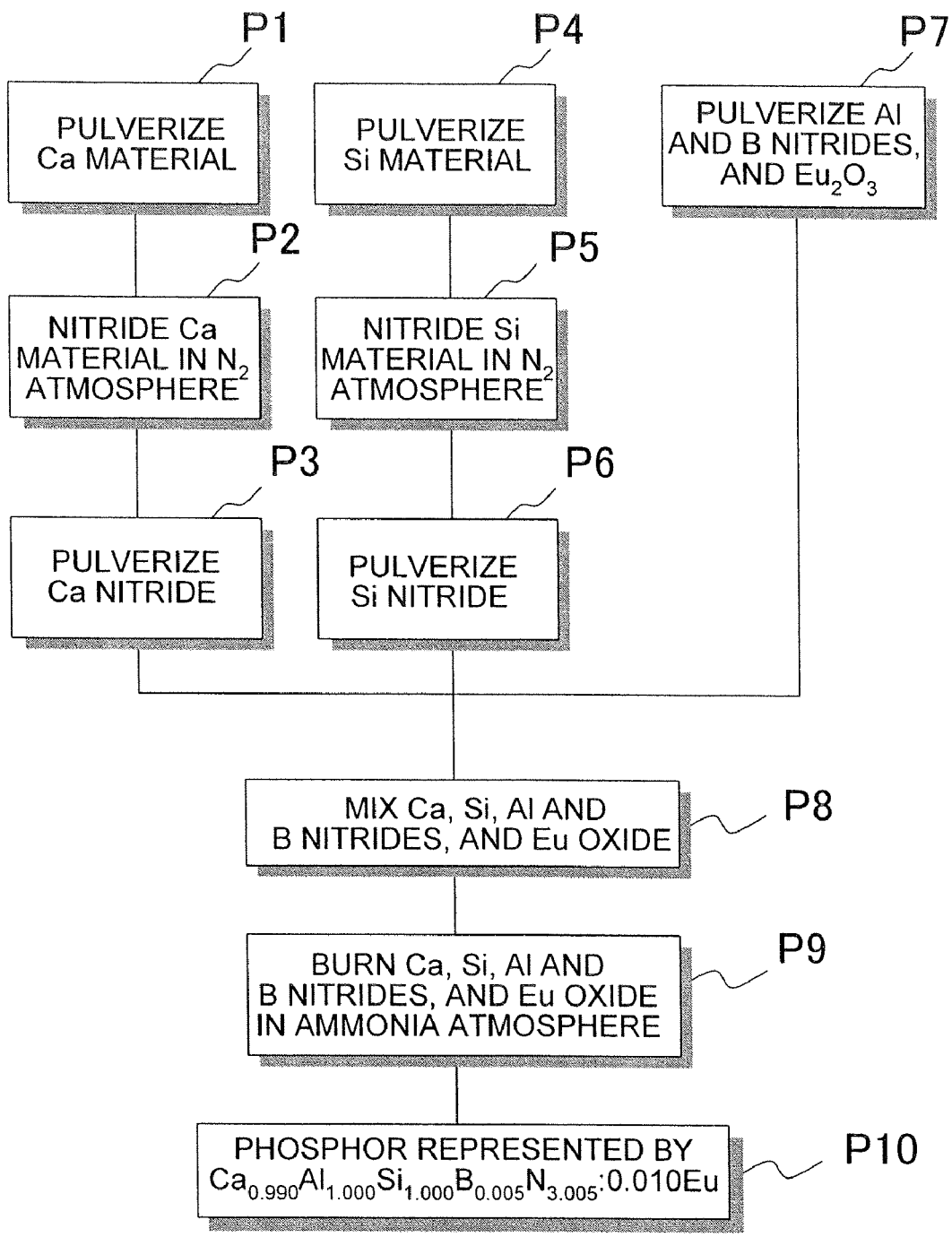
FIG. 4 is a block diagram showing production method of a phosphor according to the present invention.
Figure 5:
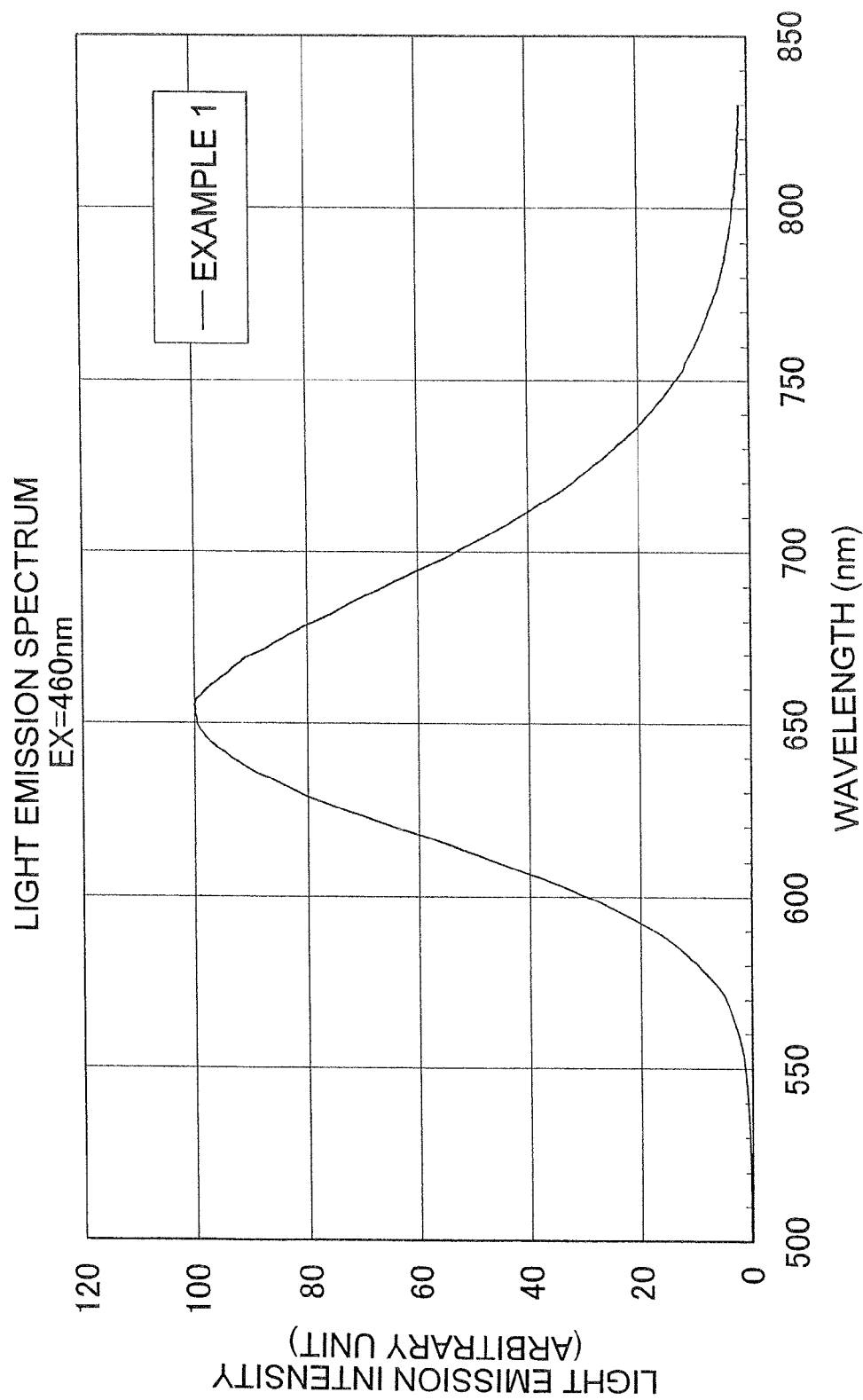
FIG. 5 is a graph showing the normalized light emission spectrum of a nitride phosphor of ($CaAlSiB_xN_{3+x}$:Eu)
Figure 6:
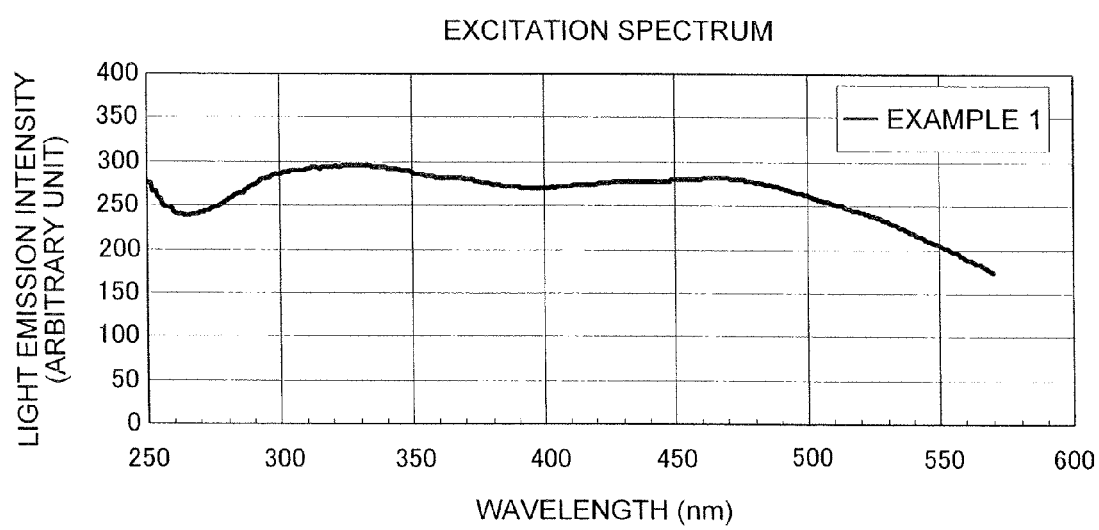
FIG. 6 is a graph showing the normalized excitation spectrum of a nitride phosphor of ($CaAlSiB_xN_{3+x}$:Eu)
Figure 7:
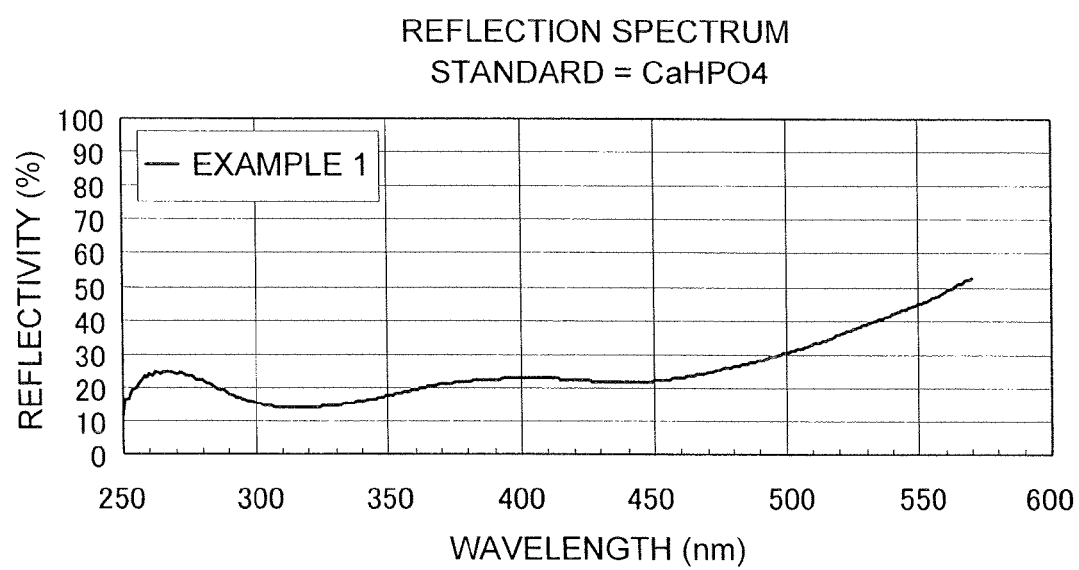
FIG. 7 is a graph showing the reflection spectrum of a nitride phosphor of ($CaAlSiB_xN_{3+x}$:Eu)
Figure 8:
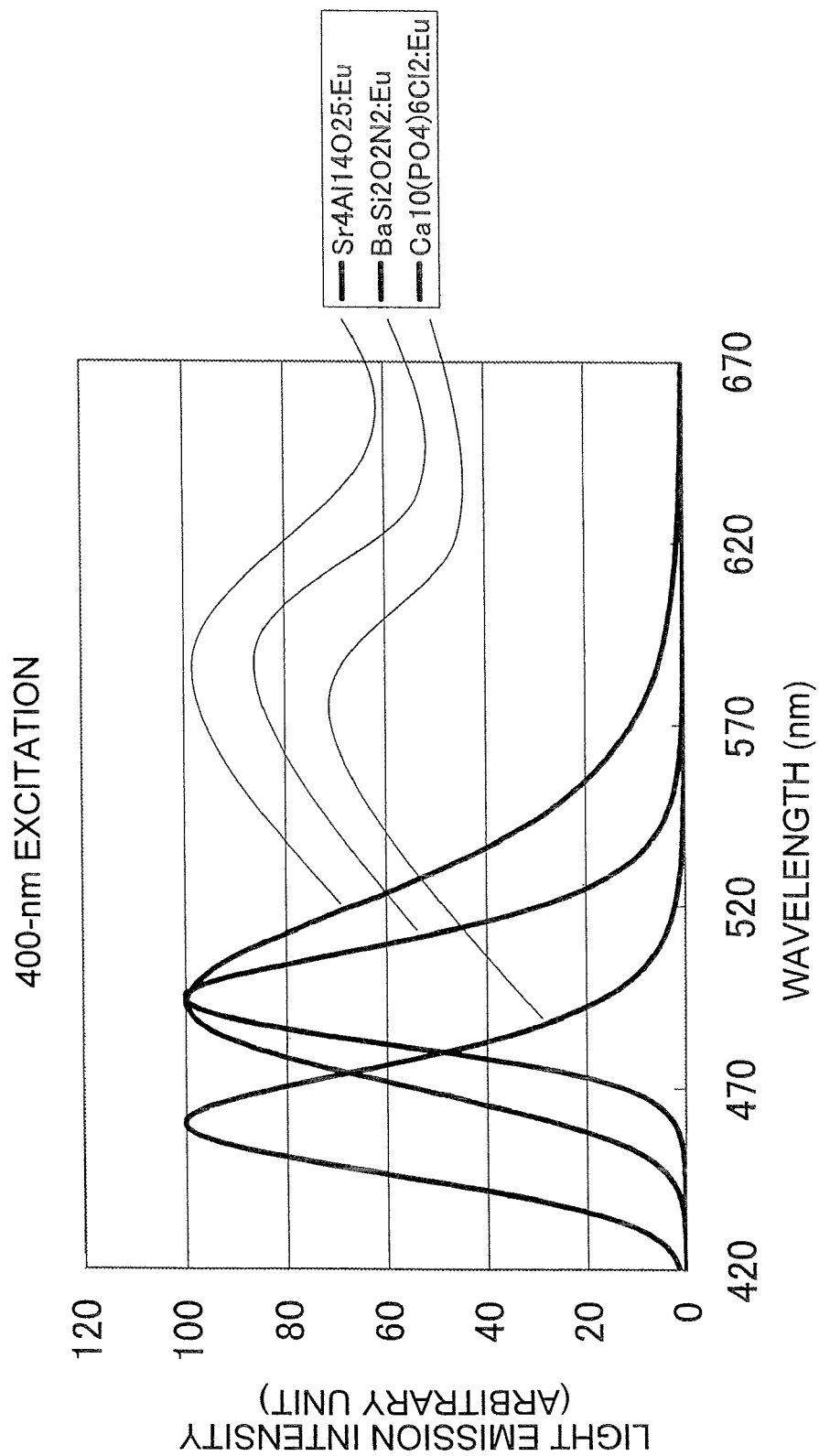
FIG. 8 is a graph showing s a view showing the light emission spectrums of various types of phosphor substances in the case where the phosphors are excited by a 400-nm excitation light source.
Figure 9:
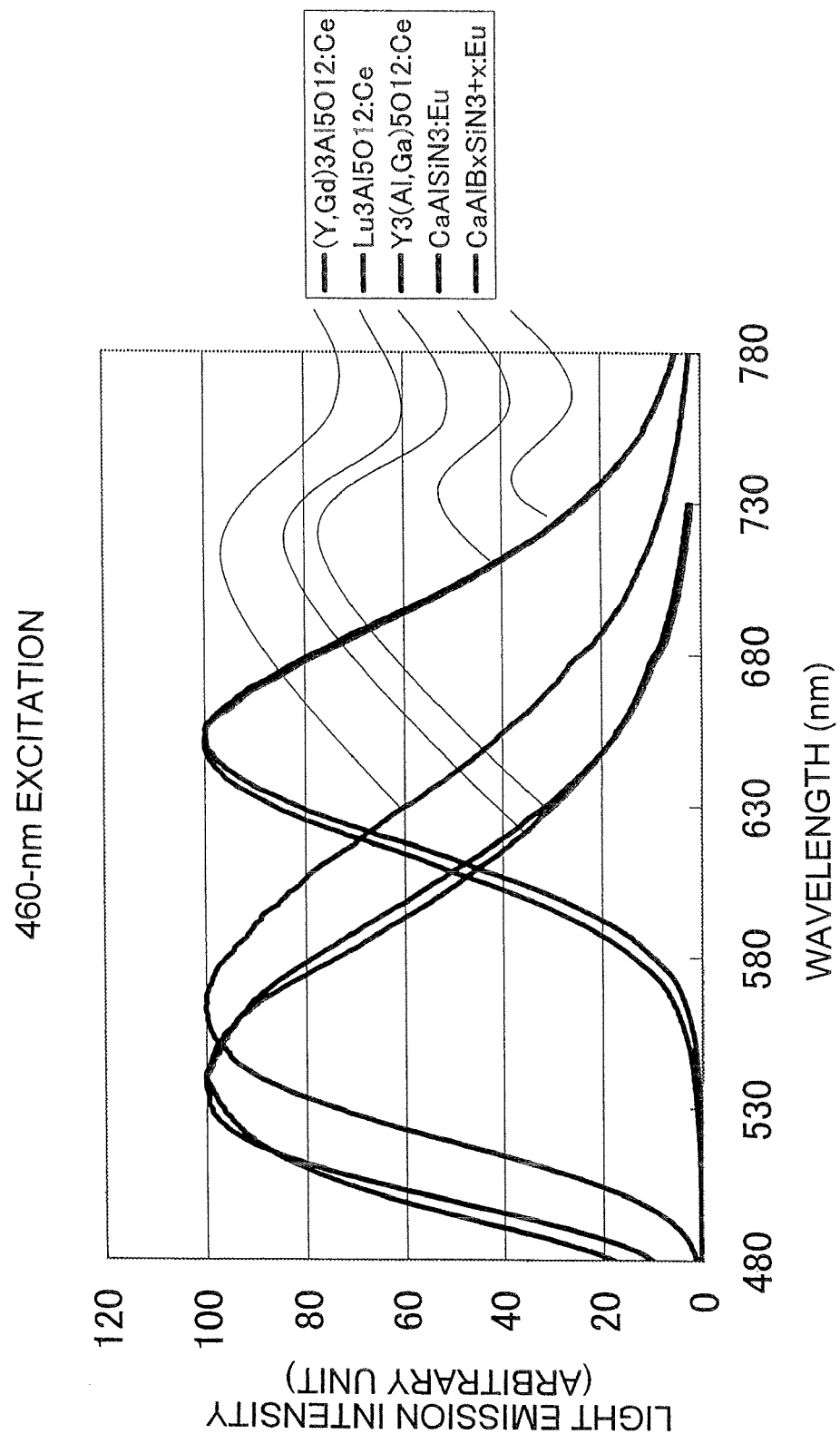
FIG. 9 is a graph showing s a view showing the light emission spectrums of various types of phosphor substances in the case where the phosphor substances are excited by a 460-nm excitation light source.
Figure 10:
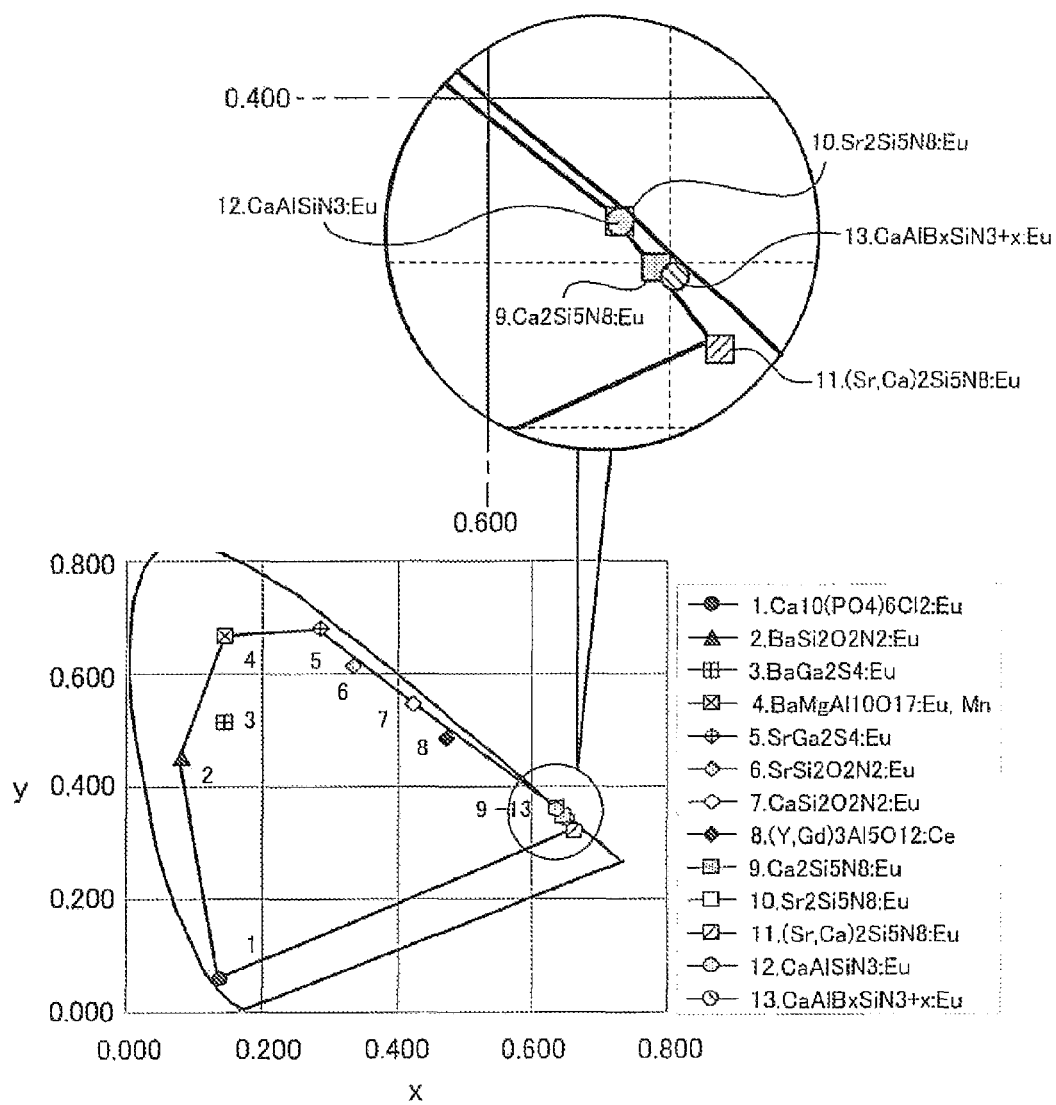
FIG. 10 is a CIE1931 chromaticity diagram showing a color tone range that can be provided in the case where an excitation light source that emits ultraviolet rays is used.
Figure 11:
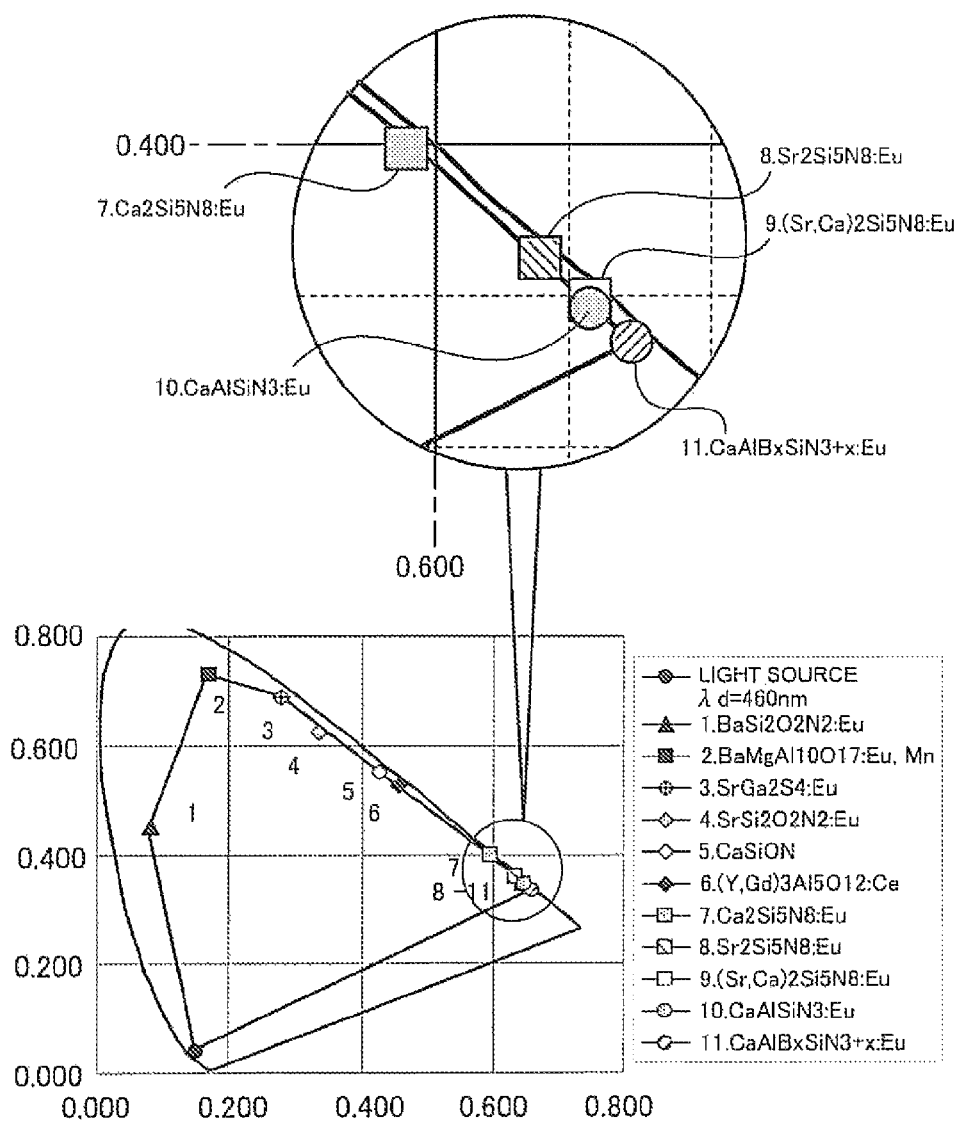
FIG. 11 is a CIE1931 chromaticity diagram showing a color tone range that can be provided in the case where an excitation light source that emits blue range light is used.
Figure 12:
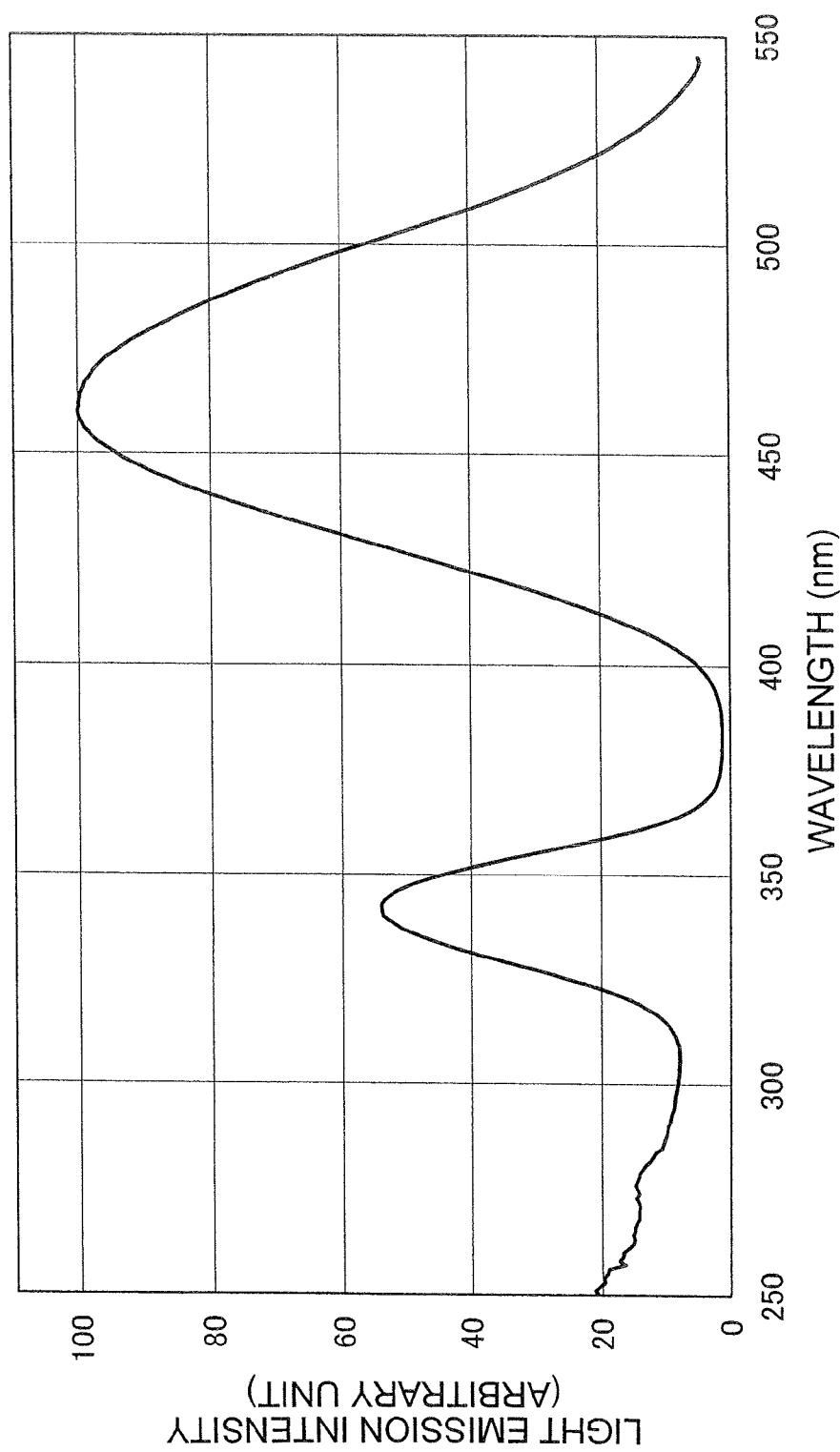
FIG. 12 is a graph showing the normalized excitation spectrum of a YAG group phosphor.
Figure 13:
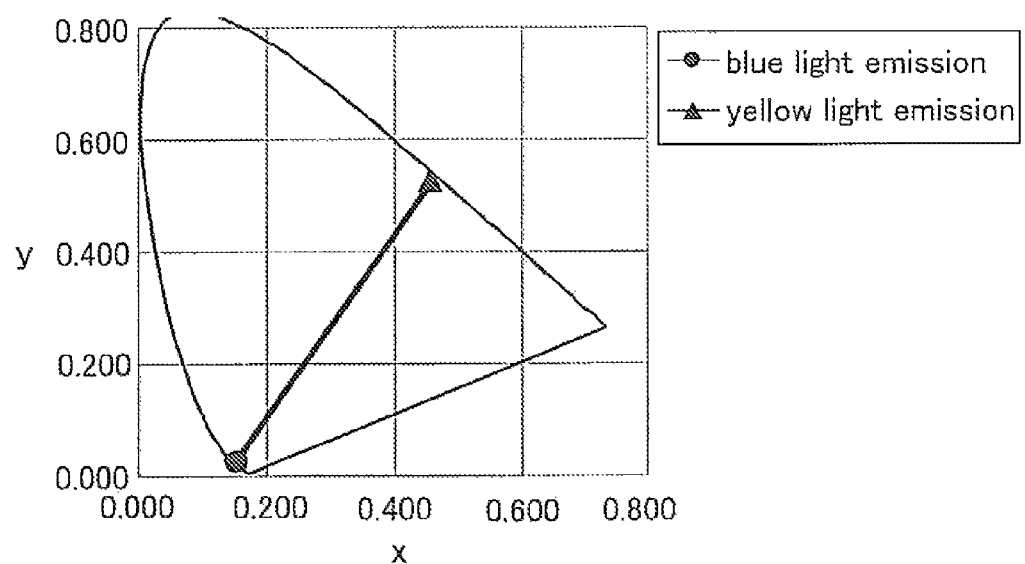
FIG. 13 is a CIE chromaticity diagram showing the chromaticity range that can be provided by a conventional light emitting device.
Figure 14:
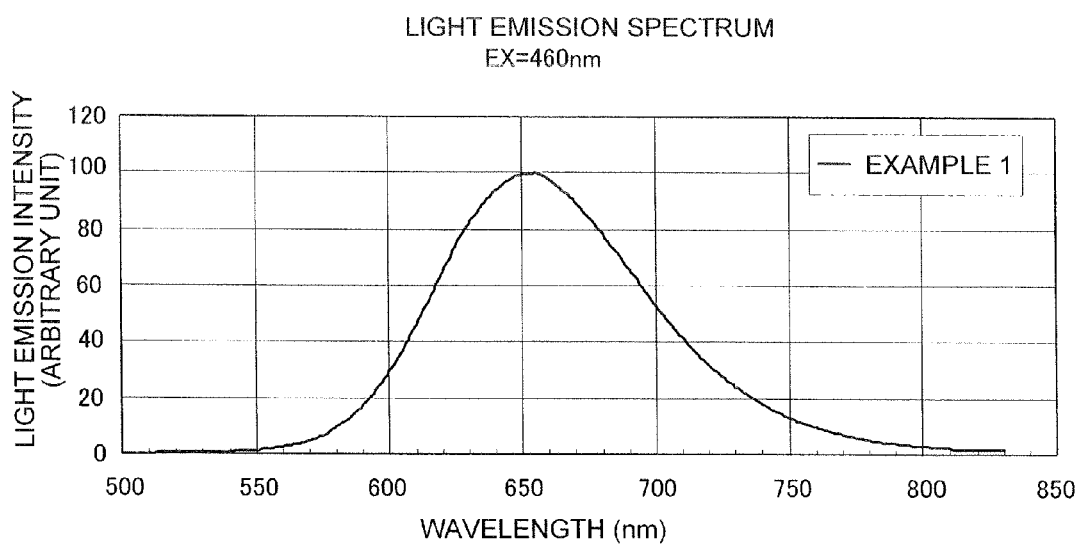
FIG. 14 is a graph showing the light emission spectrum of a phosphor according to an example 1 of the present invention.
Figure 15:
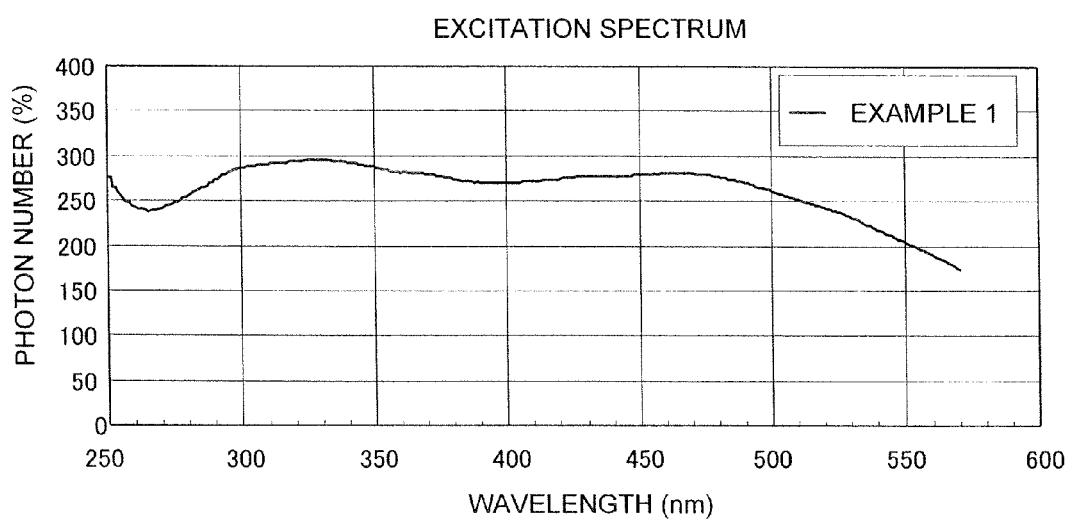
FIG. 15 is a graph showing the excitation spectrum of the phosphor according to the example 1 of the present invention.
Figure 16:
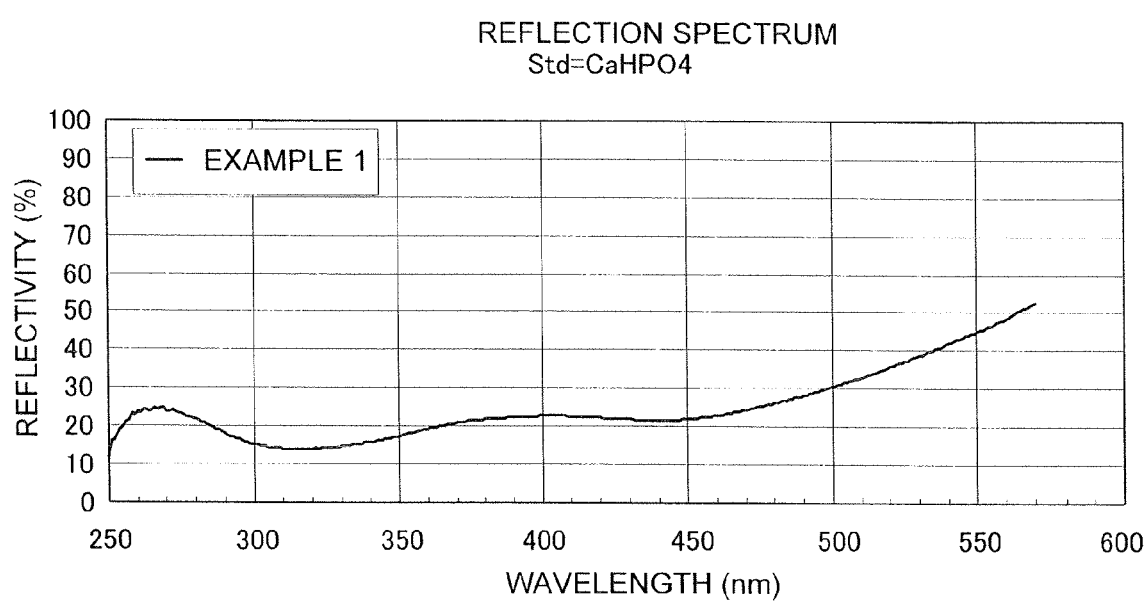
FIG. 16 is a graph showing the reflection spectrum of the phosphor according to the example 1 of the present invention.
Figure 17:
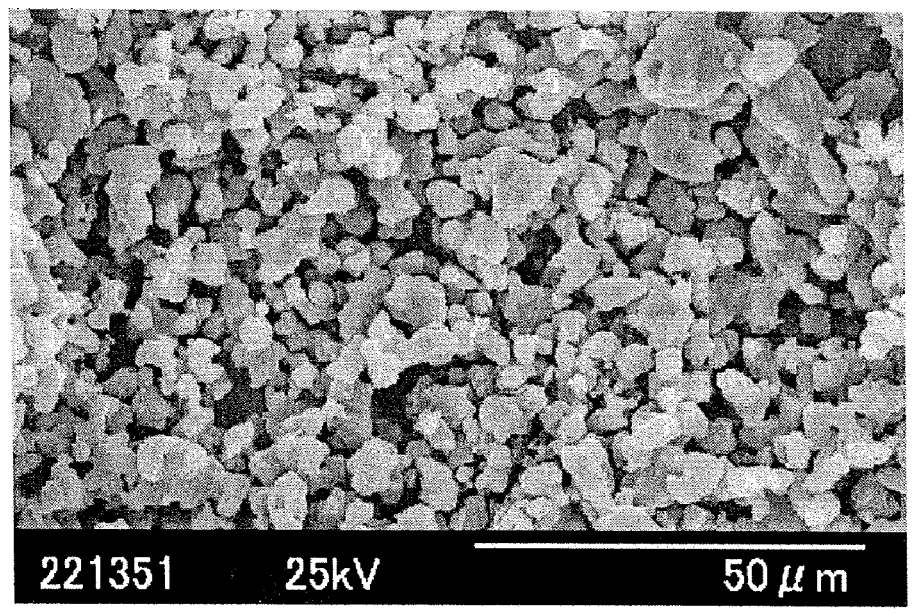
FIG. 17 is an electron microscope photograph showing the phosphor according to the example 1 of the present invention.
Figure 17:
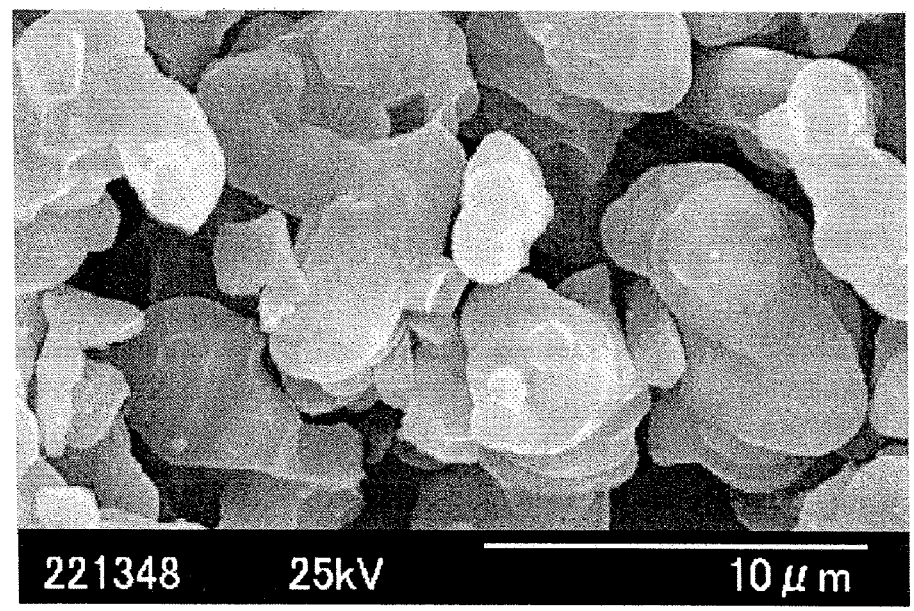
Figure 18:
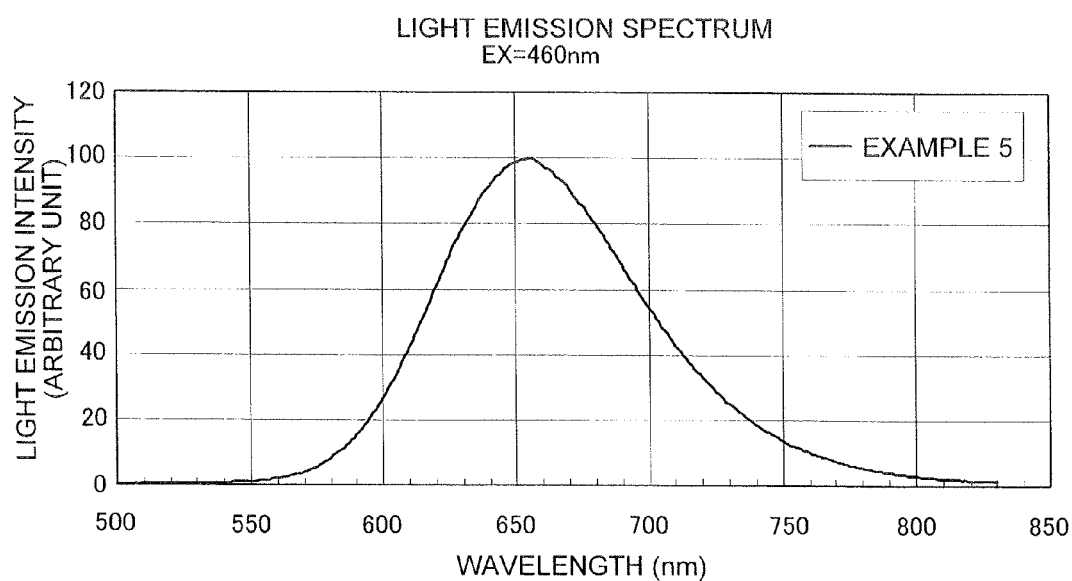
FIG. 18 is a graph showing the light emission spectrum of a phosphor according to an example 5 of the present invention.
Figure 19:
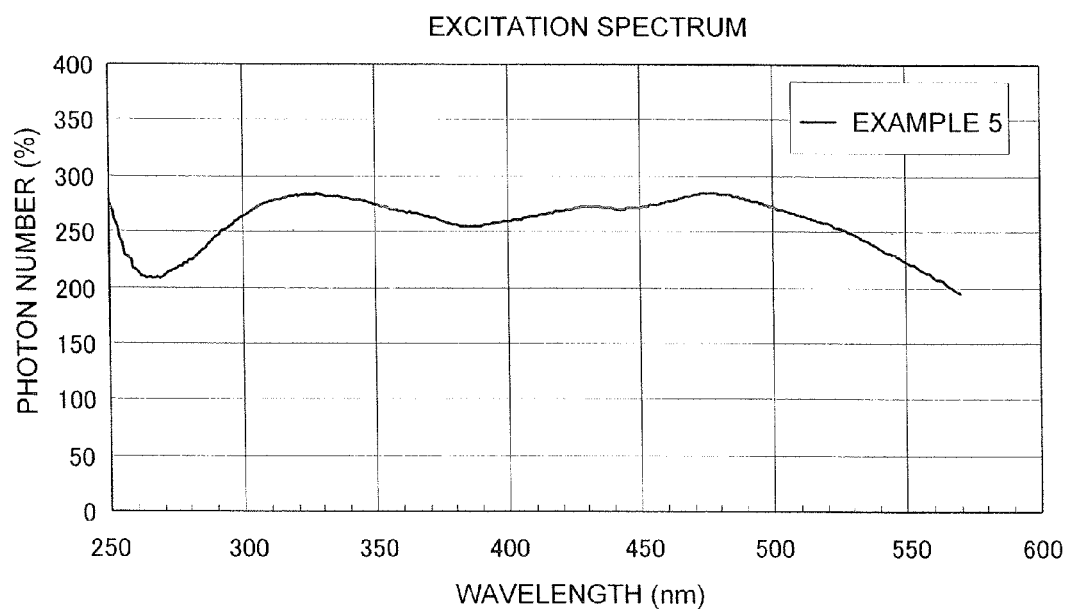
FIG. 19 is a graph showing the excitation spectrum of the phosphor according to the example 5 of the present invention.
Figure 20:
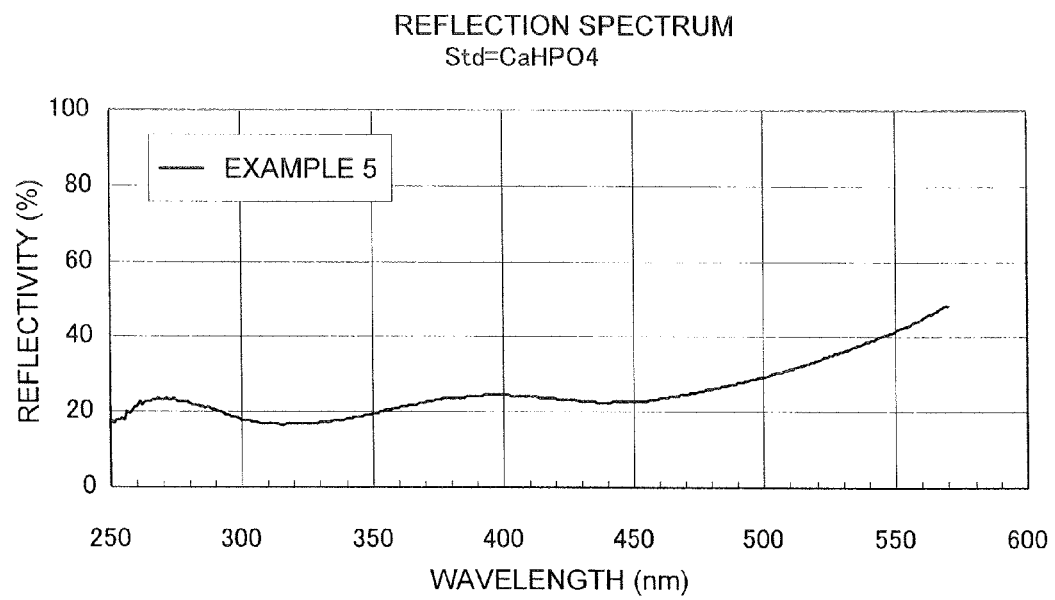
FIG. 20 is a graph showing the reflection spectrum of the phosphor according to the example 5 of the present invention.
Figure 21:
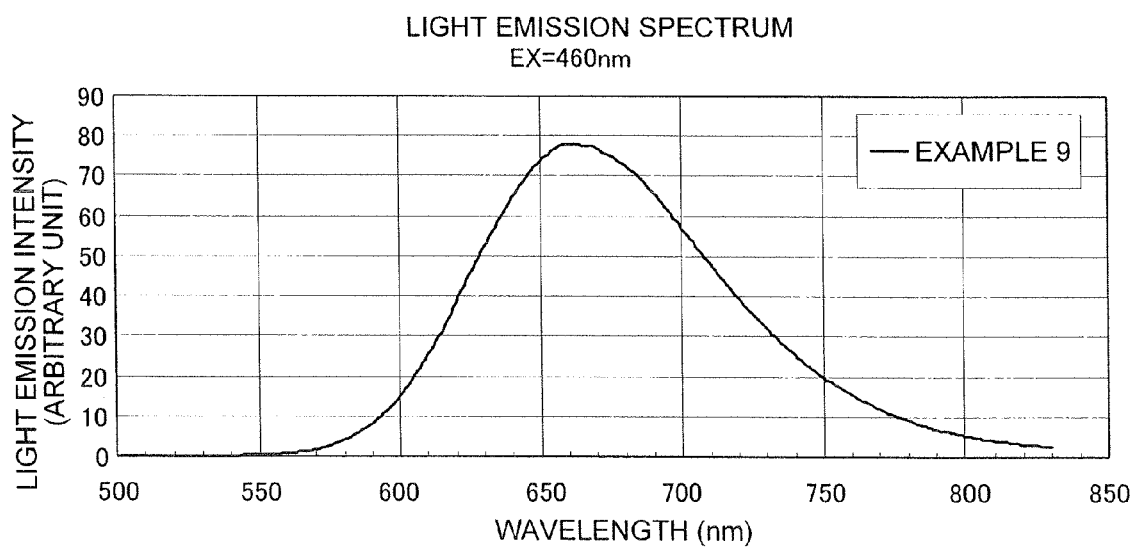
FIG. 21 is a graph showing the light emission spectrum of a phosphor according to an example 9 of the present invention.
Figure 22:
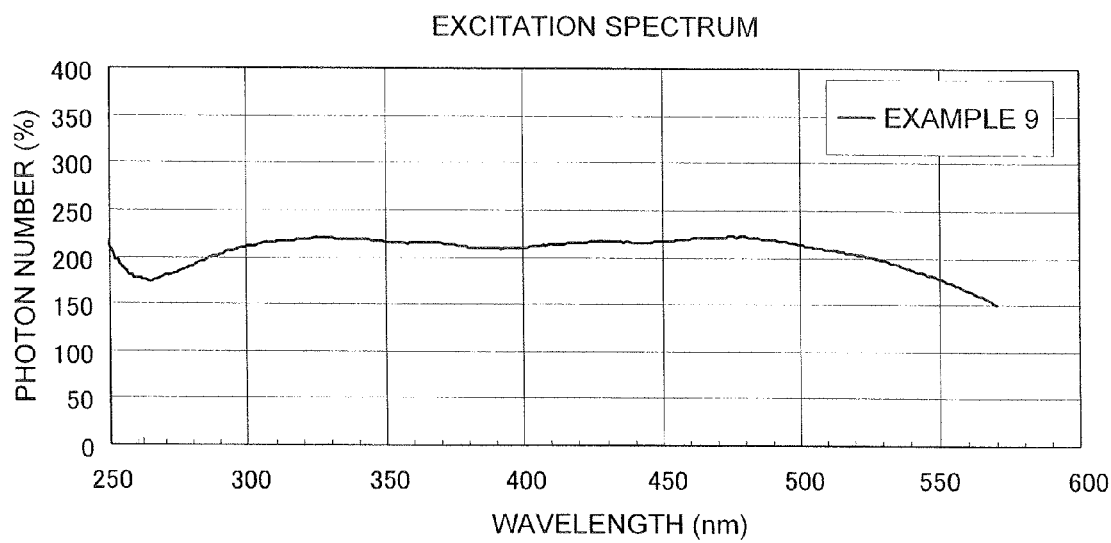
FIG. 22 is a graph showing the excitation spectrum of the phosphor according to the example 9 of the present invention.
Figure 23:
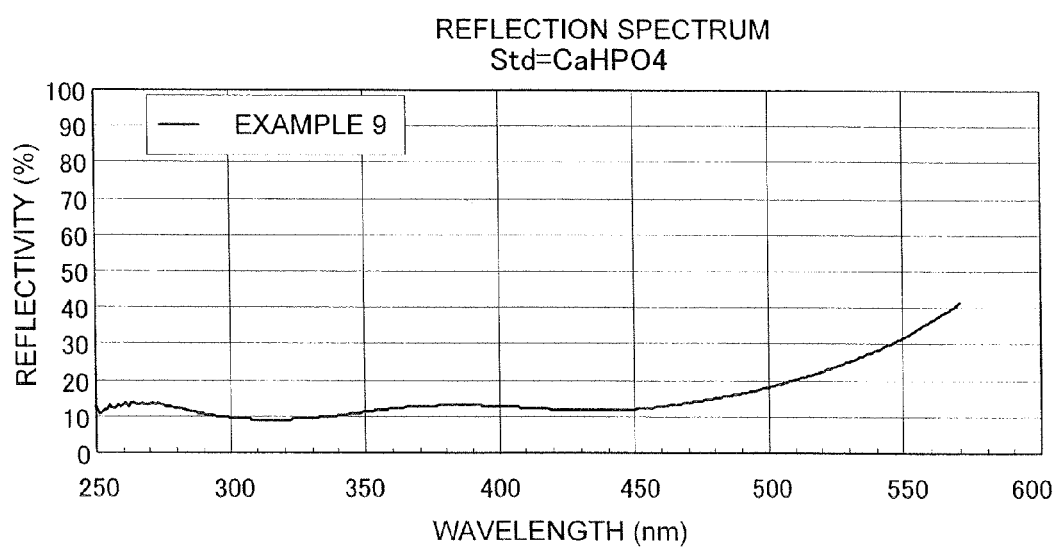
FIG. 23 is a graph showing the reflection spectrum of the phosphor according to the example 9 of the present invention.
Figure 25:
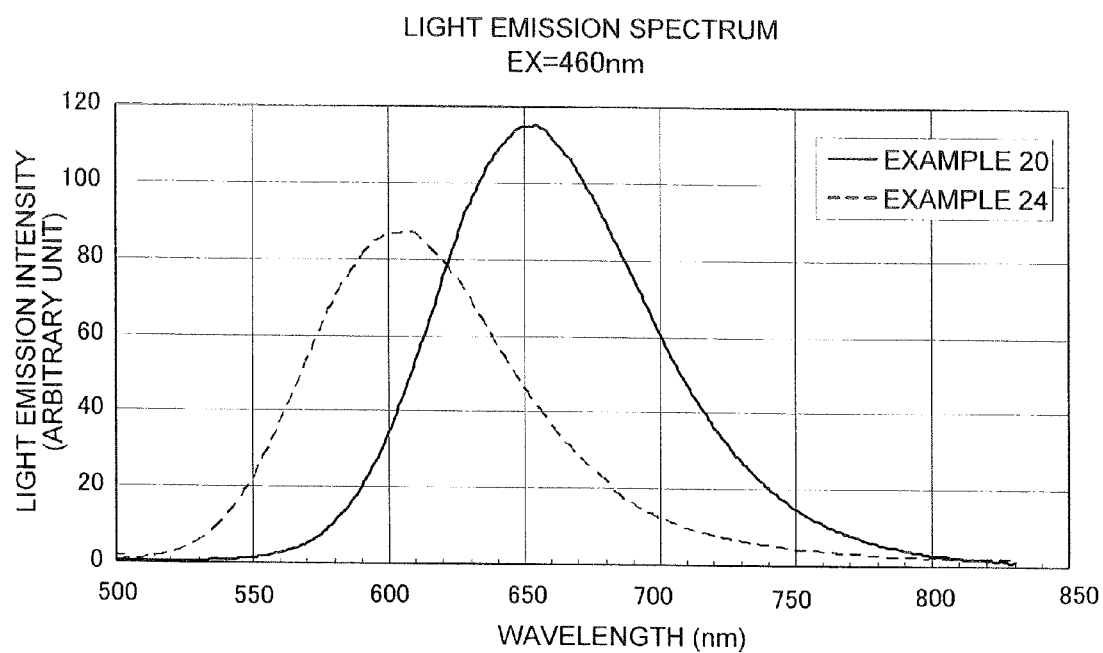
FIG. 25 is a graph showing the light emission spectrums of the phosphors according to the examples 20 and 24 of the present invention.
Figure 26:
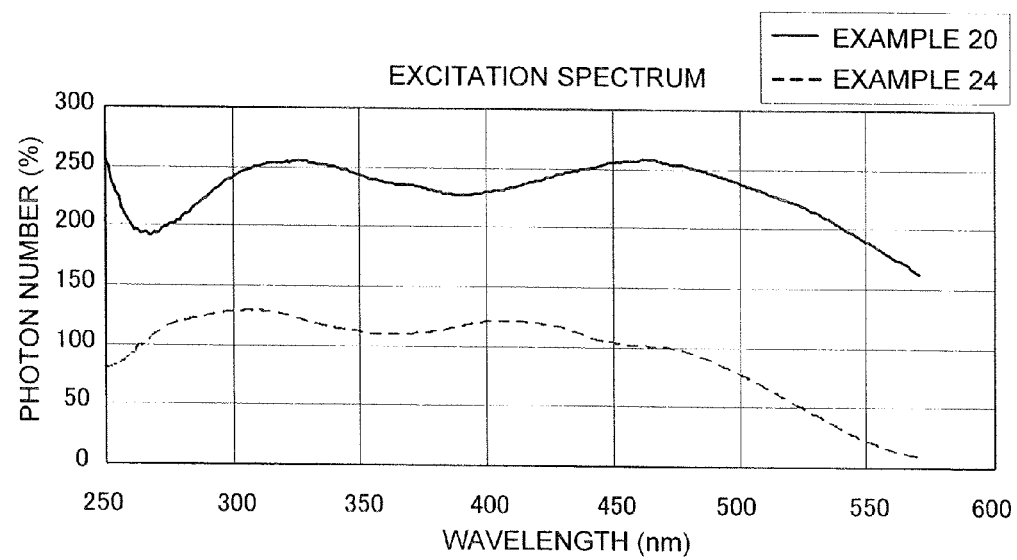
FIG. 26 is a graph showing the excitation spectrums of the phosphors according to the examples 20 and 24 of the present invention.
Figure 27:
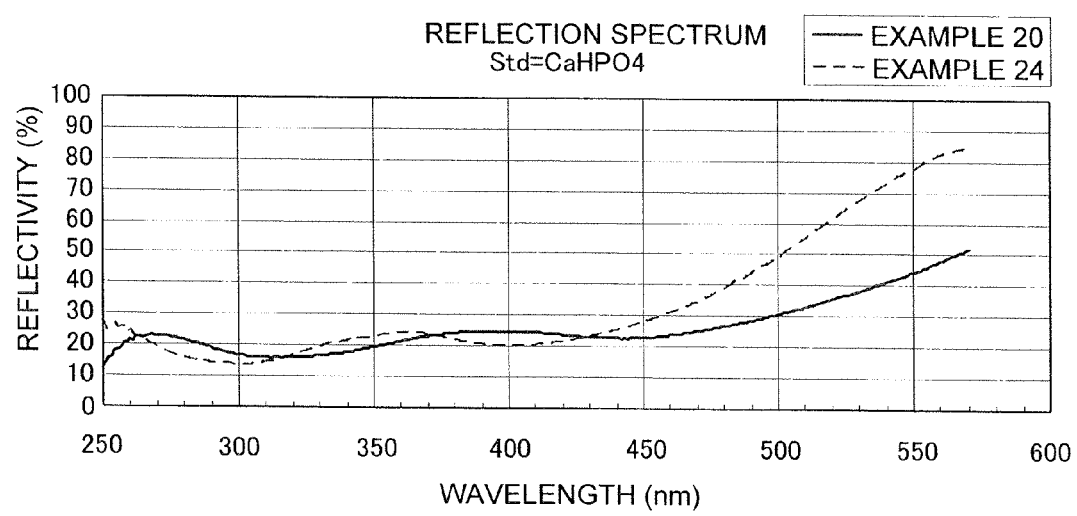
FIG. 27 is a graph showing the reflection spectrums of the phosphors according to the examples 20 and 24 of the present invention.
Figure 28:
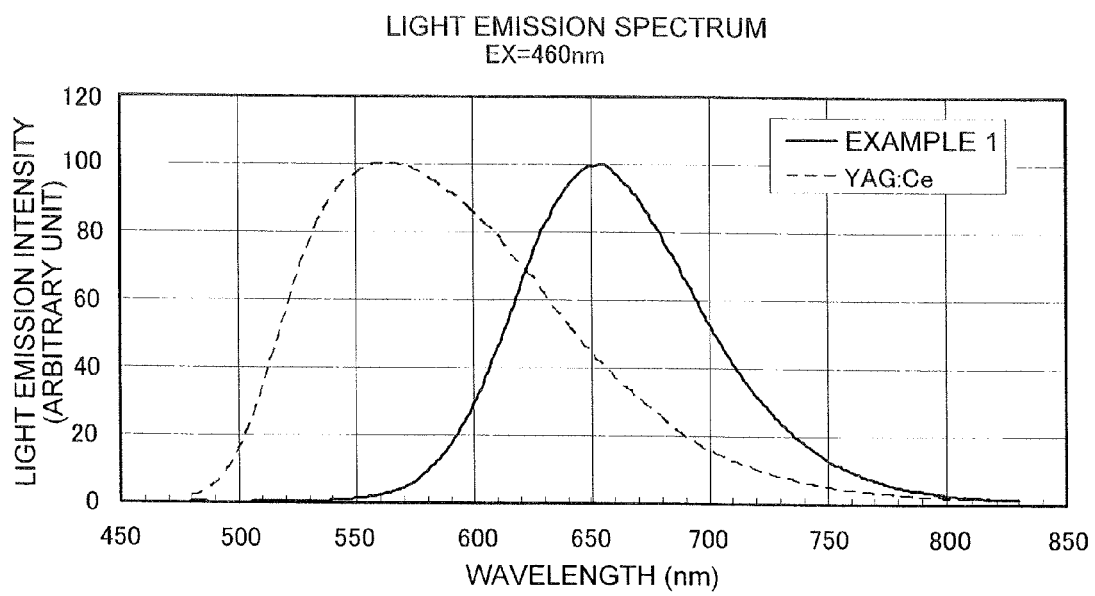
FIG. 28 is a graph showing the light emission spectrums of the phosphor according to the example of the present invention, and a YAG group phosphor.
Figure 29:
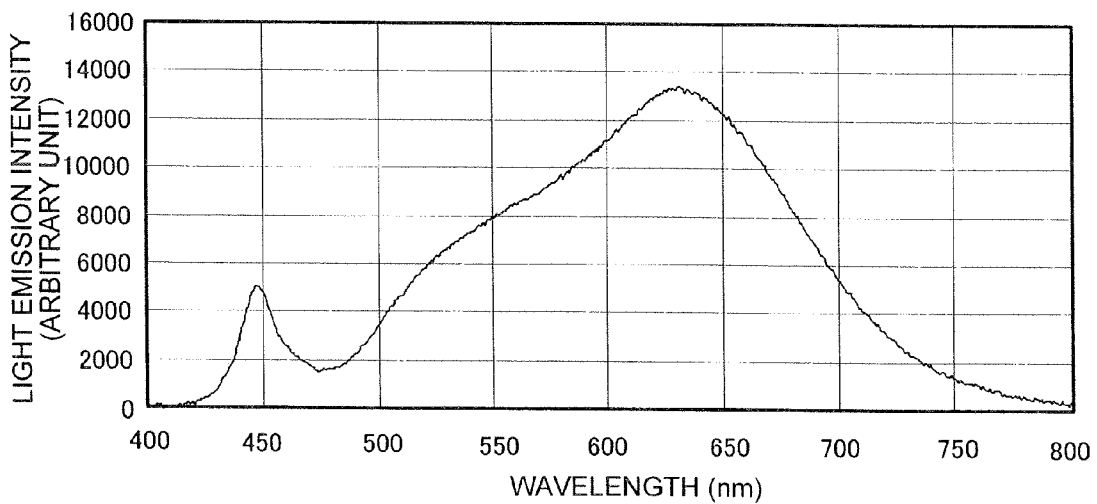
FIG. 29 is a graph showing the light emission spectrum of a white light source that uses the phosphor according to the example of the present invention.
Figure 30:
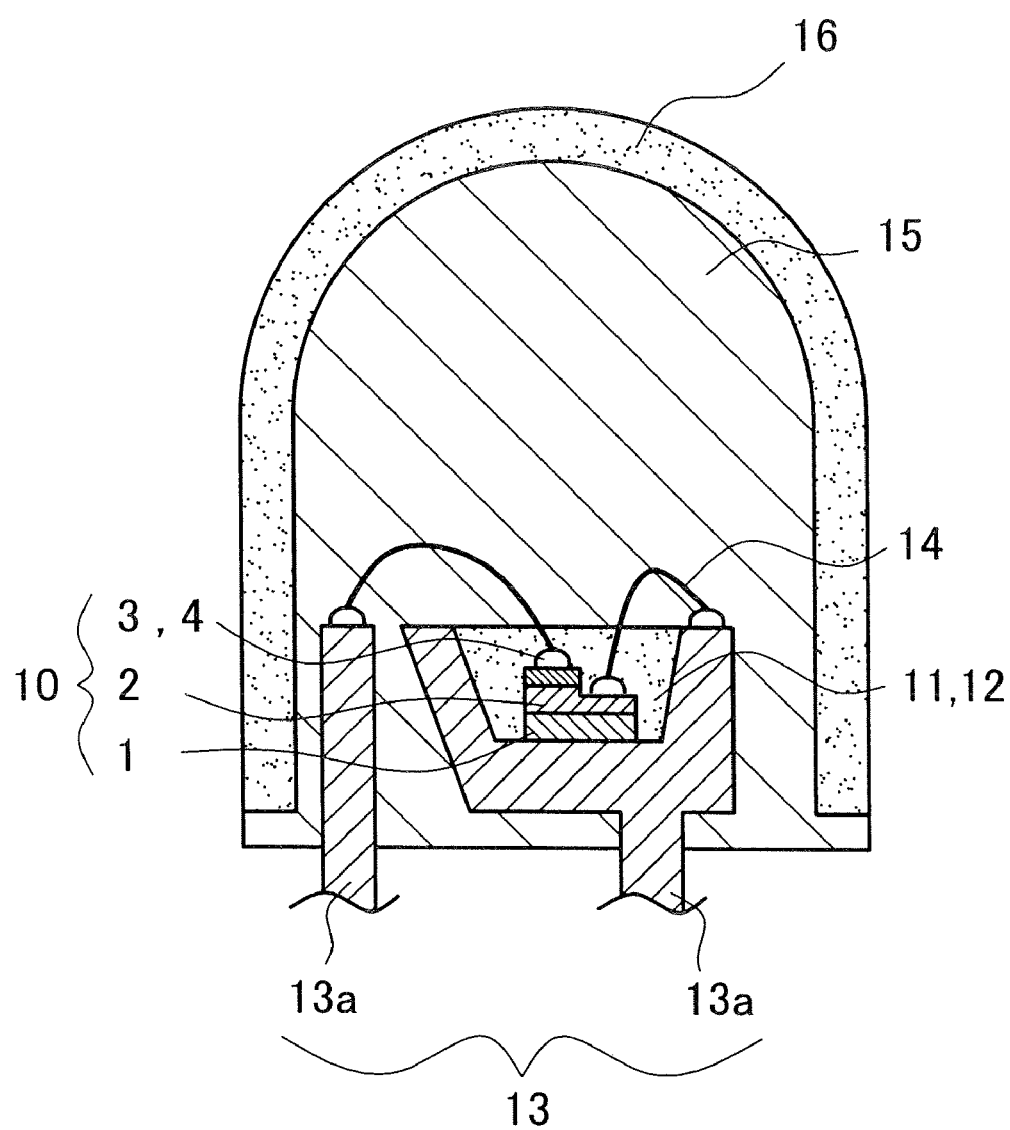
FIG. 30 is a cross-sectional view showing another white light source (cap-type light emitting device) that uses the phosphor according to the example of the present invention.
Figure 31:
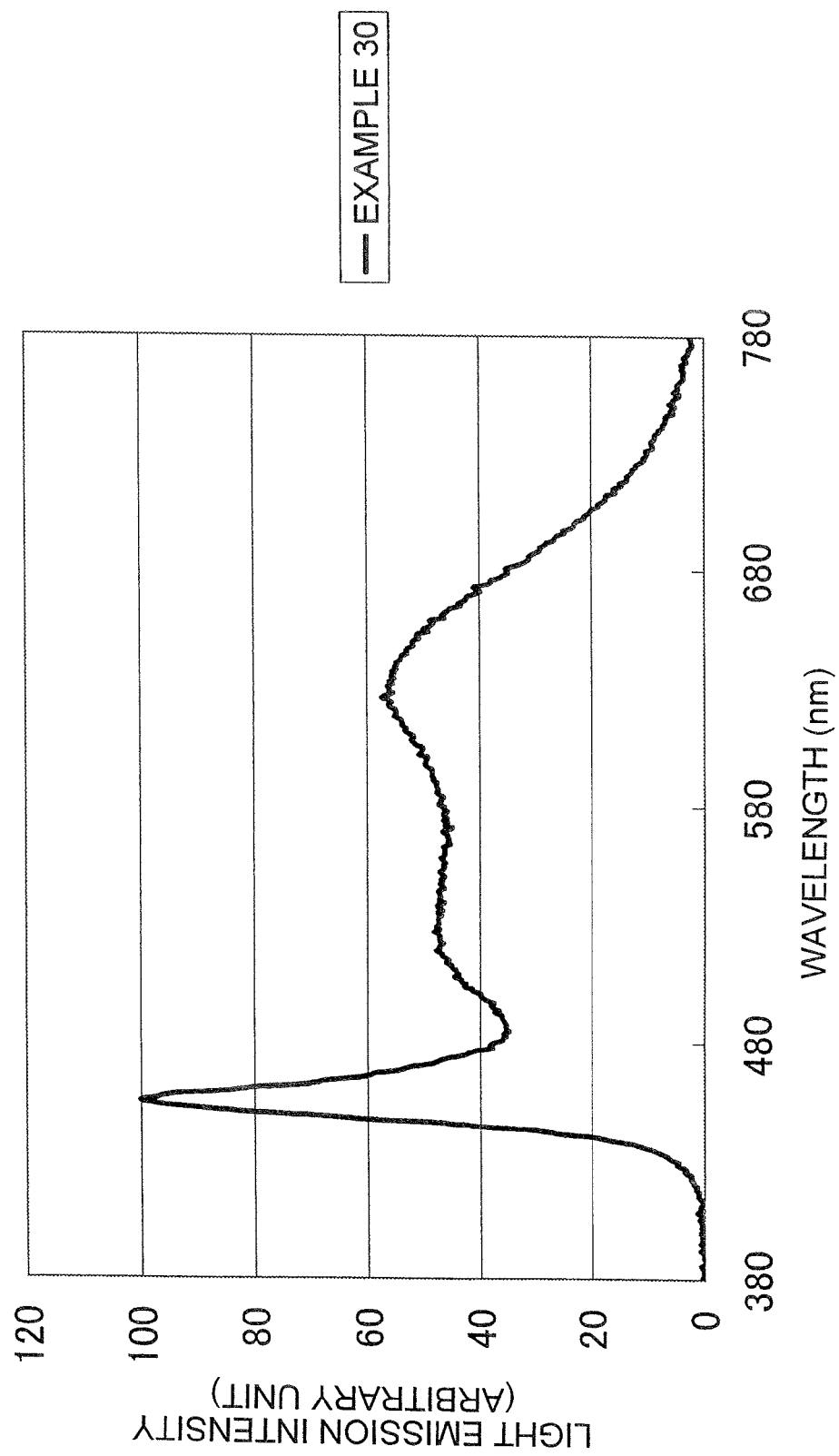
FIG. 31 is a diagram showing the light emission spectrum of the light emitting device according to an example 30.
Figure 32:
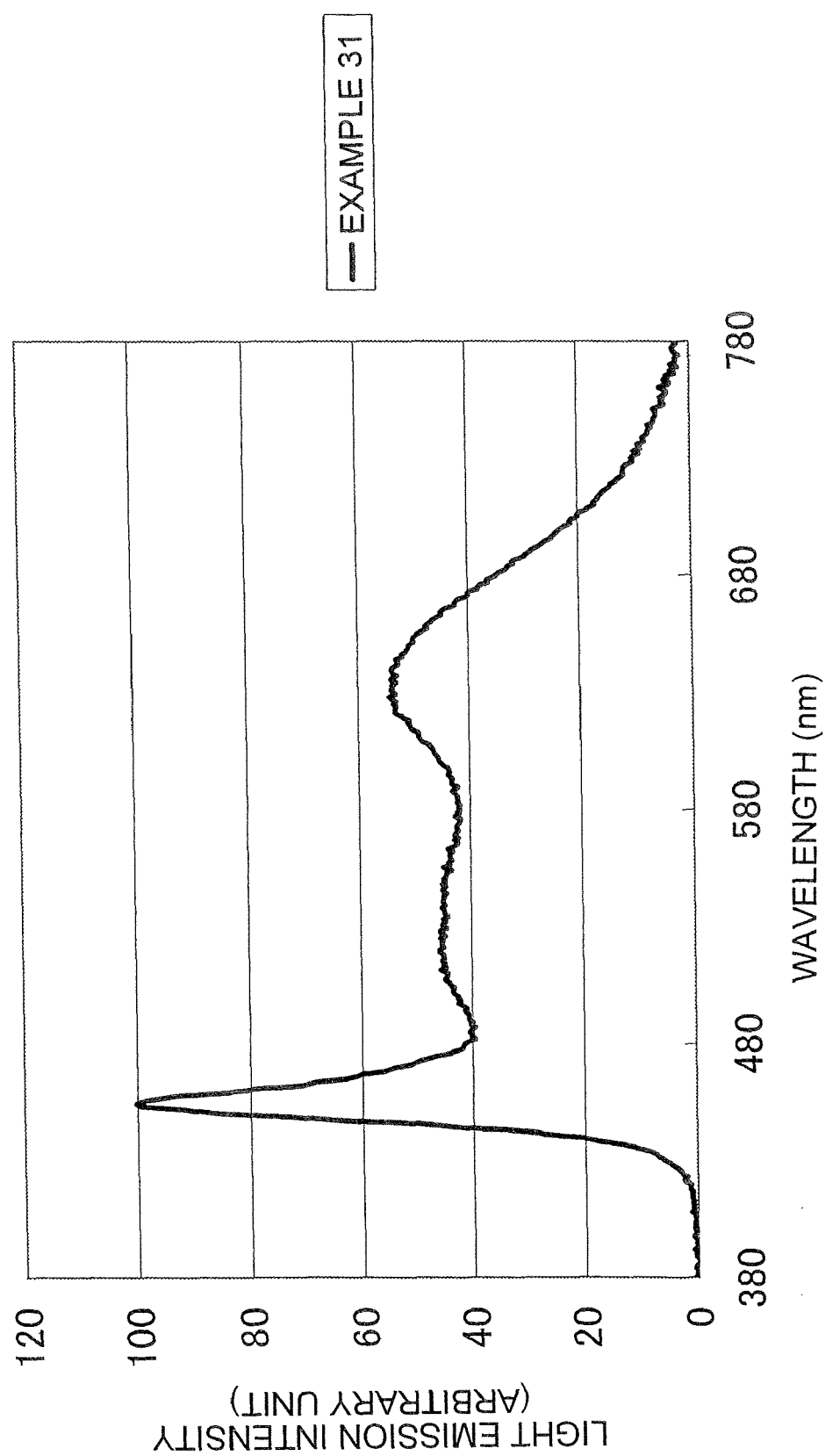
FIG. 32 is a diagram showing the light emission spectrum of the light emitting device according to an example 31.
Figure 33:
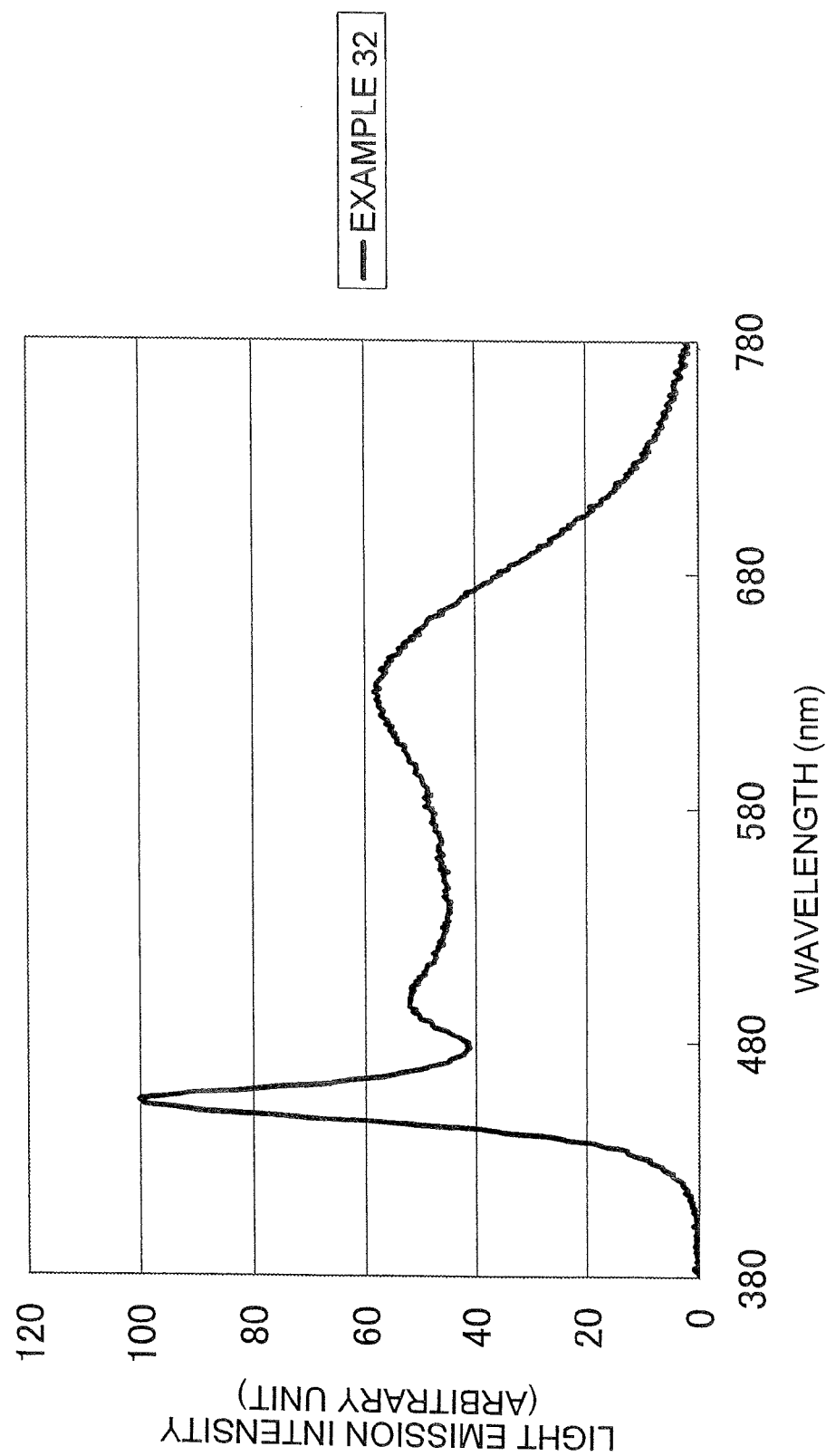
FIG. 33 is a diagram showing the light emission spectrum of the light emitting device according to an example 32.
Figure 34:
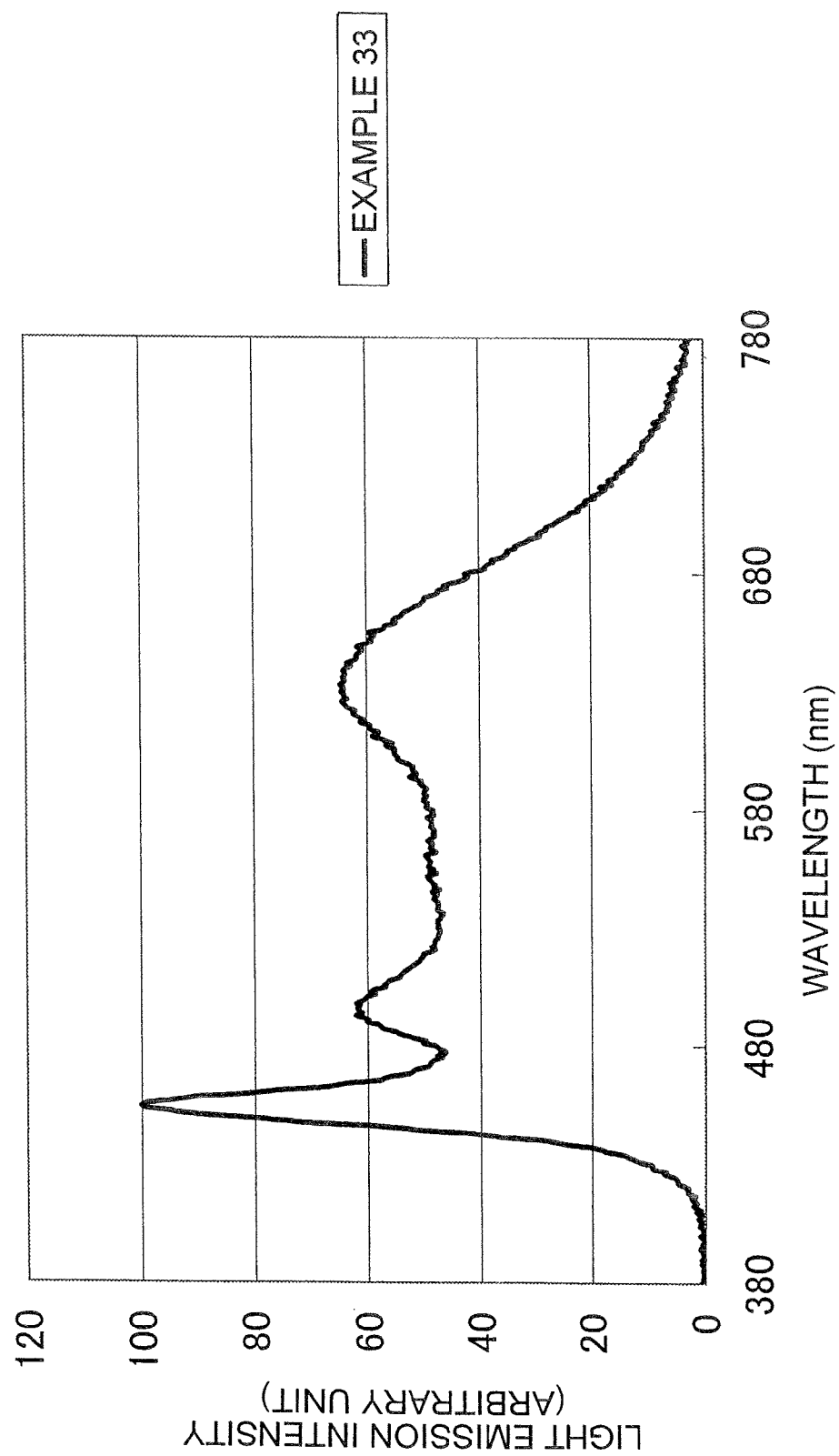
FIG. 34 is a diagram showing the light emission spectrum of the light emitting device according to an example 33.
Figure 35:
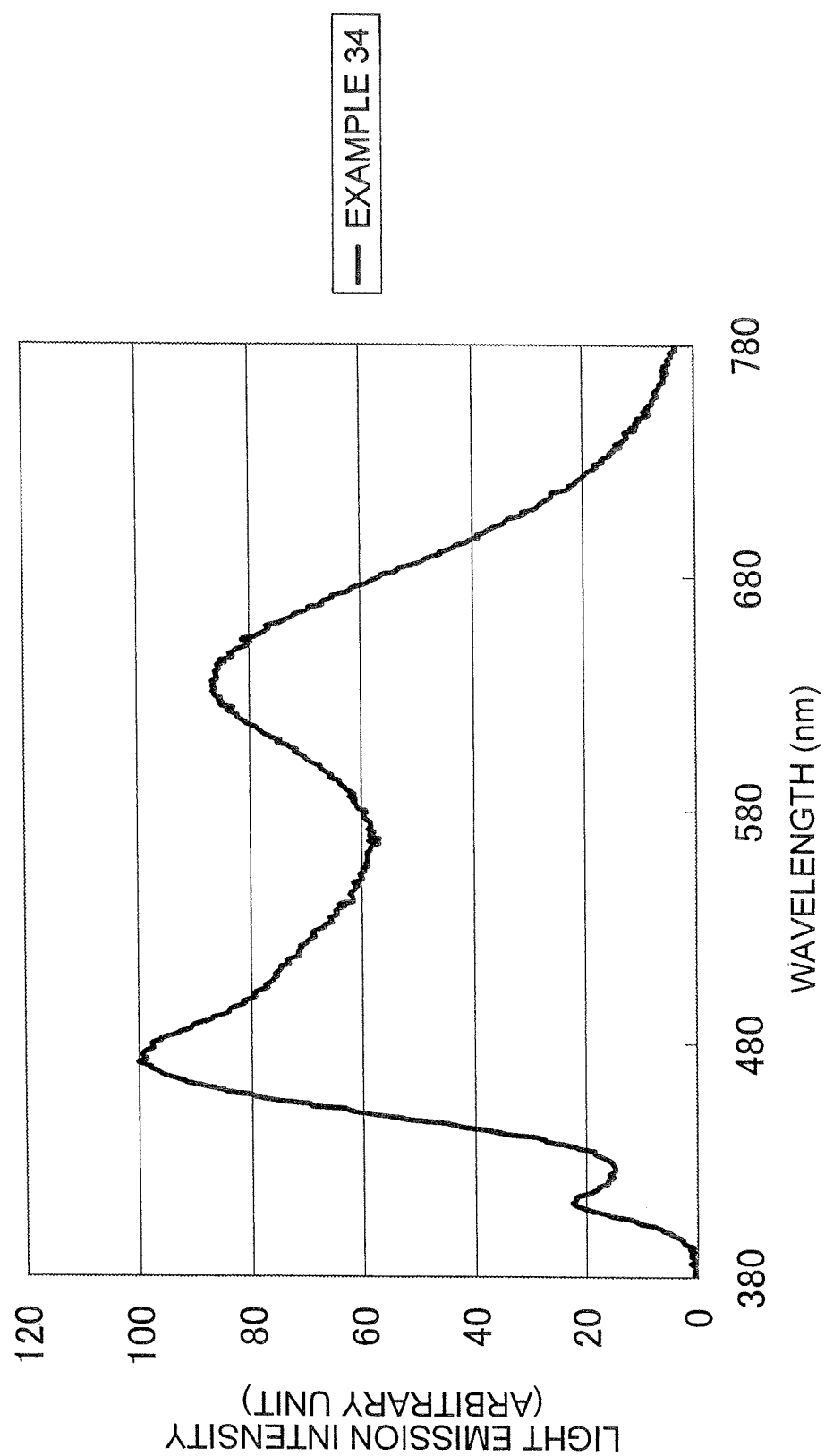
FIG. 35 is a diagram showing the light emission spectrum of the light emitting device according to an example 34.
Figure 36:
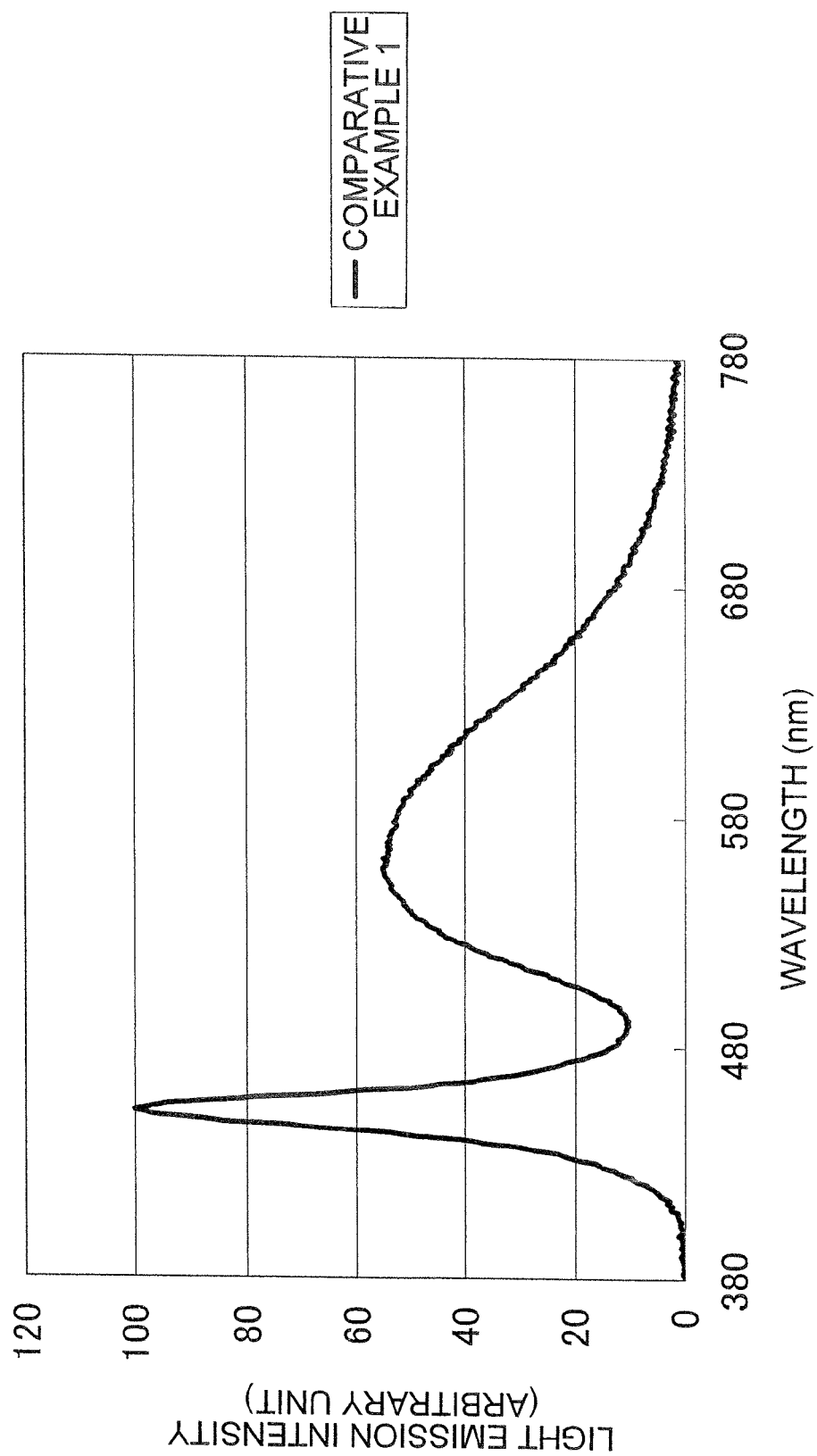
FIG. 36 is a diagram showing the light emission spectrum of the light emitting device according to a comparative example 1.

| | |
|---|---|
| 1 | Sapphire substrate |
| 2 | Semiconductor layer |
| 3 | Electrode |
| 4 | Bump |
| 10 | Light emitting chip |
| 11 | Phosphor |
| 12 | Coating member |
| 13 | Lead frame |
| 13a | Mount lead |
| 13b | Inner lead |
| 14 | Conductive wire line |
| 15 | Molding member |
| 101 | Light emitting chip |
| 102 | Lead electrode |
| 103 | Insulating sealing member |
| 104 | Conductive wire line |
| 105 | Package |
| 106 | Lid |
| 107 | Window |
| 108 | Phosphor |
| 109 | Coating member |

The invention claimed is:

1. A nitride phosphor that is activated by europium, and absorbs light from the near ultraviolet range to the blue range to emit red light, the nitride phosphor having the following general formula, $$M_wAl_xSi_yB_zN_{((2/3)w+x+(4/3)y+z)}:Eu^{2+}$$

where M is at least one element selected from the group consisting of Mg, Ca, Sr and Ba, wherein w, x, y and z fall within the following ranges $0.056 \leq w \leq 9$, $x=1$, $0.056 \leq y \leq 18$, and $0.0005 \leq z \leq 0.5$ and wherein the mole concentration ratios of Fe, Ni, Cr, Ti, Nb, Sm and Yb are not more than 0.01 relative to the mole concentration of M.

2. A nitride phosphor that is activated by europium, and absorbs light from the near ultraviolet range to the blue range to emit red light, the nitride phosphor having the following general formula, $$M_wAl_xSi_yB_zN_{((2/3)w+x+(4/3)y+z)}:Eu^{2+}$$

where M is at least one element selected from the group consisting of Mg, Ca, Sr and Ba, wherein w, x, y and z fall within the following ranges $0.04 \leq w \leq 3$, $x=1$, $0.143 \leq y \leq 8.7$, and $0.0005 \leq z \leq 0.5$ and wherein the mole concentration ratios of Fe, Ni, Cr, Ti, Nb, Sm and Yb are not more than 0.01 relative to the mole concentration of M.

3. A nitride phosphor that is activated by europium, and absorbs light from the near ultraviolet range to the blue range to emit red light, the nitride phosphor having the following general formula, $$M_wAl_xSi_yB_zN_{((2/3)w+x+(4/3)y+z)}:Eu^{2+}$$

where M is at least one element selected from the group consisting of Mg, Ca, Sr and Ba, wherein w, x, y and z fall within the following ranges $0.05 \leq w \leq 3$, $x=1$, $0.167 \leq y \leq 8.7$, and $0.0005 \leq z \leq 0.5$ and wherein the mole concentration ratios of Fe, Ni, Cr, Ti, Nb, Sm and Yb are not more than 0.01 relative to the mole concentration of M.

4. A nitride phosphor that is activated by europium, and absorbs light from the near ultraviolet range to the blue range to emit red light, the nitride phosphor having the following general formula, $$M_wAl_xSi_yB_zN_{((2/3)w+x+(4/3)y+z)}:Eu^{2+}$$

where M is at least one element selected from the group consisting of Mg, Ca, Sr and Ba, wherein w and z fall within the following ranges $0.056 \leq w \leq 9$, and $0.0005 \leq z \leq 0.5$ and wherein the mole concentration ratios of Fe, Ni, Cr, Ti, Nb, Sm and Yb are not more than 0.01 relative to the mole concentration of M.

5. A light emitting device comprising:

a light source with a first light emission spectrum that emits light from the near ultraviolet range to the blue range; and one or more kinds of phosphors that absorb at least part of the first light emission spectrum and thus emits light with a second light emission spectrum, wherein said one or more kinds of phosphors include a nitride phosphor that is activated by europium, and absorbs light from the near ultraviolet range to the blue range to emit red light, the nitride phosphor having the following general formula, $$M_wAl_xSi_yB_zN_{((2/3)w+x+(4/3)y+z)}:Eu^{2+}$$

where M is at least one element selected from the group consisting of Mg, Ca, Sr and Ba, wherein w, x, y and z fall within the following ranges $0.056 \leq w \leq 9$, $x=1$, $0.056 \leq y \leq 18$, and $0.0005 \leq z \leq 0.5$.

6. A light emitting device comprising:

a light source with a first light emission spectrum that emits light from the near ultraviolet range to the blue range; and one or more kinds of phosphors that absorb at least part of the first light emission spectrum and thus emits light with a second light emission spectrum, wherein said one or more kinds of phosphors include a nitride phosphor that is activated by europium, and absorbs light from the near ultraviolet range to the blue range to emit red light, the nitride phosphor having the general following formula, $$M_wAl_xSi_yB_zN_{((2/3)w+x+(4/3)y+z)}:Eu^{2+}$$

where M is at least one element selected from the group consisting of Mg, Ca, Sr and Ba, wherein w, x, y and z fall within the following ranges $0.04 \leq w \leq 3$, $x=1$, $0.143 \leq y \leq 8.7$, and $0.0005 \leq z \leq 0.5$.

7. A light emitting device comprising:

a light source with a first light emission spectrum that emits light from the near ultraviolet range to the blue range; and one or more kinds of phosphors that absorb at least part of the first light emission spectrum and thus emits light with a second light emission spectrum, wherein said one or more kinds of phosphors include a nitride phosphor that is activated by europium, and absorbs light from the near ultraviolet range to the blue range to emit red light, the nitride phosphor having the following general formula, $$M_wAl_xSi_yB_zN_{((2/3)w+x+(4/3)y+z)}:Eu^{2+}$$

where M is at least one element selected from the group consisting of Mg, Ca, Sr and Ba, wherein w, x, y, and z fall within the following ranges
$0.05 \leq w \leq 3$, $x=1$, $0.167 \leq y \leq 8.7$, and $0.0005 \leq z \leq 0.5$.

8. A light emitting device comprising:
a light source with a first light emission spectrum that emits light from the near ultraviolet range to the blue range; and
one or more kinds of phosphors that absorb at least part of the first light emission spectrum and thus emits light with a second light emission spectrum, wherein
said one or more kinds of phosphors include a nitride phosphor that is activated by europium, and absorbs light from the near ultraviolet range to the blue range to emit red light, the nitride phosphor having the following general formula, $M_w Al_x Si_y B_z N_{(2/3)w+x+(4/3)y+z}:Eu^{2+}$ where M is at least one element selected from the group consisting of Mg, Ca, Sr and Ba, wherein w and z fall within the following ranges $0.056 \leq w \leq 9$ and $0.0005 \leq z \leq 0.5$.

9. A light emitting device comprising:
a light source with a first light emission spectrum that emits light from the near ultraviolet range to the blue range; and
one or more kinds of phosphors that absorb at least part of the first light emission spectrum and thus emits light with a second light emission spectrum, wherein
said one or more kinds of phosphors include a nitride phosphor that is represented by the general formula, $M_w Al_x Si_y B_z N_{(2/3)w+x+(4/3)y+z}:Eu^{2+}$, the nitride phosphor absorbing light from the near ultraviolet range to the blue range to emit red light,
wherein M is at least one element selected from the group consisting of Mg, Ca, Sr and Ba, wherein w, x, y and z fall within the following ranges
$0.5 \leq w \leq 3$, $x=1$, $0.5 \leq y \leq 3$, and $0.001 \leq z \leq 0.5$.

10. A nitride phosphor production method that burns a phosphor material and thus produces a nitride phosphor that is represented by the general formula $M_w Al_x Si_y B_z N_{(2/3)w+x+(4/3)y+z}:Eu^{2+}$(M is at least one element selected from the group consisting of Mg, Ca, Sr and Ba, and $0.05 \leq w \leq 3$, $x=1$, $0.5 \leq y \leq 3$ and $0.001 \leq z \leq 0.5$), and absorbs light from the near ultraviolet range to the blue range to emit red light, wherein
the phosphor material is burned at atmospheric pressure in a reducing atmosphere containing ammonia.

11. The nitride phosphor production method according to claim 10, wherein the phosphor material is burned in a reducing atmosphere containing at least one of nitrogen, hydrogen, argon, carbon dioxide and carbon monoxide, in addition to ammonia.

12. The nitride phosphor production method according to claim 10, wherein the phosphor material includes Al nitride, and is burned at temperature 1400° to 1800° C.

13. The nitride phosphor production method according to claim 10, wherein the phosphor material is burned in a multi-step manner.

14. The nitride phosphor production method according to claim 10, wherein the phosphor material is placed and burned in a crucible of boron nitride (BN).

15. The nitride phosphor production method according to claim 10, wherein the mean particle diameter of the nitride phosphor is not less than 2μm and not more than 15μm.

* * * * *